United States Patent [19]
Hawkins et al.

[11] Patent Number: 5,347,559
[45] Date of Patent: Sep. 13, 1994

[54] APPARATUS AND METHOD OF DATA TRANSFER BETWEEN SYSTEMS USING DIFFERENT CLOCKS

[75] Inventors: Thomas B. Hawkins, Boylston; William Bruckert; Thomas D. Bissett, both of Northboro, all of Mass.

[73] Assignee: Digital Equipment Corporation, Maynard, Mass.

[21] Appl. No.: 998,714

[22] Filed: Dec. 30, 1992

[51] Int. Cl.$^5$ .............................................. H03K 21/08
[52] U.S. Cl. ........................................ 377/54; 377/56; 395/164; 395/550
[58] Field of Search ................... 377/54, 56; 395/164, 395/550

[56] References Cited

U.S. PATENT DOCUMENTS 5,058,054 10/1991 Feldman ............................. 395/550
5,164,677 11/1992 Hawkins et al. ...................... 328/55

*Primary Examiner*—Margaret Rose Wambach
*Attorney, Agent, or Firm*—Albert Cefalo; Denis G. Maloney

[57] ABSTRACT

According to one aspect of the invention, an apparatus includes a first processor coupled to a first system bus to provide data to a cache and a memory, and a second processor coupled to the first system bus and a second abbreviated system bus to receive read data from said first system bus. In accordance with a further aspect of the invention, an apparatus includes means for correcting errors in memory. In accordance with a further aspect of the invention, an apparatus includes a number of computing systems each including a memory device mounted on an infrequently replaced hardware unit, and capable of communicating with the number of computing systems. In accordance with another aspect of the invention, an apparatus includes a counter, means for detecting a selected state of said counter, and means, responsive to output signals from said counter, for selectively permitting or inhibiting transfer of data fed to a recirculating state device. In accordance with a further aspect of the invention, an apparatus includes a first means for providing a first clocking signal, a second means for providing a second clocking signal, means for providing an error signal responsive to an offset between edges of the first and second clocking signals.

10 Claims, 26 Drawing Sheets

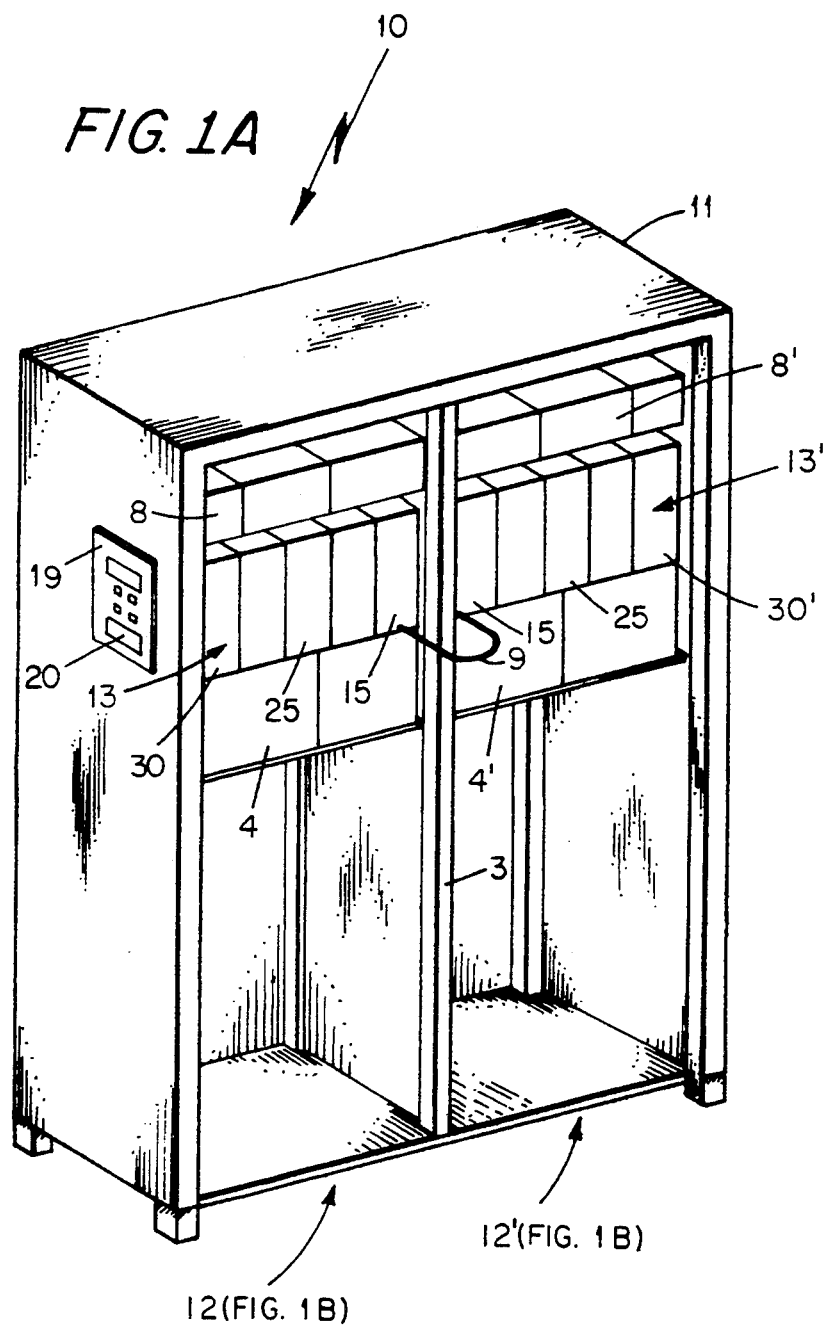

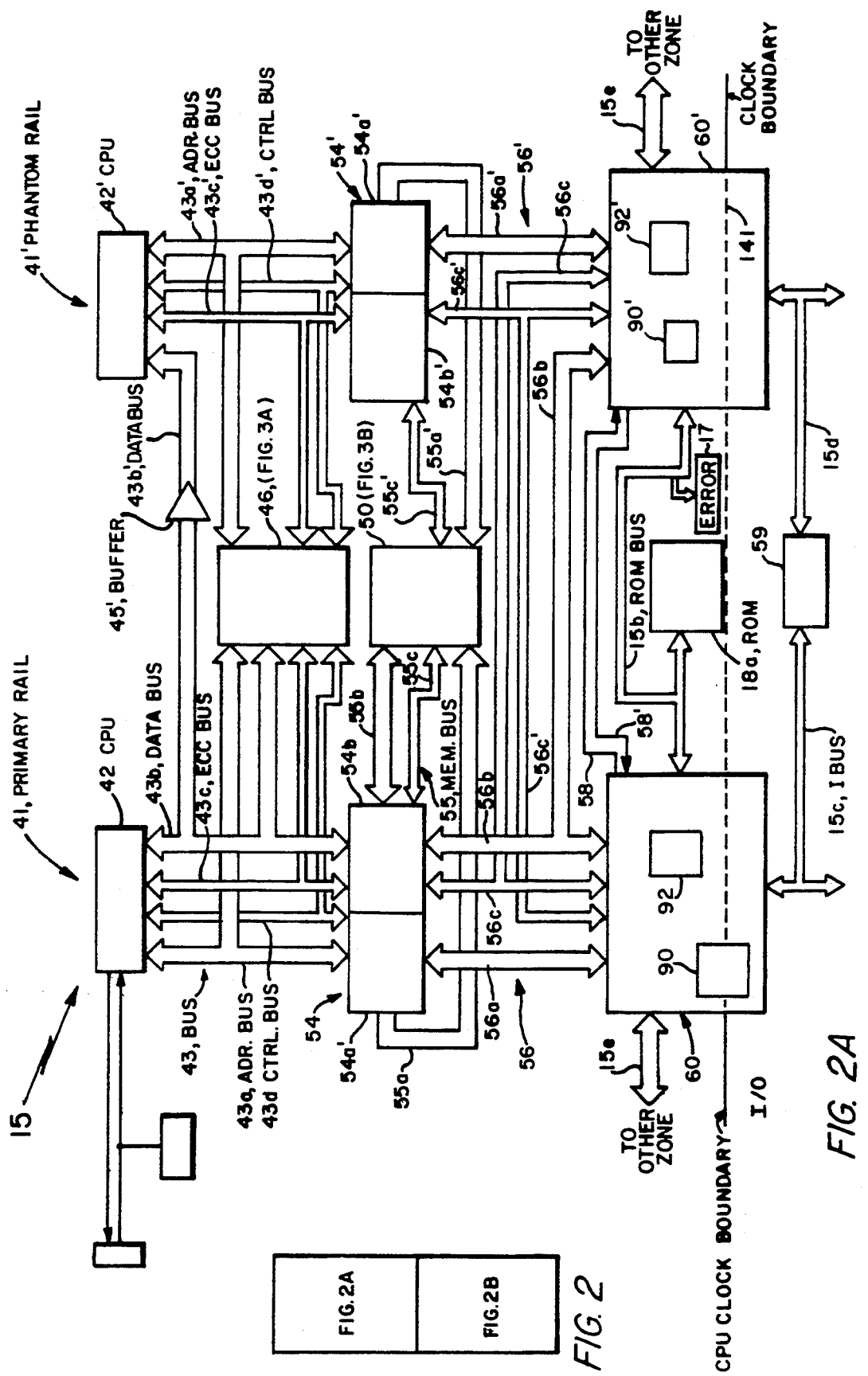

(CLOCK TIMING DIAGRAMS)

⊘ - DON'T TRANSFER

APPARATUS AND METHOD OF DATA TRANSFER BETWEEN SYSTEMS USING DIFFERENT CLOCKS

BACKGROUND OF THE INVENTION

This invention relates generally to computer systems and more particularly to data transfer between portions of a computer system operating with different clock frequencies.

As it is known in the art, a computer system generally includes a central processing unit, a main memory, and at least one input/output (I/O) device all of which communicate together via a system bus. Generally, most central processing units transfer data and process data in a synchronous manner. That is, a synchronous central processing unit uses a clock signal as a common signal to synchronize data tranfer and processing. Generally, the input/output device such as a printer, monitor, another bus such as a network bus, or a storage device such as disk storage have a bus interface to the system bus of the CPU. Often times the interface or the peripheral device is partially or completely synchronous.

A problem often arises if the central processing unit has a clock signal which operates at a clock frequency that is different than the corresponding clock frequency of a clock signal used to operate the input/output device.

In most systems, clock signals are derived from one or more relatively stable, high frequency sources and are either provided as a train of short pulse width pulses or a train of 50% duty cycle pulses. Moreover, most systems generally use edges (either rising or falling) to trigger the clocking process.

In particular, in complex computer systems such as for example, a fault tolerant computer system, the central processing unit and associated subsystems may use a clock signal which operates at a relatively high clock frequency whereas an input/output subsystem, often containing a separate controller or central processing unit to control data transfer between the CPU of the computer and external devices, may have a clock signal which operates at a clock frequency which is substantially different from the clock frequency of the central processing unit.

A fundamental problem with transfers across a clock boundary (between two systems using different clock signals) is the need to insure that so called "set up time" (i.e. the time period that data needs to be valid and waiting at an input of a receiving device prior to arrival of the clock signal) and "hold time" (i.e. the time period that the data needs to remain valid and at the input of the device after the clock signal has been removed are satisfied for all possible instances of data transfer. To these constraints must be added propagation delays through the sending device and uncertainity in arrival of the clocking edges of each of the clock signals. Nevertheless, data transfer between the two systems is necessary.

Several techniques have been developed in order to provide such data transfer. In one known technique, a least common multiple clock time is ascertained in accordance with the clock period of the CPU clock signal and the clock period of the input/output subsystem clock signal to provide a transfer which is predictable between the two subsystems. In this technique, corresponding periods of the clock signal frequencies are ascertained. From the periods of each clock signal a least common multiple (LCM) clock period is determined and data transfers are enabled only for that set of clock pulses corresponding to the LCM of the two clock periods. For example, if one clock has a period of 40 ns and the other a period of 60 ns, a least common multiple period would be 120 ns. Thus, data transfers could occur ever 120 ns. While slow this technique provides relatively reliable transfers. However this technique can suffer from even higher transfer latency if the LCM between the clock periods is high such as an LCM of 550 ns for clock periods of 50 ns and 55 ns.

Therefore, although this technique provides extremely predictable data transfers, a major problem with this technique is that the data transfer is retarded due to a relatively high latency between the different clock periods. This becomes particularly difficult when the so called least common multiple between the two clock periods is relatively high as in the latter example above.

To overcome this high latency problem, transfers could be attempted using faster clocks. One problem with this approach is that a race condition could develop which could make reliable transfer of data across the two systems difficult.

Deterministic data transfers although necessary for computer systems in general are particularly necessary for fault tolerant computer systems. As mentioned above, a fault tolerant computer system is used where it is important to provide a continuously operating computer environment even in the presence of a fault in the computer system to ensure that instructions are controlled and not lost and that data are not corrupted. Examples of such applications include computer processing in the financial industry and critical industrial facilities such as nuclear power plants and the like in which a failure of a computer system will cause serious disruption or catastrophic loss of data or control.

Fault tolerant computer systems have been developed to provide varying degrees of redundancy and thus provide duplicate system or system components so that data processing can continue even in the presence of some fault in within the computer system. Several approaches to provide a fault tolerant system are known in the art. One approach, is described in U.S. Pat. No. 4,907,228 by Bruckert et al. and assigned to the assignee of the present invention.

In the described fault tolerant computer system, duplicate computer systems each having a pair of central processing units operate on identical tasks. All of the computers operate on identical data in so called lock step operation. In the described computer the entire system operates at the same clock frequency for data transfers.

While the above system is acceptable, it is often desireable or necessary to interface other systems using different clock frequencies or alteratively to use faster central processing units operating at higher clock frequencies while still maintaining prior I/O systems operating with slower clocks.

In such fault tolerant computer systems therefore, it is particularly necessary to provide a predictable and deterministic data transfer between the CPU and the I/O subsystems for example. As described in the above mentioned patent, the fault tolerant computer system has two computer zones each operating on a common set of instructions and operating in synchronism. Since each of the zones further includes a pair of processors that are operating on a common set of instructions, the occurance of a fault in one of the processors in one of said zones will cause the fault tolerant computer to loose lock step operation.

When a loss in lock step operation occurs, the faulty zone is identified and replaced while the good zone continues to operate. Thus, to ensure lock step operation between the pair of rails in the zone as well as between the two zones in the fault tolerant computer, both the central processing units, as well as the I/O portions of the computer need be synchronized. Therefore, the data transfers across the zones to the I/O devices also must be performed in lock step. Therefore, data transfers must occur in a predictable and deterministic manner across clock boundaries in each of the rails of each of the zones to insure the integrity of the data transfer, as well as continued lock step operation of the fault tolerant computer.

SUMMARY OF THE INVENTION

In accordance with the present invention, an apparatus includes, a register containing a data string, a counter, means for detecting a selected state of said counter and for providing in response to said detected state a signal to load the data contained in said register into said counter. The apparatus further includes means, responsive to output signals from said counter, for selectively providing an enable signal in accordance with the state of said counter and at least one recirculating state device fed by said enable signals to selectively permit or inhibit transfer of data fed to said recirculating state device in accordance with the state of said enable signal. With such an arrangement, states of said counter are used to determine when data transfers can occur in the recirculating state device and control the enable signal to the recirculating state device. In this manner more transfers are permitted than with prior techniques since transfers are enable for all clocks in which the clocking edges are spaced sufficiently to insure that all clock setup and hold times are satisfied.

In accordance with a further aspect of the present invention an apparatus for permitting data transfer between two systems operating at different clock frequencies includes a first register containing a first data string, a first counter and means for detecting a selected state of said first counter and for loading the data string contained in said first register into said counter in accordance with said detected state of said counter. The apparatus further includes means responsive to output signals from said first counter for selectively providing an enable signal in accordance with the state of said first counter. The apparatus further includes a second register containing a second data string, a second counter, and means for detecting a selected state of said second counter for loading the data contained in said second register into said counter in accordance with said detected state of said second counter. The apparatus further includes means response to outputs signals from said second counter for selectively providing a second enable signal in accordance with the state of said second counter. The apparatus further includes first recirculating state device means fed by said first and second enable signals for selectively permitting or inhibiting transfer of data fed to said recirculating state device means in accordance with the states of said enable signals. With such an arrangement, states of the counters and selected enables are used to determine when data transfers can occur in the recirculating state device means. That is the counters control the selection of enable signals to the recirculating state device means. In this manner more data transfers are permitted than with prior techniques. In particular, enable signals are generated from lists of states corresponding to valid states for said first and second counter for which a transfer of data fed to said apparatus can occur. The states of the counters are used to ascertain the relative temporal arrangement of asserting edges of the pair of clock signals, so that data transfers can be enable for those pairs of clock edges in which set up and hold times are satisfied and inhibit transfer for those pairs of clock signal edges for which set up and hold times are not satisfied.

In accordance with a still further aspect of the present invention, an apparatus includes a first down counter, a first register containing data representative of a selected maximum value count of said counter, and means for detecting a selected state of said first counter for loading the data contained in said first register into said first counter to restart said counter at a said maximum value count. The apparatus further includes means, responsive to states of said first counter, for providing a first enable signal from a list of states corresponding to valid states for said counter for which a transfer of data fed to said apparatus can occur. The apparatus further includes a second down counter, a second register containing data representative of a selected maximum value count of said second counter, means for detecting a selected state of said second counter for loading the data contained in said second register into said second counter to restart said counter at a said second maximum value count, and means, responsive to states of said second counter, for providing a second enable signal from a second list of states corresponding to valid states for said second counter for which a transfer of data fed to said apparatus can occur. The apparatus further includes means for providing a recirculating state device responsive to said first and second selected enable signals, a pair of clock signals, and data associated with a first one of said pair of clock signals, for outputting said data in association with a second one of said pair of clock signals when said enable signals are in states indicating that a transfer of said data can occur. The apparatus further includes means for providing a second recirculating state device, responsive to said first and second selected enable signals, a pair of clock signals, and data associated with said second one of said pair of clock signals, for outputting said data in association with said first one of said pair of clock signals when said enable signals are in states indicating that a transfer of said data can occur. With such an arrangement, states of said counters are used to determine when data transfers can occur in the recirculating state device means and thus control providing of the enable signals to the recirculating state device means. In this manner more data transfers are permitted than with prior techniques. In particular, enable signals are generated from lists of states corresponding to valid states for said first and second counter for which a transfer of data fed to said apparatus can occur. The states of the counters are used to ascertain the relative temporal arrangement of asserting edges of the pair of clock signals, so that data transfers can be enabled for those pairs of clock edges in which set up and hold times are satisfied and inhibited for those pairs of clock signal edges for which set up and hold times are not satisfied.

BRIEF DESCRIPTION OF THE DRAWINGS

FIG. 1A is an illustration of the physical cabinets containing a fault tolerant computer system in accordance with the present invention;

FIG. 2 is a diagram showing the relationship between FIGS. 2A and 2B;

FIG. 2A is a block diagram of a primary rail, phantom rail fault tolerant processor system used in each zone of the dual zone fault tolerant computer system of FIG. 1A in accordance with the present invention;

DESCRIPTION OF PREFERRED EMBODIMENTS

Figure 1B:
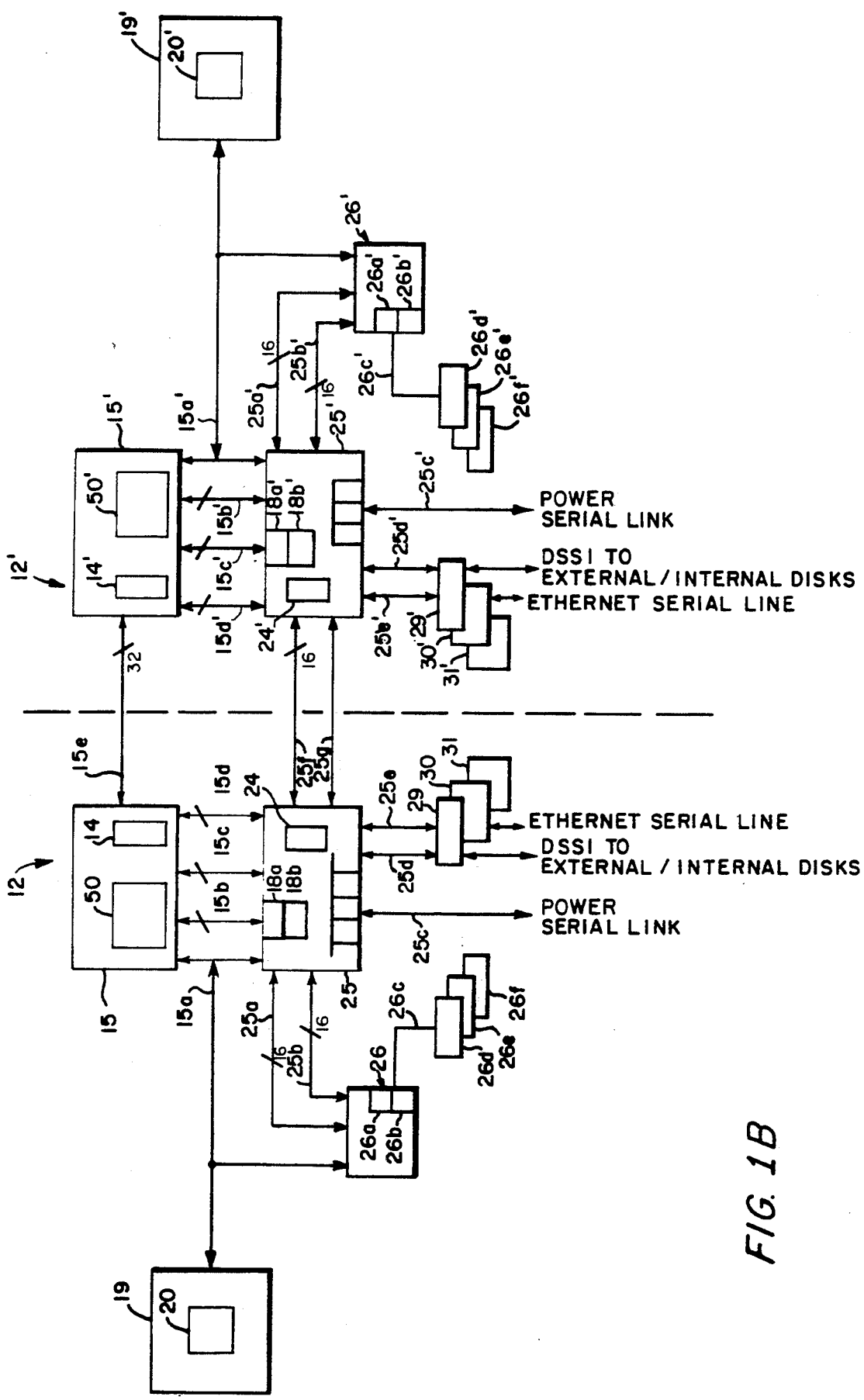
FIG. 1B is a block diagram of a dual zone fault tolerant computer housed in the physical cabinets of FIG. 1A in accordance with the present invention.

Referring now to FIG. 1, a fault tolerant computer system 10 embodying the present invention includes duplicate processing systems 12/12' physically shown here in a rack mounting system 11. The two processing systems 12/12', called zones, are physically separated by support bar 3. Communication cables 9 enable communication between the two zones.

Zone 12' includes separate elements corresponding to elements of zone 12 so, although only zone 12 will be described in detail, it is to be understood throughout this specification that identical elements performing identical functions are included within zone 12'. Zone 12 includes power supply 4, disk drives 8, and functional units such as Central Processing Unit (CPU) and Memory Unit 15, I/O unit 25, network interface unit 30, and control panel 19.

The control panel 19 includes an Non-Volatile Ram (NVRAM) 20 which contains a system identification number for the entire dual-zone system. Since a common application of a fault tolerant computer 13 is as one computer system on a network of computer system or other types of computer devices, a network controller in general needs to know an identity for each system attached to the network. Thus, a fault tolerant computer 13 has a unique network address or system identification number. A derivative of the system identification number is copied to the network interface unit 30 and stored in Non-volatile memory to be used as the network address of the dual-zone system 10.

As explained in greater detail below, each zone 12/12' includes several modules interconnected by backplanes. If there is a fault or error in a unit, the unit may be removed and replaced without disabling the computing system 10. This is because, although zones 12, 12' are physically housed within the same cabinet, each zone 12,12' has its own components and is capable of operating independently of the other zone 12',12. Thus, components within one zone may be replaced while the other zone continues to operate.

Referring now to FIG. 1B, the dual-zone processing system 10 of FIG. 1A includes two CPU/Memory Units 15/15' coupled by resynchronization bus 15e. The resynchronization bus 15e is used to ensure that the contents of a memory subsystem 50 of the CPU/Memory unit 15 are consistent with the contents of memory 50' in CPU/Mem unit 15'. For example, when one zone is taken out of the dual-zone system 10 for repair, and a new one is installed into the system, the contents of the memory in the remaining zone must be copied to the newly installed zone. The 32 bit hi-directional resynchronization bus 15e provides a convenient pathway for memory data exchange.

Each of the CPU/Memory units 15/15' is coupled to a respective I/O unit 25/25'. The I/O unit provides an interface between the CPU/Memory units 15/15' and a variety of external devices, such as a disk drive, a console, or a network. Each of the I/O units 25/25' are coupled to the respective CPU/Memory units 15/15' by 16 bit I/O bus, 15c/15c'. In addition, busses 15d/15d', which are exact copies of busses 15c/15c', also provide an interface between CPU/Memory units 15/15' and I/O units 25/25'. Providing an exact, or "phantom" copy of the busses 15c/15c' across the interface between the CPU/Memory unit and the I/O unit, allows for checking of the data integrity across the unit interface.

ROM busses 15b/15b' couple each of the CPU/Memory units 15/15' respectively, to a flash ROM (Read Only Memory) 18a/18a' and a set of error registers 18b/18b' on the I/O units 25/25' as well as an error register 17 on the CPU/Memory unit 15/15'.

The I/O units 25/25' are coupled to a variety of external devices by 32 bit busses 25d/25d'. Each of the busses 25d/25d' may support up to 8 external devices, referred to as 'personality cards', off of a port connections (personality ports). By way of example, a Digital Small Systems Interface (DSSI) ™ of Digital Equipment Corporation personality card 29 and a Network Interface (NI) personality card 30 are shown in FIG. 1B.

Additional I/O unit 26 may be coupled to I/O units 25/25' of the dual-zone system by Memory Interface busses 25a/25a'. The additional I/O unit 26 may also be an I/O interface unit, supporting an additional 8 personality cards in each zone, allowing for 16 personality cards in each zone, or a total of 32 personality cards (I/O device interfaces) in each dual-zone system 10.

Each of the functional units, including the CPU/Memory Units 15/15', the I/O units 25/25', the personality cards, and the control panel 19/19', includes a Non-Volatile RAM for storing board information about each unit such as manufacturing revision number, serial number, or and network address. A set of serial Inter-Integrated Circuit (|²C) busses 15a/15a', 25c/25c', and 25d/25d' allows for access to these RAM devices by the CPU/Memory units 15/15'. The |²C bus protocol is defined by Philips Corporation.

A system I²C bus 15a/15a' couples the NVRAMs 20/20' on control panels 19/19' to the respective NVRAMs 14/14' in the CPU/Memory units 15/15', the respective NVRAMS 24/24' in the I/O units 25/25' and the respective NVRAMs 26a/26a' in any additional I/O units 26/26' to a system I²C controller 21/21' on I/O units 25/25'.

A personality card (PCARD) I²C bus 25d/25d' couples all of the personality cards on a given bus to an I²C controller on the I/O unit which is driving that bus. (For example, PCARD I²C bus 25d/25d' couples the NVRAMS on DSSI pcard 29/29', NI pcard 30/30', and other pcards 31/31' to an I²C controller 23/23' on I/O unit 25/25'. However, any PCARDS driven by I/O unit 26/26' would be coupled to a PCARD I²C bus 26c/26c' which would be controlled by an I²C bus controller 26b/26b' in unit 26/26').

A POWER I²C bus 25c/25c' couples a power supply controller (not shown) to a third I²C bus controller 22/22' in the I/O unit 25/25'. Each of the I²C bus controllers (21/21', 22/22' and 23/23') are available to CPU/Memory units 25/25' to allow the system to read and write data to the NVRAMS, and to monitor and control the power supply.

A parallel bus 25f hereinafter referred to as a crosslink bus couples the I/O units 25/25' of each zone 12/12'. Each time the dual-zone processing system performs an operation which accesses I/O space, checks are performed by hardware in each of the I/O units to ensure that both zones are performing the same I/O access. One zone drives the crosslink bus, while the second zone checks the data on the bus to ensure that it is performing an identical I/O task. That is the zone which requests the bus is the zone which drives the bus while the other zone checks the data driven on the crosslink bus. If there is a miscompare in the I/O requests between the two zones, the dual-zone system has fallen out of lock step, and a system error is logged.

A serial crosslink bus 25g also couples the I/O units 25/25' of each zone 12/12'. The serial crosslink bus 25g is used during re-synchronization to enable the two zones to communicate before they have achieved lock step operation. The use of the serial crosslink bus 25g during initialization and re-synchronization will be discussed in more detail later in the specification.

Fault Tolerant Philosophy

The synchronization of the two zones 12/12' is implemented by treating each system as a deterministic machine which, upon receipt of the same inputs and starting in the same known state, will always enter the same machine state and produce the same results unless there is some error. Zones 12/12' are configured identically, receive the same inputs, and therefore pass through the same states. Thus, as long as both processors operate synchronously, they should produce the same results and enter the same state. If the processing systems are not in the same state or produce different results, it is assumed that one of the zones 12/12' has faulted. The source of the fault must then be isolated in order to take corrective action, such as disabling the faulting unit.

Error detection generally involves overhead in the form of additional processing time and hardware. To minimize error detecting overhead, a system should check for errors as infrequently as possible consistent with fault tolerant operation. Fault tolerant operation necessitates the ability to detect an error in a zone, the ability to correct the error, and the ability to resume operation without impacting the processing of the computer system 10. At a minimum, however, error detection must occur before data from CPU units 15/15' propagates to the external systems. Otherwise, corrupted CPU data may cause improper operation of the external system, with unpredictable consequences.

Additional error detection hardware is desirable in order to isolate the fault within the CPU/Memory unit 15. For example, if the fault can be isolated to one of the components on the CPU/Memory unit 15, the component may be removed and replaced, thereby saving the cost of replacing the entire unit. Each zone of the present invention, which combines hardware redundancy with error correction codes to optimize error detection and fault isolation on the CPU/Memory unit 15, as will be discussed below.

Figure 2B:
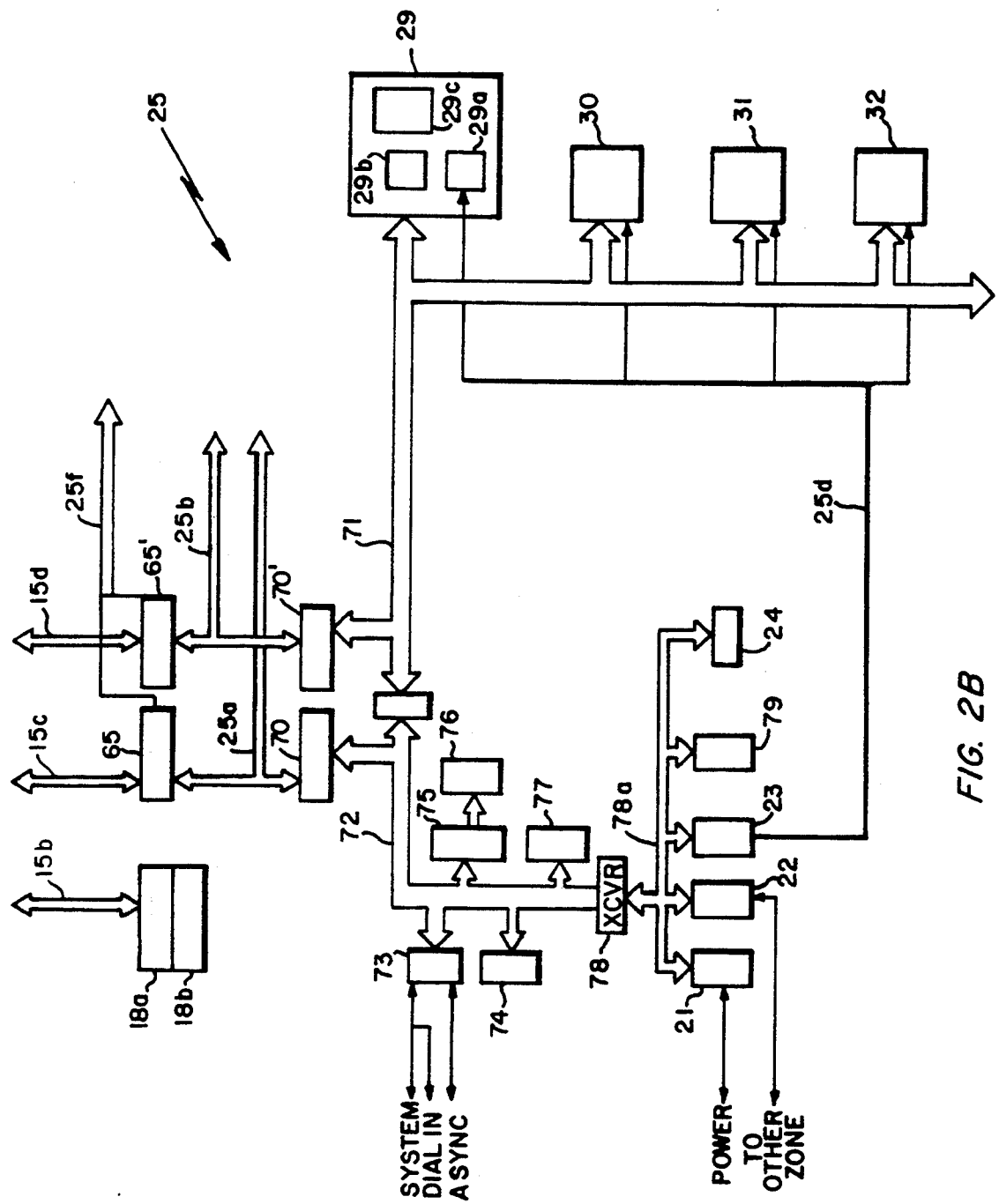
FIG. 2B is a block diagram of a input output interface to the primary rail/phantom rail computer system of FIG. 2A in accordance with the present invention.

Referring now to FIG. 2, FIGS. 2A, and 2B, a fault tolerant, single fail stop computer system 13 is shown to include a so called primary rail computer 41 and a phantom rail computer 41'. Each of the zones 12, 12' (i.e. zone A, zone B) of the fault tolerant computer system (FIG. 1A) would include one of said single fail stop computer systems 13. The primary rail 41 and phantom rail 41' are two computer systems which are disposed to operate in so called "lock step" operation as will be described below and which are used to provide a certain degree of computing redundancy and thus fault tolerance to the computer system 10. The primary rail 41 is substantially identical to the phantom rail 41' and thus only the differences in the phantom rail 41' with respect to the primarily rail 41 will be discussed below and a complete discussion of the primary rail 41 will suffice for a discussion of both the primary rail 41 and the phantom rail 41'.

The primary rail 41 is shown to include a central processor unit 42, here any standard processor or microprocessor type of device. A preferred example for processor 42 is the so called NVAX+ chip manufactured by Digital Equipment Corporation as part number 21-34684-01. Alternative chips include 64 bit processors such as Digital part number 21064. Here, the NVAX+ CPU is used for the central processing unit 42.

The primary rail computer system 41 further includes a system Bus 43 comprised of address Bus lines 43a, data Bus lines 43b, ECC Bus lines 43c and control Bus lines 43d respectively as shown. The system Bus 43 has one port which is coupled to respective ports of the CPU 42 and has a second port which is coupled to a memory cache 46. Memory cache 46 will be further described in conjunction with FIG. 3A. Suffice it here to say however that memory cache 46 is a shared memory resource between the primary rail computer 41 and phantom rail computer 41' as will be further described. A second port of the system Bus 43 is coupled to a Bus interface circuit 54. Bus interface circuit 54 here comprises an address interface circuit 54a and a data interface circuit 54b. Details of construction of the bus interface circuit 54 will be discussed in conjunction with FIG. 3B.

The output from the Bus interface circuit 54 are a pair of Busses 55, 56. A first Bus 55, the memory Bus has address, data, and check bit lines as well as control signal line between the Bus interface circuit 54 and a main memory 50. Main memory 50 will be discussed with FIG. 3B. Suffice it here to say that main memory 50 is a resource which is shared in common between the primary rail 41 and phantom rail 41'. The primary rail 41 has a second Bus here an internal interface Bus 56 comprised of address and control lines which are fed between the Bus interface circuit 54 and a Bus interface/control circuit 60. Bus interface circuit 54 as well as Bus interface and control circuit 60 are provided to format data from the system Bus 43 to the reminder of the primary rail 41. That is the system Bus 43 has typically a relatively wide data Bus here for example 128-bits of data and correspondingly 28-bits of error correcting code associated with 128-bits of data. The Bus interface circuit 54 formats the data into a data width of here 32-bits and corresponding ECC bits into a width of 7 bits which accommodates the width of the data and the ECC bits associated with the internal interface bus 56. The Bus interface 54 also contains part of the control logic for a direct memory access operation in the primary rail 41. Likewise, the data interface circuits 54b–54e format the data into an appropriate width of here 256 data bits and 56 ECC bits for the memory.

The Bus interface and control circuit 60 is fed by the Bus 56 and provides outputs on a Bus 15c. Bus 15c is 16-bits wide. Thus, the Bus interface control circuit 60 formats the data from the Bus 56 to the appropriate width for the Bus 15c. The Bus interface/control circuit 60 further includes control logic to control a DMA operation in the primary rail 41, interfaces to the resynchronized Bus 15e which is used to resynchronized the memory in zone 12 with the memory in zone 12' or vice-versa during a system resynchronization and further interfaces to a read only memory (ROM) 18a via the ROM Bus 15b (FIG. 1B). Further details of operation of interface and control circuit 60 will be discussed in conjunction with FIGS. 6A–6C.

ROM Bus 15b also communicates with error register 17 on the CPU/Mem unit 15. Error register 17 is used to store errors of both the primary and phantom rails associated with accessing memory unit 50. These errors include single bit memory errors, double bit memory errors, ECC errors between the primary and phantom rails as well as address and control errors between the primary and phantom rails. Details associated with accessing the memory unit 50 will be further discussed in conjunction with FIG. 3B.

The phantom rail 41' has components similar to those in the primary rail 41. The phantom rail 41' includes a CPU 42' having a system Bus 43 including address signals on address Bus 43a', data on data Bus 43b', error correcting code bits on ECC Bus 43c', and control signals on control Bus 43d' Data bus 43b is coupled via a standard driver 45' to provide data to bus 43b', and subsequently CPU 42'. The standard driver 45' which couples to data bus 43b to bus 43b' provides improved signal integrity of the data bus 43b' The CPU 42/42', which operates in synchronization internally checks the data received on bus 43b/43b' against the ECC bits received on bus 43c/43c' on I/O cycle or memory read cycle.

The remaining portion of a data Bus 43b is not replicated throughout the remainder of the phantom rail 41'. Rather, a phantom error bus 43c' and a phantom address bus 43a' couple CPU 42' to the cache 46. The address ECC and control Busses 43a', 43c' and 43d' respectively are coupled to the cache 46 (FIG. 3A) as well as to a Bus interface circuit 54'. The Bus interface circuit 54' also includes an address interface circuit 54a' identical in construction to address interface 54a of the primary rail 41 and a data interface circuit 54b' which is here simpler in construction than the corresponding circuit 54b in the primary rail. Data interface circuit 54b' is here formats data associated with check bits on ECC Bus line 43c'.

As with circuit 54, Bus interface circuit 54' provides two Busses, a memory Bus 55' here comprised of address lines 55a' and ECC lines 55c' and control lines (not shown) and a phantom rail internal interface Bus 56' which is coupled between the Bus interface circuit 54 and a phantom rail Bus and control interface and control circuit 60'. Correspondingly, the error correcting code portion of Bus 56c' is also fed to Bus interface and control circuit 60 and the corresponding error correcting code portion 56c of Bus 56 in the primary rail is fed to the Bus interface and control circuit 60' of the primary rail 41'. In this manner, the Bus interface circuits 60/60' can check the error correcting code bits and check to determine that the processors 42/42' are operating in lock step, that is the processors 42/42' are synchronized and operating on the same instruction stream with out any errors in either of the two rails.

The Bus interface and control circuit 60' is also fed data via the data Bus 56b of Bus 56 of the primary rail 41. In this manner data can be transferred from the fault tolerant computer 20 through either one of the Bus interface and control circuits 60/60'.

Bus interface and control circuits 60 in addition to providing proper format between here the 32-bit wide Buses 56/56' and the 16-bit wide Buses 15c/15c' also includes a clock interface circuit 90 to provide clocking interface between the system CPU clock operating the CPU's 42/42' and an input/output (I/O) clock. Details of the operation of the clock interface circuit 90 will be described in conjunction with FIGS. 9-12. Again suffice it here to say that neither the frequency, nor phase used to clock CPUs, 42/42' need to be the same as the clock used with the input/output (I/O) units coupled to the busses 15c/15c', as would generally be the situation. The clock circuit facilitates data transfer on the bus 15c/15c' between two systems operating with different frequency and phase relationships.

Furthermore, the Bus interface and control circuit 60 further includes a DMA controller 92. DMA controller 92 has the logic necessary to provide a direct memory access capability in the primary rail 41. A corresponding DMA controller 92' is also provided in Bus interface and control 60' for the phantom rail 41'. The DMA controllers 92/92' on both rails are used to free the central processors 42/42' from controlling the transfer or moving large blocks of data from or to memory particularly during requests by I/O devices that may be attached to the single fail stop computer 13. Such DMA controllers are generally well known in the art for fault tolerant computers as well as computer systems in general. Although most of the controller is contained in Bus interface circuits 60/60' portions of the DMA control are also contained in Bus interface 54/54' as will be further described in conjunction with FIGS. 6-6E.

I/O Unit

Referring now to FIG. 2B, associated with both the primary rail 41 and the phantom rail 41' are communication devices 65/65' used to exchange data between the two zones and here referred to as crosslink communication devices coupled to bus interface and control circuits 60/60' by 16 bit busses 15c and 15d respectively. The 16 bit busses 15c and 15d include identical data, bus 15c reflecting the processing of the primary rail while bus 15d reflects the processing of the phantom rail. The crosslink communication devices 65/65' include interface logic to control the interface of the CPU devices 42/42' and memory 50 to a plurality of I/O devices. In addition, the crosslink communication devices 65/65' include logic to control the interface of their respective zone 12 with the neighboring zone 12' via crosslink cables 25f and 25g', thereby enabling the CPU chips in the second zone 12' to access the I/O device in the first zone 12. The crosslink communication devices 65/65' also function to ensure that CPUs in both zones receive the same data from the I/O devices at the same time, thereby allowing the zones 12/12' to remain in lock step. The crosslink communication devices are as described in U.S. Pat. No. 4,907,228, assigned to the assignee of the present invention and incorporated herein by reference. However other devices with similar characteristics may also be used.

Each one of the crosslink communication devices 65/65' is coupled to a respective I/O bus controller chip (FIREWALL) 70/70' by 16 bit Module Interface (MI) busses 25a and 25b. MI busses 25a and 25b each include identical data reflecting processing by the primary and phantom rail respectively. The I/O bus controller devices 44/44' control the interface between the 16 bit MI busses 25a and 25b to the 32 bit busses 71 and 72. In addition, the I/O bus controller device handles various system interrupts and I/O interrupts. The I/O bus controller devices 70/70' are also described in the above mentioned patent. However other devices with similar characteristics may also be used.

Bus 72 couples the I/O bus controller devices 70/70' to a plurality of I/O control devices 73-78. These devices include a System Support Device (SSC) 73 which provides the system console port, thus enabling console communication with each zone. The console port of both zones 12/12' are tied together, and software driving these ports treats them as one logical entity. A processor device 74 and RAM device 76 (controlled by RAM controller 75) operate in conjunction with the SSC device 73 to execute console instructions. The SSC device 73 is any standard console device.

The RAM device 76 comprises 4 Mbytes of dynamic memory. The read, write and refresh control signals for RAM device 76 are controlled by a memory controller device 75. The memory control device is a VAX memory controller device designed by Digital Equipment company, assignee of the present invention, however other, similar devices may also be used.

In addition to processing various console commands from the SSC device 73, the processor device 74 operates in conjunction with the RAM device 76 as follows and an interrupt controller chip 77 as follows: when various I/O devices coupled to the personality ports of the I/O units 25 require action from the processors 42, the device generate an interrupt signal, which is collected by the interrupt controller chip 77, and fed to the I/O bus controller chips 70 which prioritize the interrupts and pass the interrupt onto the processors 42 through the busses 15c, 56 and 43.

A transceiver 78 operates to convert the 32 bit bus 72 into a byte wide bus 78a for communication with a power controller (not shown) via I²C bus controller 21, bus controllers 22, and 23, a flash ROM 79 and a Non Volatile RAM (NVRAM) 24. Flash ROM 79 is also a NVRAM which contains code to control the startup of the processor 74 and diagnostic code to test the integrity of the I/O connections to the 8 I/O devices 29, 30, 31, 32 (and an additional 4 I/O not shown) as well as to verify the functionality of various registers and memory locations within the processor device 74, SSC device 73, VIC device 77, memory controller 75 and RAM 76. The NVRAM 24 contains unit specific information such as serial number, revision number, and other manufacturer specific information.

Bus controllers 21, 22 and 23 provide an interface of serial Inter-Integrated Circuit (I²C) busses 15a, 25c, and 25d to the byte wide bus 78a. Here, the I²C busses 15a, 25c, and 25d have two wires: a clock wire and a data wire.

Bus 71 interfaces the I/O bus controller devices 70/70' to up to 8 I/O devices, (4 of which are shown) such as a DSSI device, an Ethernet device, a SCSI device, etc. Each of these devices 29, 30, 31, and 32 are herein referred to as personality cards, and the connection port for a personality card to the bus 71 is herein referred to as a personality port. Each of the personality cards include a memory RAM 29c to store data which is to be transmitted to/received from bus 71. Also, each of the personality cards includes a processor device 29b which controls memory operations on RAM 29c and controls the interface of the personality card 29 to bus 71. In addition, each personality card 29 includes a Non-Volatile Random Access Memory (NVRAM) device 29e which is used to store card specific information such as serial number, revision number, manufacturing specific information, information related to failures during system operation and diagnostic information.

Figure 2C:
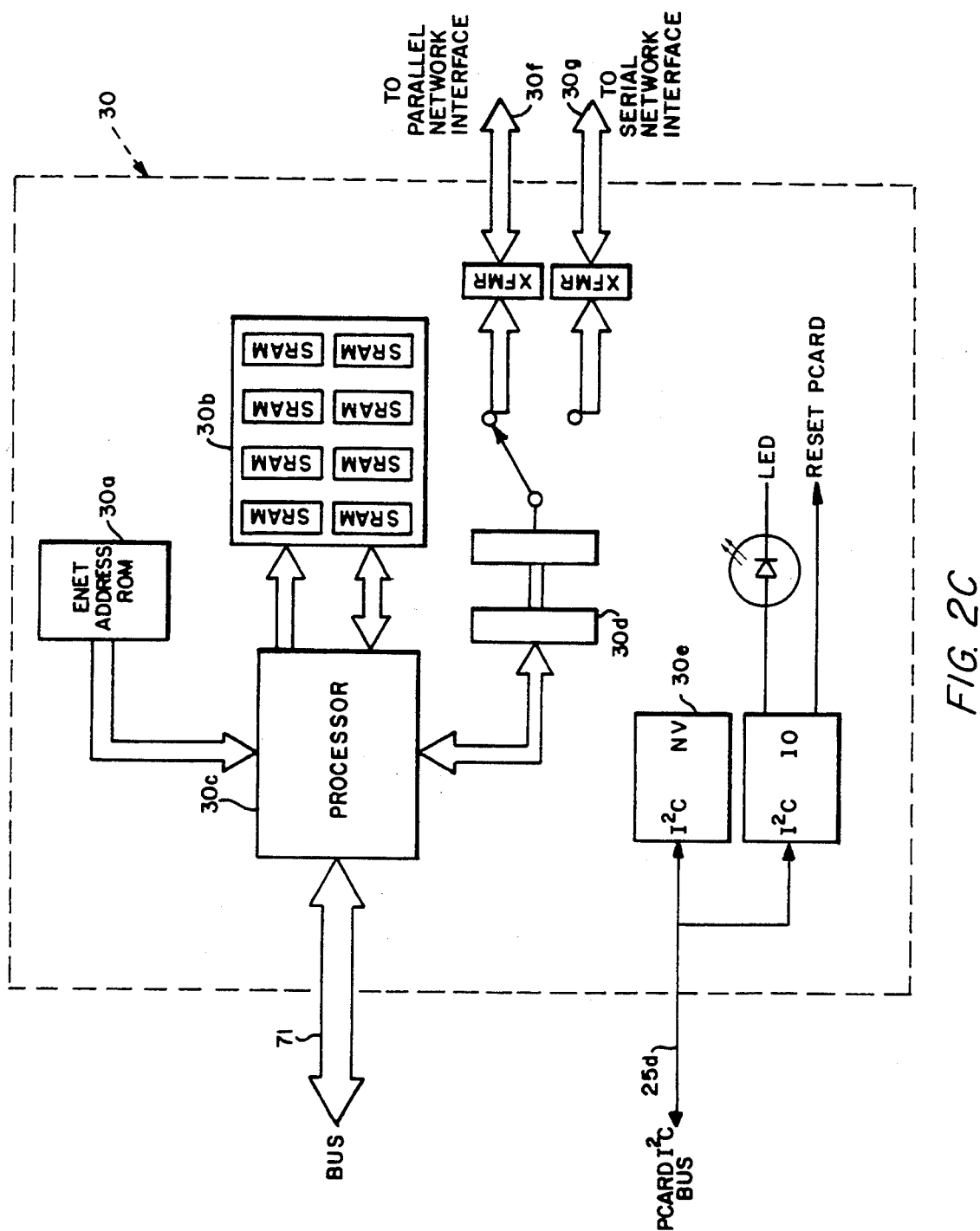
FIG. 2C is a block diagram of a network interface device used in the fault tolerant processor of FIG. 2.

Referring now to FIG. 2C, a typical network interface (NI) personality card 30 is shown to include a processor device 30c coupled to bus 71. The processor device 30c performs all RAM related operations on RAM unit 30b, such as read operations, write operations, refresh, related arbitration, and data buffering. The RAM unit 30b of the preferred embodiment includes eight 32K×8 static RAM devices and is used to store information received over bus 71 and either a thickwire Ethernet bus 30f (16 bit bus) or a thinwire Ethernet bus 30g (serial bus).

Each network operates under a given protocol which determines the format of data which may be transmitted on the network. In an Ethernet system, data is transmitted in blocks of data, referred to as 'packets'. The block of data includes a destination field which indicates the computing system to which the data is to be transmitted. In addition, other information is included in the packet such as the number of bytes of the data field in the packet, a Cyclic Redundancy Code (CRC), and a sequence of bits which signals the NI card 30 as to the start and end bits of a packet.

Specialized devices, known to those skilled in the art, recognize and respond to the various network protocols. The processor device 30c also provides bus 71 access to a Local Area Network Device for Ethernet (LANCE) 30d in the preferred embodiment to respond to an Ethernet network. However, other specialized devices designed for a different network protocol could be used in a different network configuration.

Among the functions of the LANCE device 30d is to recognize and respond to network messages destined for the computer system which it supports. An Ethernet Address ROM 30a, coupled to the processor 30c, is used to store a network address for the personality card. Typically, during power up, the network address is read out of the Ethernet Address Rom 30a and stored in the LANCE device 30d. However, in the fault tolerant environment, it is not advantageous to use this address, because many NI cards with different addresses in the Ethernet Roms could be configured in one computing system, and would thereby respond to different network transactions and fall out of synchronization. Subsequently, a Non-Volatile RAM 20 is included on control panel 19 to allow for storage of a unique system identification number as will be discussed in conjunction with FIG. 2D.

Figure 2D:
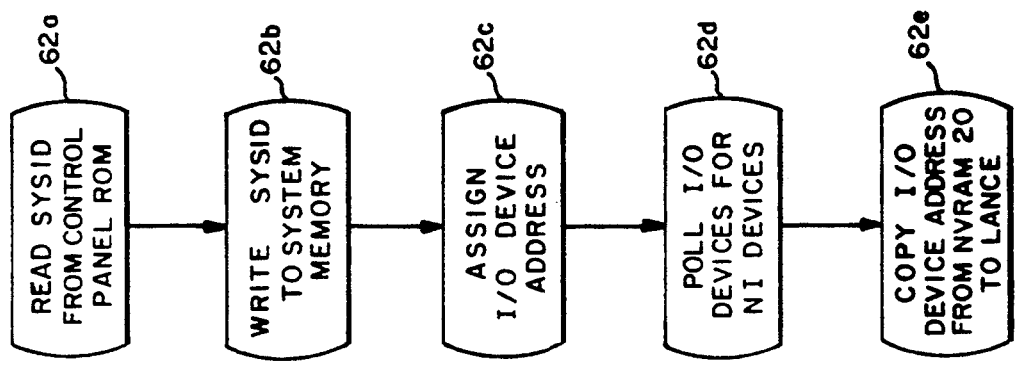
FIG. 2D is a flow chart showing the steps in assigning a system identity to the fault tolerant computer of FIG. 1A.

Referring now to FIG. 2D, in the preferred embodiment, the system identification number to which the LANCE 30d (FIG. 2C) responds is derived from NVRAM 20 (FIG. 1B) mounted on the control panel 19 (FIG. 1B). Because the NVRAM 20 is socketted on the control panel 19, it is physically separate from the remaining computing system, and is not effected by the swapping out of various system components. Although in this embodiment the NVRAM 20 is stored on the control panel 19, the system identification number could also be stored in an NVRAM on another hardware component (for example the system console unit) which is less likely to be removed from the fault tolerant system 10.

As mentioned previously and shown at steps 62a and 62b of FIG. 2D, during initialization, the system identification number (SYSID) is read out of the NVRAM 20 on control panel 19 and stored in system memory 50 (FIG. 2A). At step 62c the CPU 42 uses the SYSID as a basis for assigning I/O device addresses which are written to the NVRAMs on the appropriate personality cards. For example, the NVRAM 30e (FIG. 2C) on NI personality card 30 includes an I/O device address derived from the original SYSID stored in NVRAM 20 on the control panel 19.

After the I/O device addresses have been assigned, data from the NVRAM 20 on control panel 19 is read over the I²C bus 25d by the CPU/Memory unit 15, and written to the LANCE device 30d via bus 71 and the processor device 30c. Thus, the network address to which the LANCE responds is derived from the memory chip information on the enclosure, rather than information stored on the I/O module or personality card. Because the system identification number is stored in an NVRAM 20 mounted on the control panel 19, the system identification number of the dual-zone system will be unaffected by the replacement of any CPU/Memory Units, I/O units, or Network Interface personality cards. Details concerning the accessing of the NVRAMs 20 by the zones 12/12' will be discussed below.

Figure 3A:
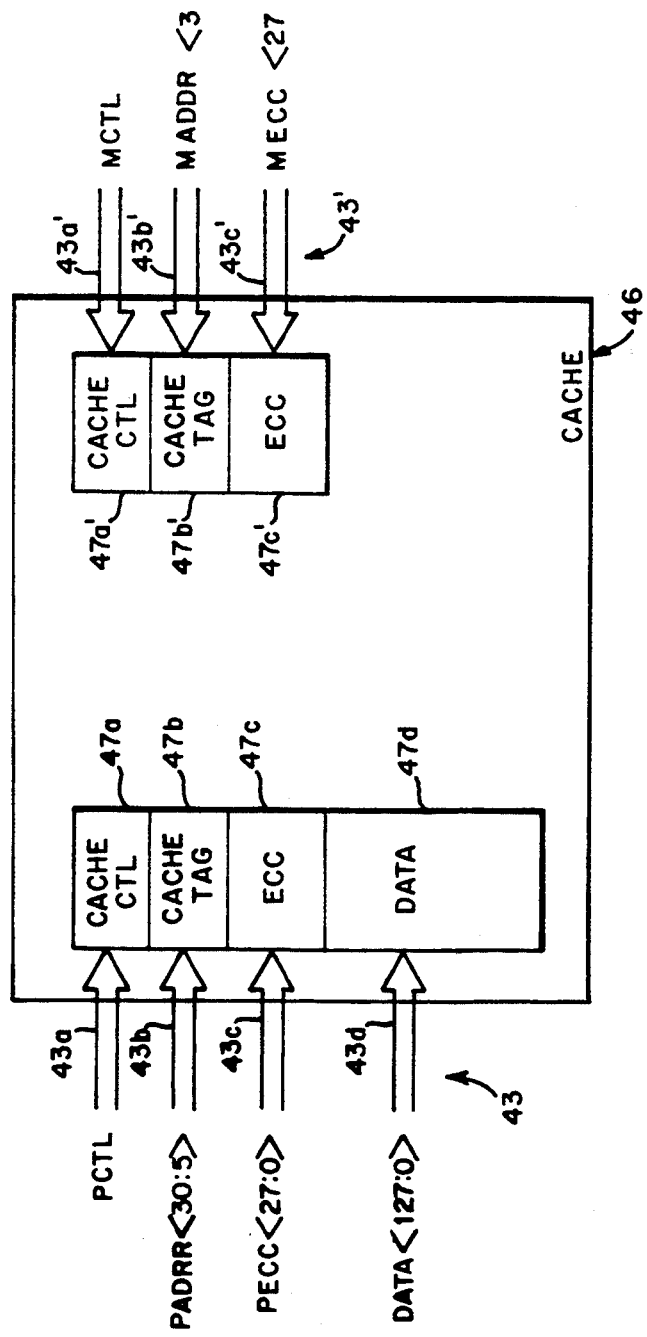
FIG. 3A is a block diagram of a cache memory used in the primary rail/phantom rail computer system of FIG. 2A.

Referring now to FIG. 3A, a block diagram of the cache 46 for the single fail stop computer system 13 is shown to include a cache controller 47a for primary rail 41 and a corresponding cache controller 47a' for phantom rail 41'. Cache controllers 47a/47a' are fed via appropriate control signals such as Read, Write and INVALIDATE from control Busses 43d/43d' respectively from each of the primary and phantom rails 41/41'. The cache controller further includes cache tag store 47b/47b', ECC stores 47c/47c' and a single data store 47d. The cache tag circuits 47b/47b' are fed by portions of the address Bus 43a/43a' here the bits <29:5>. The cache tag stores 47b/47b' are used to identify the corresponding locations for which stored ECC bits in the ECC stores 47c/47c' and the data bits stored in data store 47d are stored.

It should be noted that cache 46 does not have a corresponding data store for the data from the phantom rail 41' and that there is not a corresponding connection of the data Bus from the phantom rail into the cache 46 for write operations. However, for read operations the data bus from the primary rail couples the data onto bus 43b' to input into the phantom rail processor 42'.

Cache 46 is typically used as a relatively fast access portion of storage for the central processor 42/42'. The single data store 47d occasioned by the use of an abbreviated data Bus in the phantom rail 41' as mentioned above and as will be further discussed below, reduces the data store requirements for the cache store 46. In accordance with control signals on Bus 43d/43d' signals (not shown) are generated by the cache controller 47a/47a' to permit data on the address lines 43a/43a', ECC lines 43c/43c', and data on data lines 43b to be stored respectively in the cache tag stores 47b/47b' ECC store 47c/47c' and the data store 47d.

Figure 3B:
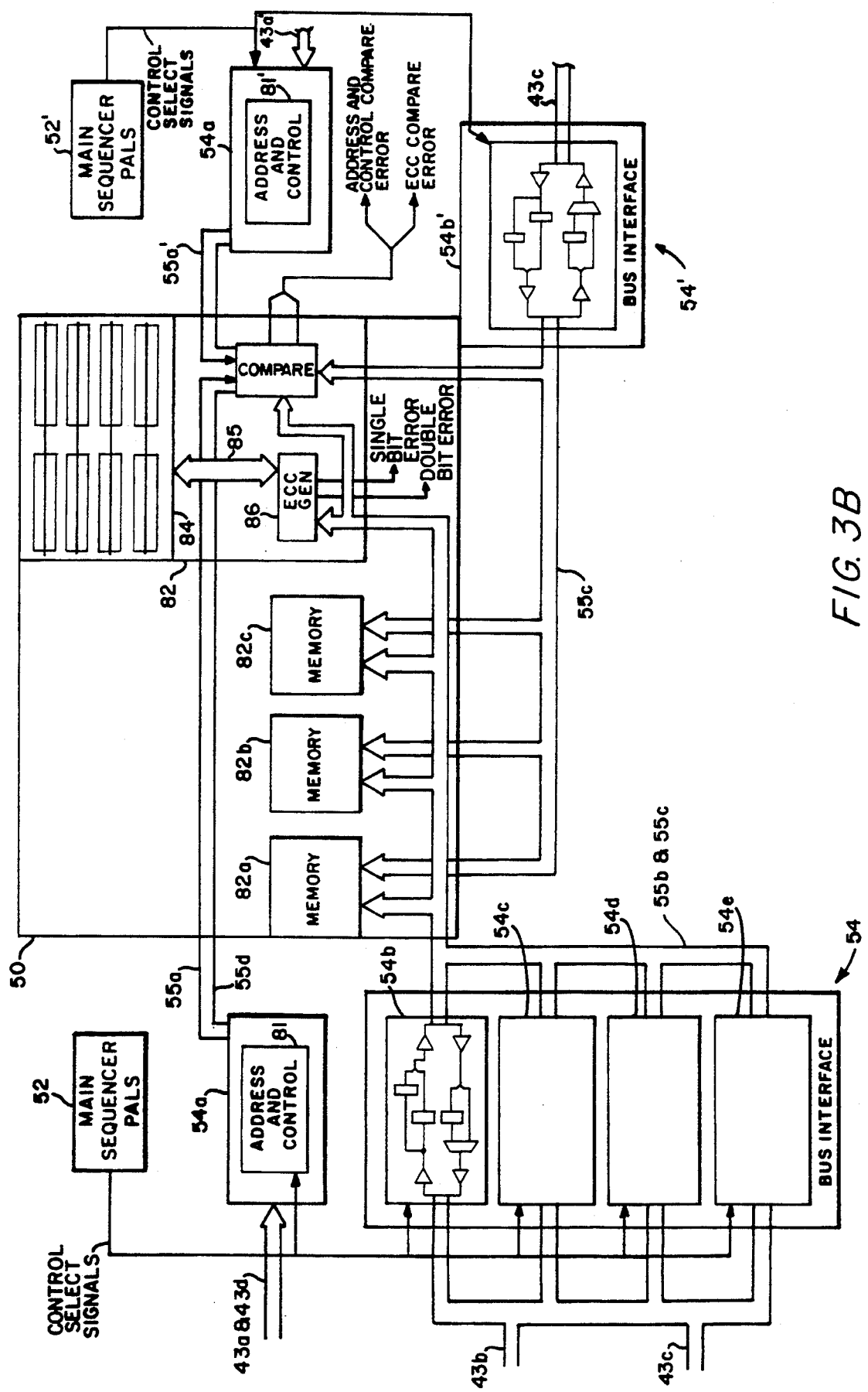
FIG. 3B is a block diagram of a main memory for the primary rail/phantom rail computer system of FIG. 2.

Referring now to FIG. 3B, the memory subsystem includes a primary rail memory controller 52, a main memory 50, and a phantom rail memory controller 52'. Referring now to the primary rail, the bus interface circuit 54a of the primary rail 41 (memory controller 54) controls memory access signals (such as RAS, CAS, Write Enable) and memory refresh. The ECC/data storage device of primary rail 41 includes 4 buffering ASICS (54b, 54c, 54d, and 54e) on the primary rail. Each buffering ASIC may buffer up to 40 bits comprised of both data and ECC to provide a communication link between the 128 bit data bus 43b and the 28 bit ECC bus 43c of the primary CPU 42 and the 256 bit data bus 55b and the 56 bit ECC bus 55c of the memory 50.

Main sequencer Programmable Array Logic (PAL) device 52/52' furnish control and select signals to the 4 buffering ASICS 54b-54e as well as the bus interface controllers 54a/54a'. The main sequencer PALs provide memory address select bits for memory operations from the CPU 42/42' to address and control asic 54a, while memory address bits for DMA operations are provided by interface and control circuit 60. The main sequencer PALS also provide select lines to the 4 buffering ASICS to control which longword of data from memory is driven on bus 43b.

The phantom rail 41' includes bus interface circuit 54a' which provides memory control signals identical to bus interface circuit 54a of the primary rail. The ECC/data storage device of the phantom rail includes only one buffering ASIC 54b' to store only ECC data bits from the ECC bus 43c'. Because the data bus is not provided in the phantom rail, 3 fewer buffering ASICS and less space for conductors which would have been required to replicate data bus 43b are needed. Similar to the primary rail, the main sequencer PALs 52' provide memory address select bits to address and control asic 54a' and buffering asic 54b' for memory operations from the CPU 42/42', while memory address bits for DMA operations are provided by interface and control circuit 60/60'.

Main memory 50 includes four memory motherboards 82, 82a, 82b, and 82c. While all four memory motherboards are identical, memory motherboard 82 has been shown in detail and all references to memory motherboard 82 should be understood to be applicable to all four memory units.

Each memory unit 82 is capable of supporting 2,4,6, or 8 memory SIMMs (Single Inline Memory Modules). Each SIMM contains either 10 or 20 DRAMs (Dynamic Random Access Memory). Each memory motherboard 82 holds two longwords of data (64 bits) out of every hexword (256 bits). A SIMM with DRAM devices on one side has one bank of memory, a SIMM with DRAM devices on both sides has two banks of memory. The memory motherboard 82 shown in FIG. 3 includes 8 SIMMs each having DRAM devices on both sides of the unit. Depending on whether 256K×4, 1M×4 or 4M×4 DRAMs are used in each bank, the maximum bank size is 8 MB, 32 MB, or 128 MB.

The memory motherboard 82 also includes ECC checking and generation logic 86 for ECC checking of two longwords and comparison check logic 88 for comparing ECC, address, and control information from each of the memory controllers 54a/54a'.

The ECC check and generation logic 86 generates 14 ECC bits for the two longwords of data which it receives from the memory bus 55b. The generated ECC bits are compared to the 14 ECC bits received on the primary rail ECC bus 55c. Single bit errors and multiple bit errors during memory reads and memory writes are indicated by assertions of signals SINGLE BIT ERROR and DOUBLE BIT ERROR, and the error is logged in error register 17 on the CPU unit. The primary rail 41 ECC error code bits on ECC bus 55c are then stored, along with the data bits on memory bus 55b, into the memory SIMMs.

In addition to the ECC check of the data discussed above, the ECC bits on primary rail ECC bus 55c and the ECC bits on phantom rail ECC bus 55c' are checked for inconsistencies by the checker logic 88. The checker logic 88 additionally checks the address bits on address bus 55a of the primary rail with the address bits of the phantom rail bus 55a', and the memory control signals from the address and control logic 54a on bus 55d with the memory control signals from address and control logic 54a' on bus 55d'. If an inconsistency is detected, signal ECC COMPARE ERROR , or ADDRESS AND CONTROL COMPARE ERROR is asserted, and an error is logged in the error register 17 on the CPU unit 15,15' (FIG. 1B). One error bit associated with each of the 4 types of errors (single bit error, double bit error, address and control compare error and ECC compare error) is stored for each memory motherboard (82, 82a, 82b, and 82c).

When data is written to memory, the ECC check and generate logic 86 may detect a single bit error on the write data. Similarly, when data is read from the memory, the ECC check and generation logic 86 provides 14 bits of ECC bits for the two longwords of read data, and compares these ECC bits against the stored ECC bits. Both the primary rail 41 and phantom rail 41' receive the stored ECC bits on bus 55c along with the data bits on bus 55b. The read data and ECC are temporarily stored in the ECC/data storage device 54b on the primary rail 41, and in the ECC storage device 54b' on the phantom rail 41'.

The data bits and ECC bits are transmitted from the memory controller 54 in the primary rail 41 by ECC bus 43c and data bus 43b and the data is checked and/or corrected in the CPU 42. The phantom rail 41' receives only the ECC bits on ECC bus 43c' from memory controller 55', however, it receives the correct data bits from data bus 43b, thus enabling the two processors to maintain synchronous and accurate operation. The CPU 42' of the phantom rail 41' also checks and corrects the received data bits.

If there is corruption on the data path during the read operation, both CPU 42 and CPU 42' will detect an error. If an error is detected by either CPU at this point which was not detected by the error checkers in memory logic during the memory read, then the fault may be isolated to either memory controller and their corresponding data busses.

Thus, the error checking mechanisms operate collectively to notify the system of a fault within one of the zones in order to ensure that a faulty zone is immediately removed from the system. Consequently, fault tolerance is maintained without a replication of a cache data storage device or a data bus on the phantom rail 41'. Hardware expense is minimized by checking the data bus for CPU 42' on the phantom rail. By checking memory read and write data by the memory device 50 fault isolation to a module level is ensured.

Error Code Detection/Correction

As shown below in Table 1, the Error Correction Code template of the present invention uses 7 bits of ECC (c0–c6) for every 32 bits of data (d00–d31). Those of data bits d00–d31 which have an X in their column for the respective ECC row are used to provide the respective ECC bit. The data bits used to calculate ECC bits c0, c1, c4, c5 and c6 are exclusively-ored together, while the data bits used to calculate ECC bits c2 and c3 are exclusively-noted together. For example, data bits 31, 29, 28, 26, 21, 19, 18, 17, 14, 11, 9, 8, 7, 6, 4 and 0 are Exclusive-Ored together to provide ECC bit c0.

TABLE 1

| check bits | Data Bits | | | | | | | | | | | | | | | |
|---|---|---|---|---|---|---|---|---|---|---|---|---|---|---|---|---|
| | 31 | 30 | 29 | 28 | 27 | 26 | 25 | 24 | 23 | 22 | 21 | 20 | 19 | 18 | 17 | 16 |
| c0 XOR | x | | x | x | | x | | | | | | x | | x | x | x |
| c1 XOR | | | | x | | x | | x | | x | | x | | | x | x | x |
| c2 XNOR | x | | x | | | x | x | | x | | | | x | x | | x |
| c3 XNOR | | | x | x | x | | | | x | x | x | | | | x | x |
| c4 XOR | x | x | | | | | | | x | x | x | x | x | x | | |
| c5 XOR | x | x | x | x | x | x | x | x | | | | | | | | |
| c6 XOR | x | x | x | x | x | x | x | x | | | | | | | | |

TABLE 2

| check bits | Data Bits ECC for 0011001100110011 | | | | | | | | | | | | | | | |
|---|---|---|---|---|---|---|---|---|---|---|---|---|---|---|---|---|
| | 15 | 14 | 13 | 12 | 11 | 10 | 09 | 08 | 07 | 06 | 05 | 04 | 03 | 02 | 01 | 00 |
| c0 XOR | | 0 | | 0 | | 1 | 1 | 0 | 0 | | | 1 | | | | 1 |
| c1 XOR | | | | 1 | | 0 | | 1 | | 0 | | 1 | | 0 | 1 | 1 |
| c2 XNOR | 0 | | 1 | | | 0 | 1 | | 0 | | | 1 | 0 | | | 1 |
| c3 XNOR | | | 1 | 1 | 0 | | | | 0 | 0 | 1 | | | | 1 | 1 |
| c4 XOR | 0 | 0 | | | | | | | 0 | 0 | 1 | 1 | 0 | 0 | | |
| c5 XOR | 0 | 0 | 1 | 1 | 0 | 0 | 1 | 1 | | | | | | | | |
| c6 XOR | | | | | | | | | 0 | 0 | 1 | 1 | 0 | 0 | 1 | 1 |

As shown in Table 2, (wherein only 16 bit of the ECC table shown in Table 1B are used), to calculate the check bits for 16 bits of data 0011001100110011 (wherein the bits are ordered from bit 15-0) each bit value is written in Table 2 where a corresponding X appeared in the Table 1. Therefore, to provide ECC bit c0 for data 0011001100110011, data bits 0, 4, 6, 7, 8, 9, 11 and 14 are exclusively-ored together, as shown below:

```
(1 XOR 1)=0
     XOR 0) =0
         XOR 0)=0
             XOR 1)=1
                 XOR 1)=0
                     XOR 0)=0
                         XOR 0==>0
```

Similarly, the values for C1-C6 may be provided, giving a correct ECC code for data 0011001100110011 equal to 0110010, as shown in Table 2.

As described previously, before data from data bus 55b is written to the memory motherboards 80, 80a, 80b and 80c, the ECC is generated from the data and checked against the ECC which is sent to the motherboard over the ECC bus 55c. If, for example, there was a fault in data bit 10, making the data which was supposed to be 110011001100 equal to 1100110011101100, then the generated ECC (calculated in the same manner as shown in Table 2) would be equal to 0000000. A XOR comparison of the generated ECC with the received ECC yields an error syndrome.

TABLE 3

| | c0 | c1 | c2 | c3 | c4 | c5 | c6 |
|---|---|---|---|---|---|---|---|
| Calculated Check | 0 | 0 | 0 | 0 | 0 | 0 | 0 |
| Received Check | 0 | 1 | 1 | 0 | 0 | 1 | 0 |
| Error Syndrome | 0 | 1 | 1 | 0 | 0 | 1 | 0 |

The Error syndrome of this example is equal to 0110010. To determine which bit of the data is in error, and thus to correct the bit, the error syndrome is compared to the check bit strings (c0-c7) for each data bit as shown in Table 1. The comparison is made to detect which bit location has a pattern equal to the error syndrome. By way of example illustrating this point, replacing all of the X's of the ECC Table 1 with '1's, and all of the blank spaces of Table 1 with '0's, it can be seen that the ECC pattern for bit 10 or the data is 011010, which is the same pattern as that for the error syndrome. Thus, bit 10 is correctly identified as the bit in error.

The ECC check and generate logic 86 can also determine if the error bit was not in the data but in the received ECC as follows. For example, if the received ECC on ECC bus 55c was equal to 0111010, and the generated check by the check and generate logic 160 is 0110010, the Error Syndrome is then 0001000.

| | c0 | c1 | c2 | c3 | c4 | c5 | c6 |
|---|---|---|---|---|---|---|---|
| Calculated Check | 0 | 1 | 1 | 0 | 0 | 1 | 0 |
| Received Check | 0 | 1 | 1 | 1 | 0 | 1 | 0 |
| Error Syndrome | 0 | 0 | 0 | 1 | 0 | 0 | 0 |

A 1 in the check bit string location c3 thus indicates that check bit c3 was the bit in error.

Thus, through the use of a combination of minimal hardware replication and frequent error checking and correction mechanisms, a CPU/Memory unit capable of isolating faults provides a high degree of fault tolerance by enabling the detection and correction of faults within a system and facilitating the return of the system to full redundancy.

Booting the Dual Zone System

Figure 4:
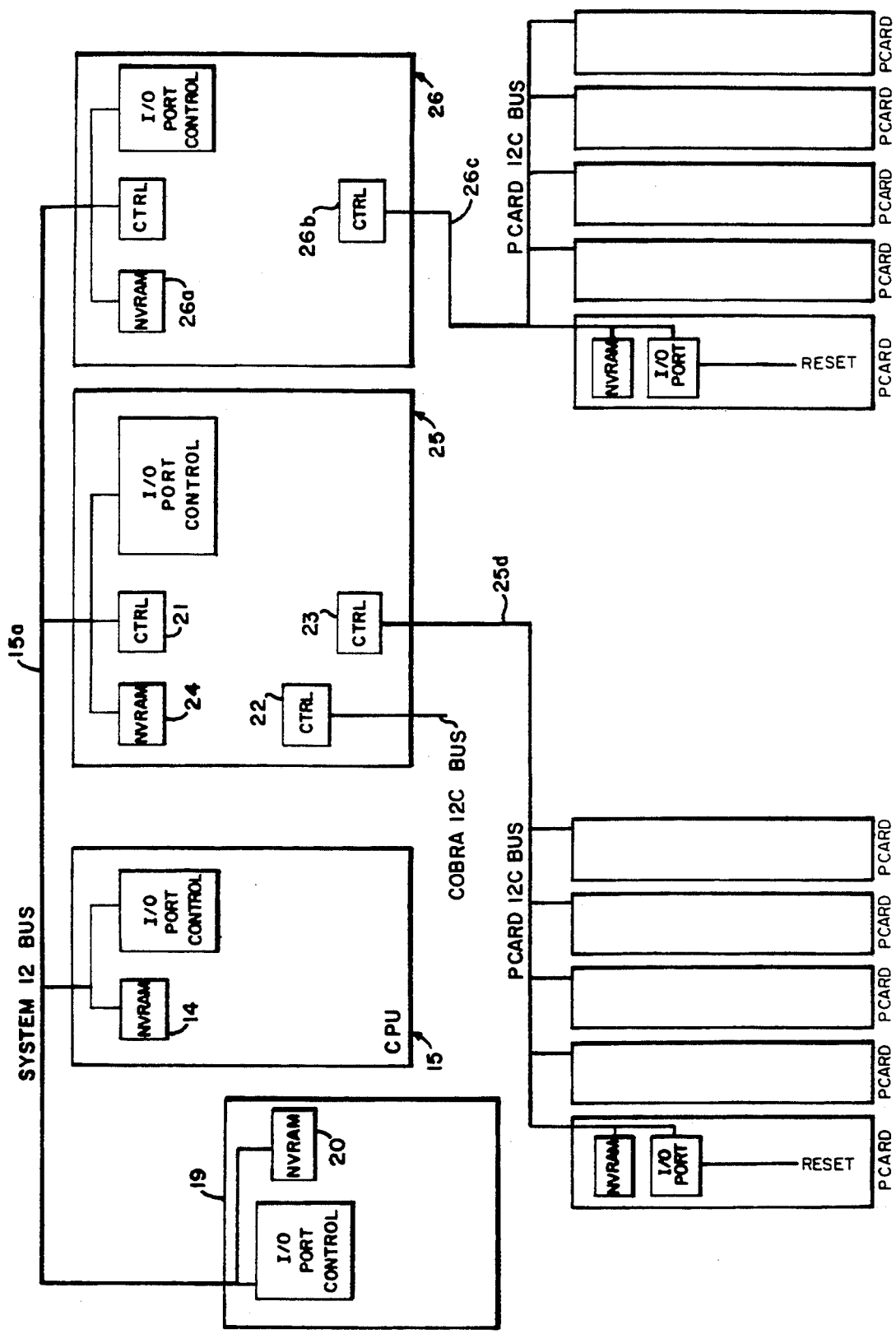
FIG. 4 is a simplified block diagram of the primary rail/phantom rail computer system of FIG. 2A showing an associated input/output interface and bus interconnections for peripheral devices which is useful in understanding a technique for maintaining system identity in the fault tolerant computer system of FIG. 1A.

Referring now to FIG. 4 bus controller 22 provides an interface between the power supply 4 (FIG. 1A) and the byte wide bus 78a (FIG. 2B) to enable the CPU 42 (FIG. 2A) to control and monitor certain characteristics of power supply 4 (FIG. 1A). For example, an over temperature condition or variations in input line current can be monitored and the power supply can be powered down by software for an orderly shutdown.

Bus controller 23 provides an interface between the NVRAMs on each personality card (for example NVRAM 30e on the Network Interface card 30, FIG. 2C) and the byte wide bus 78a, thus allowing reads and writes of the various information such as serial number, revision number, etc. over bus 78a. Bus controller 21 provides an interface between NVRAM 24 on the CPU/Memory unit 15, the NVRAM 20 on the control panel 19, the NVRAM 24 on the I/O unit 25 and the byte wide bus 78a, thus allowing reads from and writes to the respective memory devices over bus 78a. NVRAMs 20/20' on the control panels 19/19' are disposed in sockets (not shown) used to store the Ethernet system identification number for the entire dual-zone system 10. Both NVRAMs 20/20' include the same Ethernet system identification number. Each dual-zone system is furnished a block of 32 consecutive Ethernet system identification numbers. The Ethernet system identification number which is stored in NVRAMs 20/20' is the base address of the block of 32 consecutive addresses.

During the power up sequence, both zones 12/12' operate individually to initialize the clocking system, perform diagnostic testing, load system software, and provide the CPUs 42/42' and memory units 50/50' an initialized state. During initialization, each zone reads a system identification number out of NVRAM 20/20', and loads it into system memory space within memory 50/50' (FIG. 2A).

During the power-up sequence, each zone assigns I/O device addresses to all the external devices attached to the I/O unit personality ports. Each I/O device address is derived by adding the port number of the personality port in which the I/O device resides to the system identification number which was copied from NVRAM 20 into system memory. For example, given a system identification number of 100, the personality card in personality port 0 will have the I/O device address of 100, the card in port 1 has the I/O device address of 101, and the card in port 7 has the I/O device address of 107. If a second I/O unit 18 is coupled to MI busses 25a and 25b, the I/O device addresses of the 8 personality cards coupled to bus 26c would range between 108 for personality port 0 of bus 26c, to 115 for personality port 7 of bus 26c. The most significant bit of the I/O device address is then inverted for addresses to the other zone.

Referring again to FIG. 2C, in addition to the I/O device address stored in NVRAM 30e, a second system identification number is stored in an Ethernet ROM 30a on the NI unit 30. In single processor or single zone computing system, this second system identification number may be used as the Ethernet address. In a single zone configuration, the system identification number may be copied from system ROM 30a and stored in the LANCE device 30d. Thus, the Ethernet address stored in Ethernet ROM 30a is used as the network address for the single zone system. However, in the single fail stop computer system 13, the Ethernet address which is written to the LANCE device 30d is derived from the system identification number stored in NVRAM 20 on control panel 19. As discussed previously, this is achieved by the CPU/Memory device reading the system identification number from the NVRAM 20 on control panel 19 and writing, and writing it in the LANCE chip 30d via bus 71. As discussed previously, the address stored in the LANCE device is considered to be the network address of the dual-zone system 10, and it is the address to which the LANCE device 30d responds to transmit and receive packets over the network.

Although the two zones are not initially in synchronization, communication between the two zones may still be achieved over the serial crosslink communication channel 25f. At the end of the diagnostic testing, when a zone has been determined to operable, it uses the serial crosslink communication channel 25g to check the other zone to determine if that zone has also finished its diagnostics. The first zone to complete diagnostics designates itself as a master zone by setting a master flag in the crosslink communication unit 65. The second zone to complete diagnostics designates itself as a slave zone by setting a slave flag in the crosslink communication unit 65. If both zones should happen to complete diagnostics at the same time, one zone, which is initially designated as the "A" zone would always default to be the master zone.

After the master zone and the slave zone have been determined, the diagnostic results of each zone are compared to detect any inequalities. One of the items which diagnostics checks for consistency is the system identification number which was copied out of NVRAM 20/20' and written to memory unit 50/50'. If there is an inequality with the results of one zone, there may be a fault in one of the dual-zone systems. The zone without the fault commences operation, while the faulty zone is removed from the system. The faulty zone is repaired or replaced. After two functional zones are provided into the dual zone system, the new or repaired zone is synchronized with the operating zone to restore complete fault tolerance to the entire system.

Figure 5A:
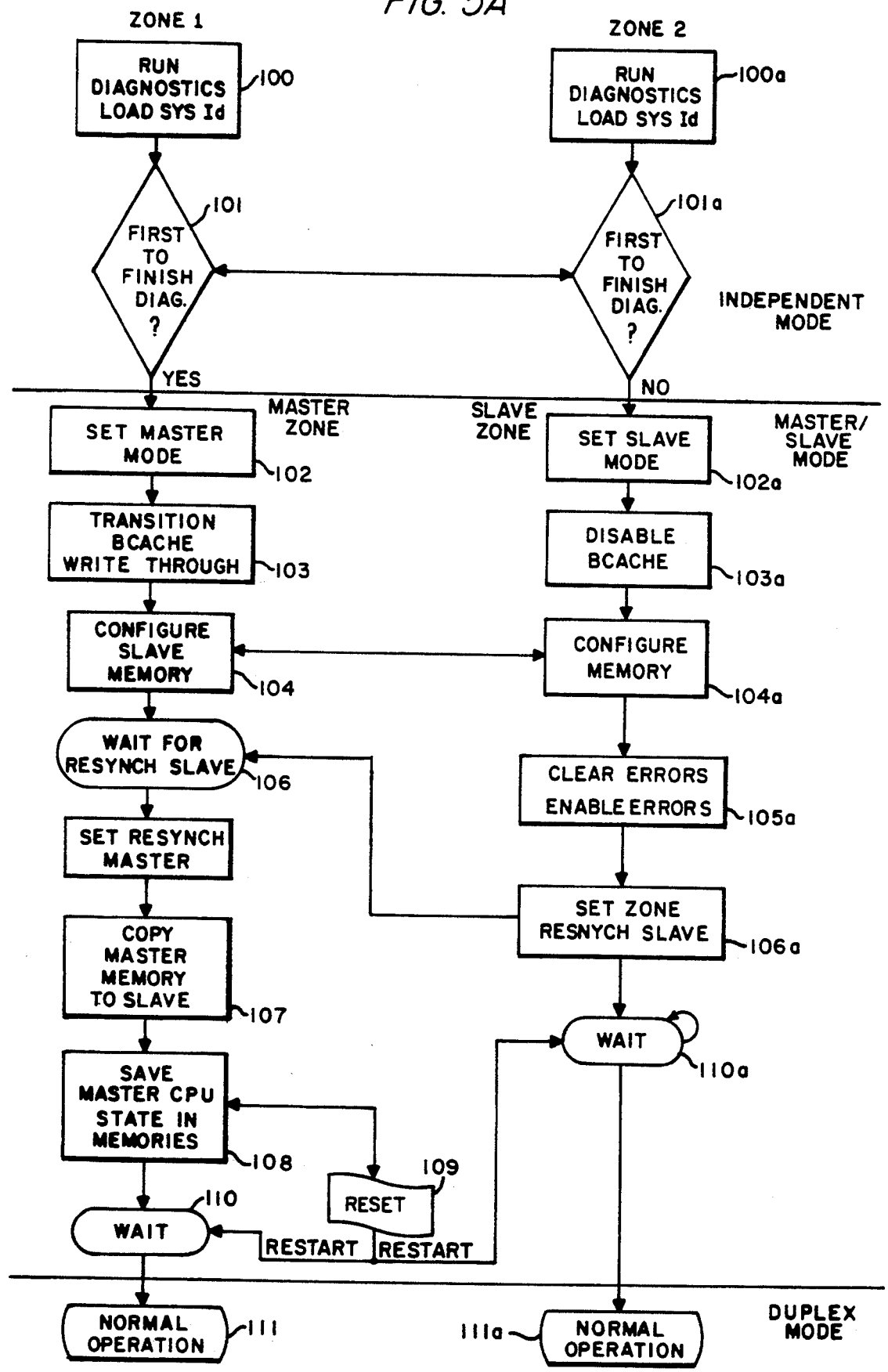
FIG. 5A and 5B are flow charts useful in understanding the technique for maintaining system identity as discussed in conjunction with FIG. 4.

Referring now to FIG. 5A, if there are no inequalities between the diagnostic results, at steps 101/101a and 102/102a each zone determines whether it is the master zone or the slave zone. Initialization of the dual-zone system 10 begins by the two zones, communicating over serial bus 25e (FIG. 1B) to agree to establish re-synchronization mode. First, the clocks are brought into synchronization by locking the slave clock to the master clock. This process is described in more detail later in the specification. Once the clocks in the two zones are brought into lock step, the two zones are operating synchronously.

During the initial phases of re-synchronization, the slave zone disables its cache 46 (FIG. 3a) at step 103a, and at step 104a configures its main memory according to data received from the master zone over bus 25g (FIG. 1B). At step 105a, all of the error registers are cleared, and error reporting is enabled. At that point, at step 106a, the slave zone sets itself as the 'resynch slave' and proceeds to step 110a wherein the slave zone executes a code loop which precludes the CPU/Memory Unit 42 of the slave zone 12' from accessing its memory 50 or its coupled I/O Unit 25. The memory 50 in the slave zone is here dedicated to write operations directed from the master zone.

During the initial phase of resynchronization, at step 103 the master zone transitions the cache 46 (FIG. 3a) to write-through mode. In write-through mode, each time data is written to the cache, the data is also written to main memory. As mentioned previously, in step 104 the master zone then configures the slave zone memory structure to be consistent with its own memory structure using bus 25g. At step 106 the master zone checks to see whether the slave zone is functioning as 'resynch slave'. When the master zone detects 'resynch slave' from the slave zone, at step 106b the master zone sets itself to be the 'resynch master'. At step 107, once both zones have entered either 'resynch master' or 'resynch slave', the entire contents of main memory 50 of the master zone are copied to main memory 50 of the slave zone. This is accomplished by performing memory writes which are transferred to the other zone via the re-synchronization bus 15e.

After all of memory has been copied, at step 108, a RESTART PC is loaded, and the CPU state from the master zone is placed into memory in both the slave zone and the master zone. At step 109, the master zone then initiates a reset of the dual-zone system, and at step 110 enters a wait state.

During the reset process, the contents of the caches 46 are invalidated, and the caches are enabled. The CPU state is restored, and in step 111/111a the dual zone system is ready for operation. At this point, both zones 12/12' are operating on an identical instruction stream simultaneously.

During operation, the two zones are checked to ensure that they continue identical operation, or remain in 'lock step'. The loss of lock step is detected in one of two ways. First, the clocks can lose phase lock. This is detected by hardware in the crosslink communication devices 65/65' (FIG. 2b) and handled as a system error by software. Second, because every time a dual-zone system performs an operation which accesses an I/O device, checks are performed by hardware to make sure both zones are doing the same I/O access. However, if they are not both performing the same access, lock step is lost. This condition is detected by one of the cross-link communications device 65 or 65', as soon as one zone attempts to perform an I/O operation. This is reported as a system error, and one of the zones will be removed from the system configuration. In this instance, because it is unsure exactly which zone is in error, the zone which is initially designated as zone "A" continues to operate, while the other zone is removed from the dual-zone system. A zone may also be removed from a system in the event of a double bit error in the memory 50 (FIG. 2a), or a miscompare of data along the primary and phantom rail within a zone.

Figure 5B:
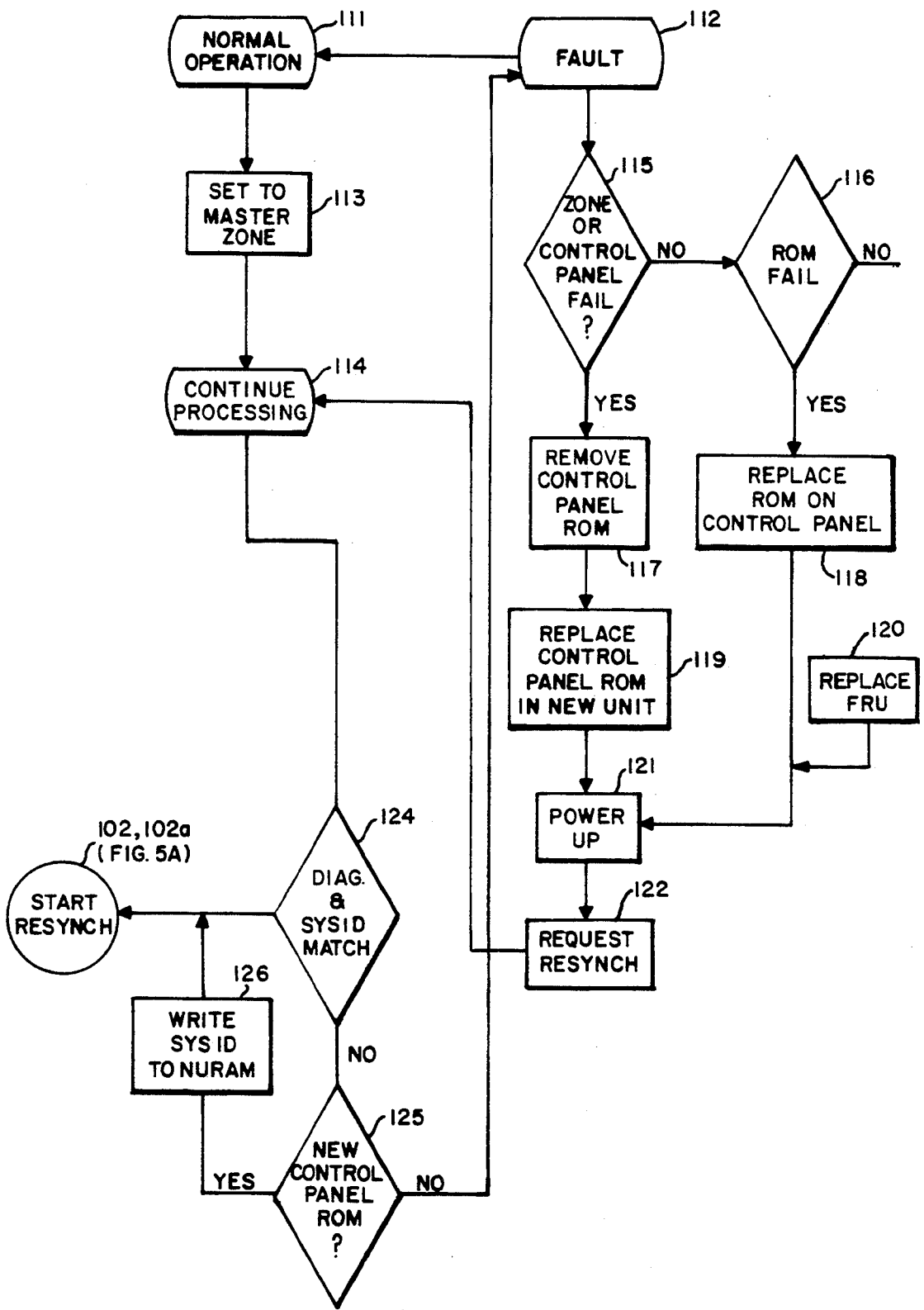

Referring now to FIG. 5B, at step 112 the faulting zone detects a fault and signals the 'surviving' zone of its fault condition. At steps 113 and 114, when one zone detects a fault, the remaining zone designates itself as a master zone, and continues operation on the instruction stream independently. The type of failure which caused the fault is determined through examination of the faulty zone.

At step 115 of FIG. 5B, if the entire zone or the control panel needs replacement in a dual-processing system, at step 117 the NVRAM 20 (FIG. 1B) is removed from its socketted position on control panel 19. Advantageously, replacement zones are not equipped with NVRAMs on the control panel, and therefore, at step 119 the NVRAM 20 used in the previous zone is simply placed in the socket position of the new zone. When a zone with the new zone or control panel is replaced in the dual-zone system, it powers up at step 121 by performing its diagnostics, reading the system identification number out of the NVRAM 20 on control panel 19, initializing its I/O device addresses, and designating itself as a slave device.

In the event that there was a Field Replaceable Unit (FRU) (such as a CPU/Memory unit 15) error, at step 120 only the FRU is replaced and the zone may be re-inserted in the dual-zone system. Because the control panel 19 of the dual-zone system is not effected during the swap out of the CPU/Memory unit, the technique of assigning the system identification number to the zones is the same as performed during booting. The power-up of the new zone then proceeds as discussed above.

If, at step 116 it is determined that there is a fault with the socketed NVRAM 20 on the control panel 19, a slightly different process is used to bring the second zone back into the system. Only the NVRAMs which were originally placed on the control panel include system identification addresses. If, at step 118 a new NVRAM is placed in the control panel, its contents will be blank. Thus, after the zone finishes the power up sequence described above, the system identification number will be 0000.

Once the faulty zone has been repaired and finished powering up in step 121, at step 122 the repaired zone request resynchronization from the 'surviving' zone. The request for resynchronization is made over bus 25g.

Before the master zone allows the slave zone to re-synchronize, at step 124 it checks the diagnostic results and the SYSID of the slave zone for accuracy. If the diagnostic results and the SYSID do match, at step 102/102a the master zone allows re-synchronization to begin as discussed with reference to FIG. 5A.

If the diagnostic results do not match, the master zone does not allow the zone to re-synchronize, and returns the slave zone to FAULT state at step 112. If the SYSID does not match, at step 125 the master zone checks to see if the SYSID is 0000, indicating that a new NVRAM has been mounted on the control panel 19. If the SYSID is not 0000, then a fault has occurred during the power up sequence in the slave zone, and rather than allow the slave zone to re-synchronize, at step 112 the master zone returns the slave zone to a FAULT state.

If the SYSID is 0000, at step 126 the master zone writes the NVRAM on the control panel in the slave zone with the SYSID from the NVRAM on the master control panel, then at step 102,102a, the master zone starts the re-synchronization process discussed with reference to FIG. 5A.

Thus, the system identification number is maintained within a dual-zone system regardless of the attached FRU's. A process for replacing the NVRAM including the system identification number precludes the introduction of more than one dual-zone system having the same system identification number.

Figure 6A:
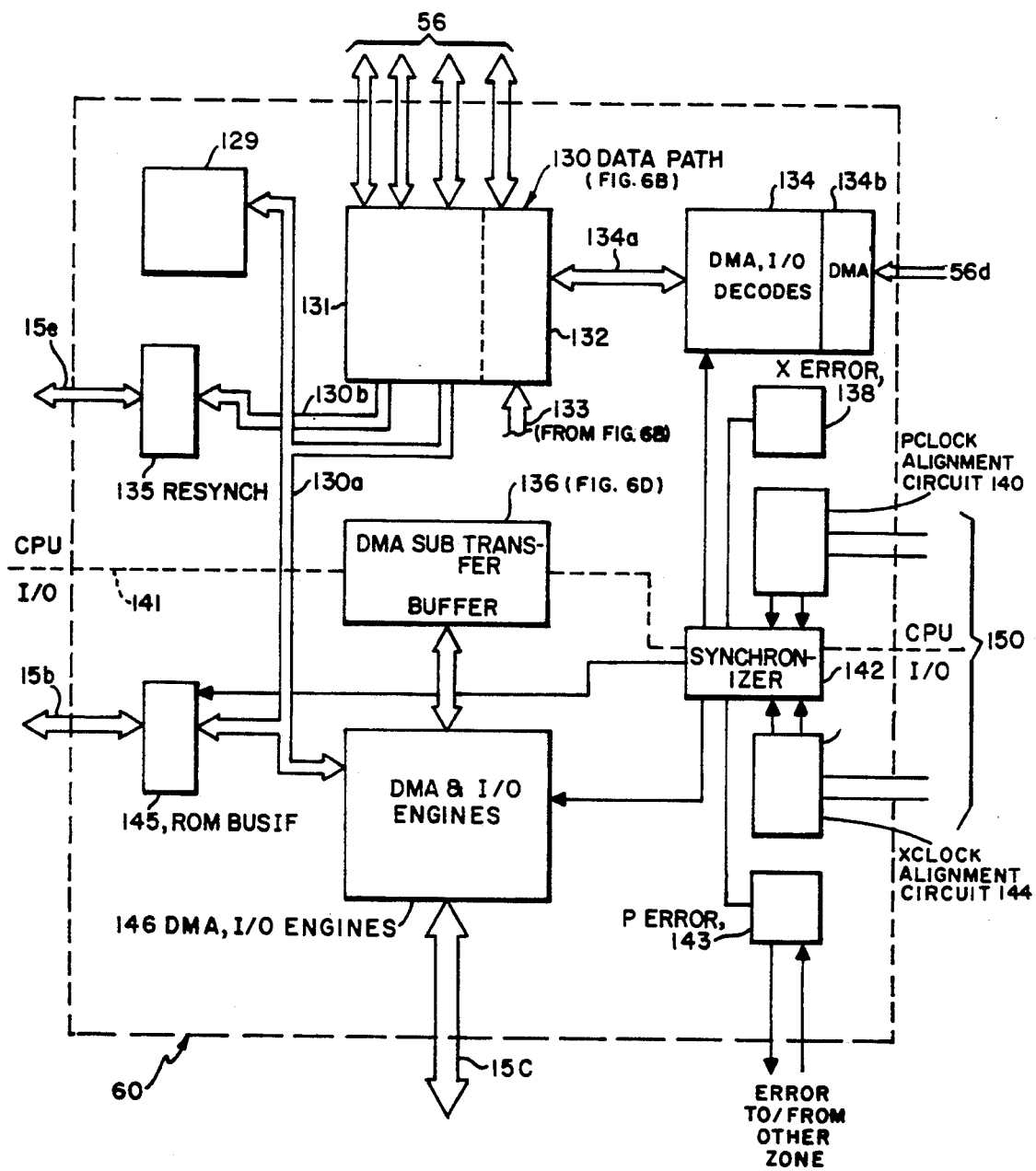
FIG. 6A is a block diagram of a bus interface and control circuit used in the computer system of FIG. 2A.

Referring now to FIG. 6A, the Bus interface and control circuit 60 is shown to include a resynchronization control interface 135 which is coupled to a dedicated resynchronization Bus 15e and is used to permit one of said zones 12/12' of the fault tolerant computer system 10 which has lost lock step or for which a fault was detected to be resynchronized with the other one of said zones. The resynchronization interface 135 produces output signals to a data path circuit 130 to permit data along resynchronization Bus 15e to be fed through the data path circuits 130 into the primary and secondary rails of the respective zone 12/12' which is being resynchronized.

The Bus interface and control circuit 60 further includes a data path circuit 130 which interfaces the circuit 60 to the internal interface Bus 56 and thus which is fed by the address, data, ECC bits, and control signals from Bus 56. Correspondingly, the ECC bits from Bus 56' are fed along ECC Bus lines 56b' to circuit 60 and the corresponding ECC bits from Bus 56 are fed to the corresponding Bus interface and control circuits 60' in the phantom rail 41'. The ECC bits from each rail are compared in the Bus interface and control circuits 60/60' to ensure that CPUs 42 and 42' (FIG. 1) are operating in lock step.

The Bus interface and control circuit 60 further includes a DMA/I/O decoder circuit 134 which is fed address signals via bus 56a to decode the circuit address. The DMA and I/O interface decoder provide control signals to the data path 60 to select the route of data through the data path to the remaining portions of the Bus interface and control circuit 60. One of the paths through the Bus interface and control circuits 60 is via a Bus 130a which couples address, data, and control information as necessary to a DMA input/output interface circuit 146. The DMA control is provided by a DMA control circuit 134b which is fed signals from control bus 56d. The DMA control circuit 134b is a synchronous state controller, the details of which will be described below. Also included in DMA control circuit 134b is the I/O controller which controls input-/output operations between the I/O interface and control circuit 60 and the I/O bus 15c. The DMA input-/output interface circuit 146 provides a DMA transfer between the main memory 50 (FIG. 1) and the Bus interface and control circuit 60. The data path circuit 130 also provides Bus connections to a register stack 129, a resynchronization interface 135 which is coupled to a dedicated resynchronization Bus 15e permitting one of the aforementioned computer zones 12/12' of system 20 which had lost lock step operation with the other one of said zones through either a fault or replacement to be resynchronized with the properly operating one of said zones 12/12'. The data path 130 further provides Bus 130a to a ROM interface 145 which is coupled to a dedicated ROM Bus 15b.

The Bus interface and control circuit 60 further includes X clock error circuit 138 which is used to determine system response/action when errors are detected. The X clock error circuit is used to handle all error conditions that can be handled under X clock (CPU clock) side of the system. For those errors which need immediate attention and which arise under the P clock side (I/O side) of the system, a P clock error circuit 148 is provided. For example, a X clock error could be an attempt to access a non-existent I/O address, whereas a P clock error condition would be an error related to inter-rail checking operations being performed. Exact routines would be provided to accomplish these tasks as would be apparent to one of ordinary skill in the art.

The P error circuit 143 is provided for preprocessing error reports on the P side of the system.

The protocol synchronization circuit 142 is used to transfer in a synchronous manner signals between P clock and X clock boundaries.

Figure 10:
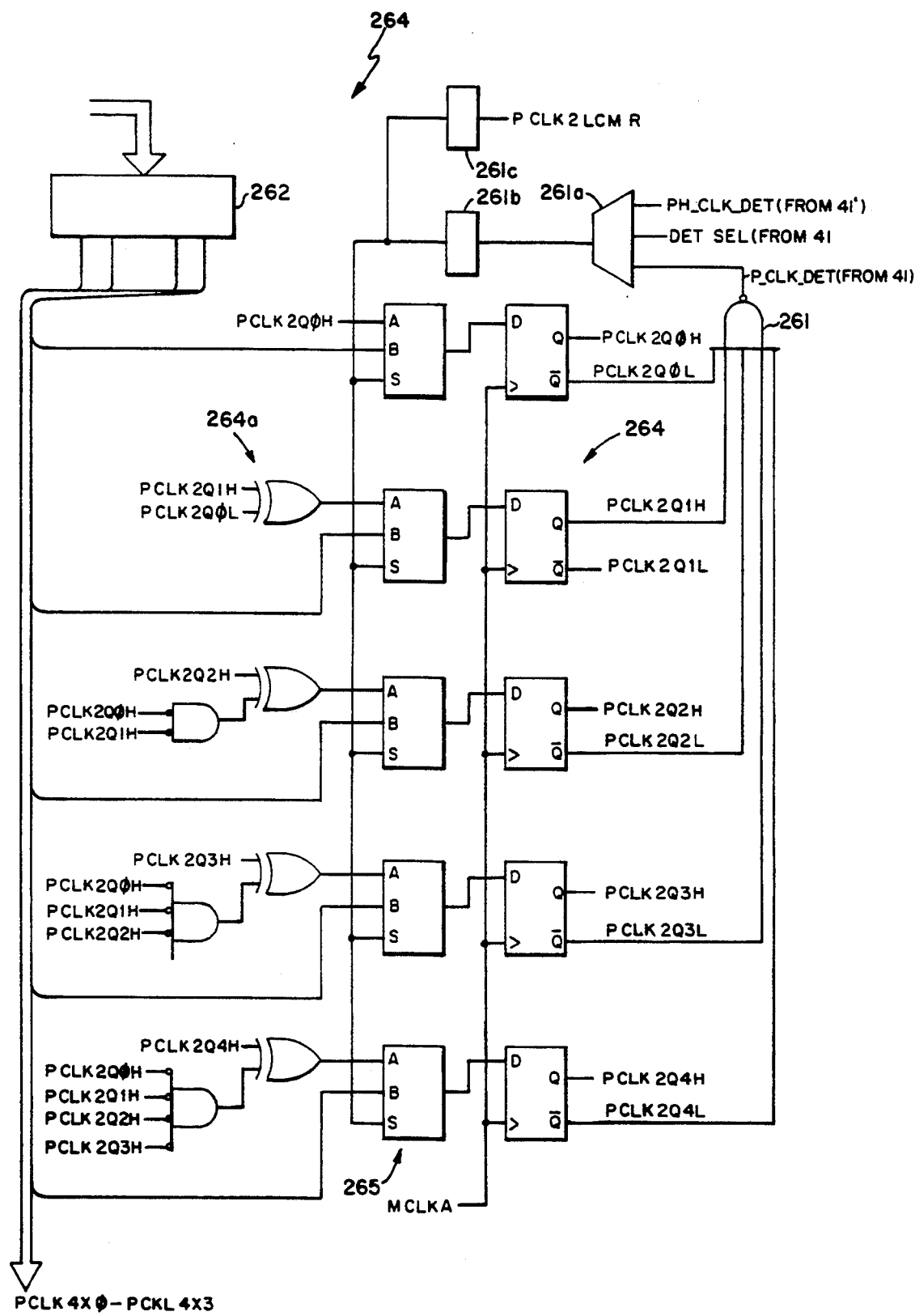
FIG. 10 is a logic diagram of a frequency divider circuit used in the clock interface circuit of FIG. 9.

In addition, the Bus interface and control circuit 60 further includes a P clock and X clock alignment circuit 140,144 which is part of the clock interface circuit 92 (FIG. 2A) as will be further described in conjunction with FIG. 10. Circuits 140, 144 generate a plurality of phases for each of the respective clock signals and provides status type signals to corresponding circuits in the other rail to insure that each rail in each zone uses the same respective clock phase. Suffice it here to say that the Bus interface and control circuit 60 in addition to providing the aforementioned functions also provides a circuit to interface a clock which would operate an I/O type of device to a clock which operates the CPUs 42, 42' in the respective primary rail 41 and phantom rail 41' computers.

Figure 6B:
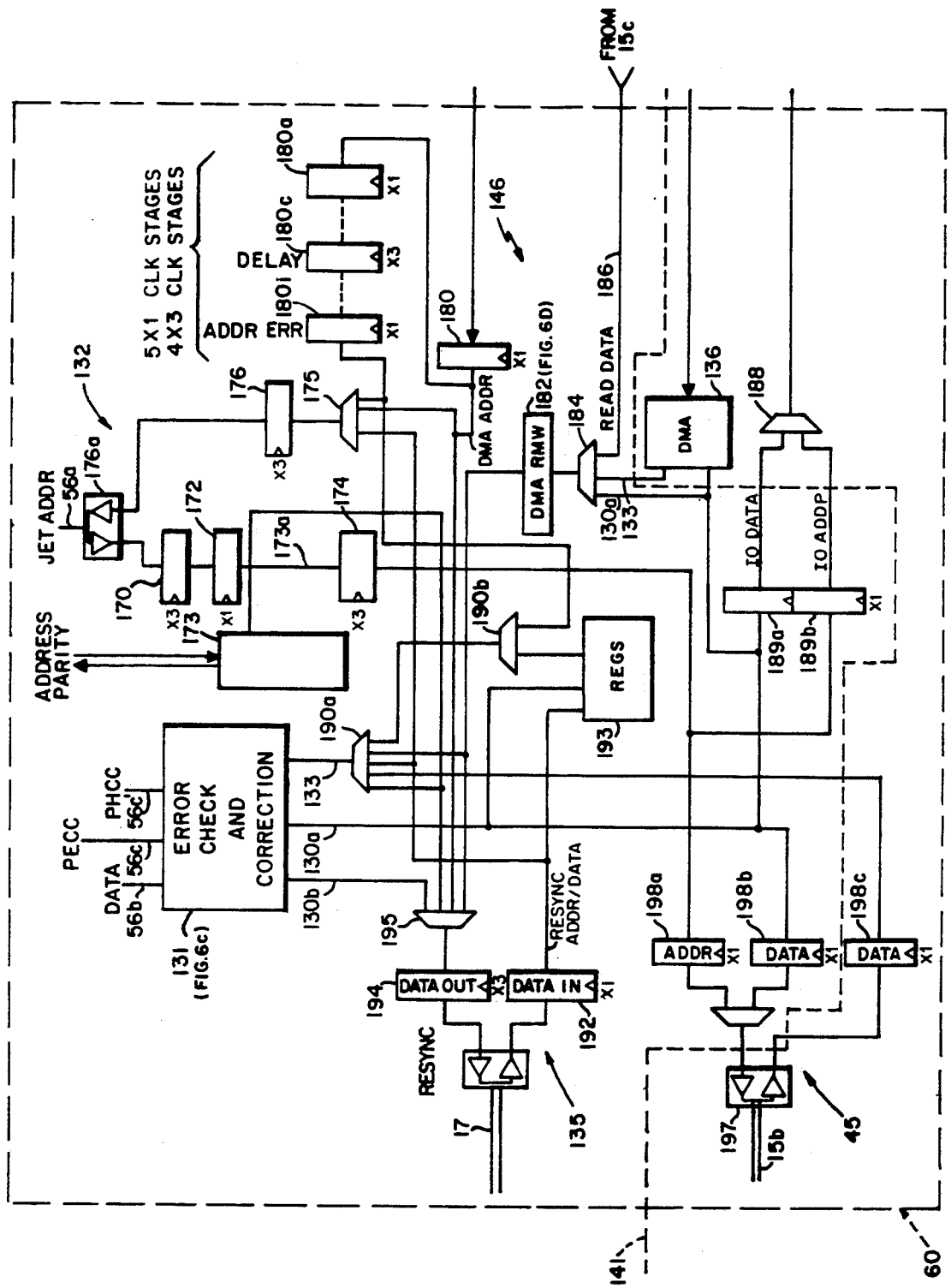
FIG. 6B is a simplified block diagram showing the data flow path for the Bus interface and control circuit for FIG. 6A as well as a portion of a direct memory access controller interface in the circuit of FIG. 6A.

Referring now to FIG. 6B, the Bus interface and control circuit 60 is shown to include a DMA/ I/O interface circuit 146 which in conjunction with the DMA control circuit 134b (FIG. 6A), controls DMA transfers in primary rails of the two zones A, B.

Data flow through the DMA/I/O interface circuit 146 is as follows: a DMA subtransfer buffer circuit 136 is used to store data during a direct memory access transfer between I/O and main memory as will be further described in conjunction with FIG. 6C. From the DMA subtransfer buffer 136, data from I/O data bus 15c on line 186 or data from data path 130 via bus 130a will be selectively coupled through a MUX 184 to a DMA read modify write buffer 182 as will be further described with conjunction FIG. 6C. The output of the DMA read modify write buffer 182 is fed to the input of a multiplexer 190a to feed output data to error check and correction circuit 131 as will be described in conjunction with FIG. 6C.

The DMA/I/O interface circuit 146 includes a DMA address register 180 which is loaded from a register (not shown) which is coupled to bus 56. The DMA interface further includes an address pipeline stage comprised of nine registers 180a–180i, five clock stages or registers operating at an X1 clock phase and four X3 clock stages or registers each disposed intermediate pairs of the X1 clock phase register operating at an X3 clock phase. The output of the last one of the registers 180i in the stage 180 is coupled to the input of a MUX 175 which feeds an address out to register 176 and to the Bus 56 via a Bus interface buffer 176a or alternatively feeds the address through MUX 190b and 190a through the error check and correction circuit as data which signifies the address of a word which was detected as being incorrect during a DMA read of the memory as will be described below.

The address interface 132 further includes registers 170 and 172 operating on respectively X3 clock and X1 clock and a parity generator circuit 173, as will be described with conjunction 6E, which is used to check parity of data on the address Buses 56a/56a'. Each of the primary and phantom rails supplies a parity bit representative of the parity of the I/O address to the parity generator circuit 173 or 173' in the other rail. The output signal from the parity generator circuit 173 is provided to the parity generator circuit in the other rail to ascertaining whether the parity bits are equal, and thus whether the address lines 56a/56a' have the same information.

Disposed at the output of parity generator/check circuit 173 is a register 174, which stores the generated parity of the I/O address. The output of register 174 is coupled to an address register 198a and an I/O address register in the I/O interface 189b.

The DMA I/O interface circuit 146 is provided data from either bus 15c or bus 56 to fill DMA subtransfer buffer 136. The buffer is filled with data based on either the P clock (I/O clock) or the X clock (CPU clock). Since the DMA interface can write to main memory on byte boundaries, that is it uses long words as the smallest address entity, but the memory controller 152 uses longwords as the smallest addressable location, the Bus interface and control circuit 60 provides a read modify write cycle with an appropriate byte mask to permit individual bytes to be modified in memory.

During a DMA write operation, the read modify write register 182 receives the modified long word when a byte mask with zeroes is provided to the DMA control circuit 134b. The byte mask register with any zeros will cause a pause in a write action of main memory and performs a read of memory at the current address location in the address register 180i. When the data is returned to the Bus 56b, the data is written into the read modify write register (182) with the byte mask bits inverted. The DMA write transfer is then resumed and the write is completed to main memory.

When the DMA/I/O interface circuit 146 has completed loading the subtransfer buffer 136 with data it will assert signal DMA WRITE to the DMA control circuit 134b. The DMA/I/O interface circuit 146 also asserts the address of the first long word in the address register 180. The DMA control circuit 134b will move the address up through the pipe delay network (register 180a-180i) and assert the address on the address Bus 56a to interface circuit 54. It will also assert the longword offset in a hexword on the data Bus 56b to each of the interface circuits 54b-54e. The signal LOAD DMA ADDRESS is asserted to the circuit 54a and signal RAM RESET is asserted to the circuits 54b-54e for one clock cycle to initialize pointers (not shown) in the circuits 54b-54e. Data will move through data path 133 out of the DMA buffer 136 a long word at a time and flow through the read modify write buffer 182. The read modify write buffer 182 acts as a pipeline delay stage. From the read modify write buffer 182, the data is moved up through MUX 190a into the error check and correction circuit 131 (FIG. 6C). If the longword has a byte mask that indicates that only some of the bytes of the longword are valid then data transfers out of the subtransfer buffer are halted. The pipeline above the read modify write buffer 182 is emptied and the contents thereof are written to main memory and a read modify write operation is performed as described above. Otherwise if the long word is complete the DMA control circuit 134b continues moving longwords up through the MUX 190a and circuit 131 and out onto the Bus 56. One clock cycle before asserting the first long word on the Bus 56, the DMA control circuit 134b will assert a signal RAM WRITE. RAM WRITE will remain asserted until the complete data transfer from the subtransfer buffer 136 has been written into circuits 54b-54e. RAM WRITE is de-asserted one clock cycle before the last longword is inserted on the data Bus 54b. One cycle before the main memory hexword boundary is reached, the control logic will assert DMA REQUEST to the main sequencer PALs 52. Within three to six clock cycles of the signal DMA REQUEST, the main sequencer PALs 52 will write the hexword into memory or cache according to the particular address asserted on the address lines 55a. Two cycles before the data write is complete the main sequencer PALs assert DMA DATA signal to the Bus interface and control circuit 60. The DMA control circuit 134b will de-assert the DMA REQUEST line unless it has a complete hexword in a DMA buffer (not shown) in circuits 54b-54e. If it has a complete hexword it will leave DMA REQUEST asserted. One clock cycle after the DMA control circuit 134b detects DMA DATA it will assert INCREMENT READ POINTER and INCREMENT DMA ADDRESS for one clock cycle. When the last long word is removed from the subtransfer buffer 136, the DMA control circuit 134b can allow the DMA/ I/O interface circuit 146 to start another subtransfer by asserting DMA DONE.

During a DMA read from memory 50, the DMA/I/O interface 146 asserts DMA READ and places the DMA memory address in the DMA address register 180. When the DMA control circuit 134b detects DMA READ it will move the address up through the rail time delay pipe 180a-180i and insert the address on the address Bus 56a. The DMA control circuit 134b will then also insert the long word offset in a hexword on the Data Bus 55b to interface circuits 54b-54e. While the address and long word offset are asserted, the DMA control circuit 134b will assert LOAD DMA ADDRESS to the interface circuit 54a and signal RAM RESET through the data interface circuits 54b-54e each signal for one clock cycle. Immediately, after de-asserting LOAD DA ADDRESS and RAM RESET the DMA control circuit 134b will halt the placing of data on the Bus 56. During the following clock cycle the DMA control circuit 134b will change the control select lines to indicate DMA READ to interface 54a and also a signal DMA REQUEST to the main sequencer PALs 52. In response to these signals the main sequencer PALs 52 generate a read cycle to fill buffers (not shown) in data interface circuits 54b-54e with data within the next three to six clock cycles. The main sequencer PALs 52 will then assert the DMA DATA signal, indicating that within two clock cycles the block from memory will be ready to be copied into the DMA subtransfer buffer 136 in interface and control circuits 60. One clock cycle after DMA data signal has been inserted by the main sequencer PALs 52, the DMA control circuit 134b will assert DMA WRITE for one clock cycle which will cause the data to get latched into the data interface circuits 54b-54e on the following clock cycle. The control logic will also assert INCREMENT DMA ADDRESS during this time for one clock cycle which causes the DMA address pointer in address interface circuit 54a to be incremented. After the DMA DATA signal has been asserted, the control logic 134b will assert INCREMENT READ POINTER and remove the first longword off the Bus 56b. As long as INCREMENT READ POINTER remains asserted, data will be placed on the Bus 56b in sequential order from data circuits 54b-54e. As each longword of data is removed from bus 56b, the DMA address pointer is incremented, and the incremented value is stored in the DMA address register 180, then flowing through the DMA address pipeline 180a-180i.

As data is loaded into the sub-transfer buffer 136 of the interface and control circuit 60, error correction will be performed on each longword passing through circuit 131. The error correcting check will take one clock cycle. The DMA control logic 134b will place each long word into the sub-transfer buffer 136. The control logic 134b will always request at least thirty three longwords of data even if the actual DMA sub-transfer is less than thirty three longwords. When the DMA subtransfer buffer is full, the DMA control circuit 134b will assert DMA DONE to the DMA interface 146. When the DMA/I/O interface 146 detects DMA DONE it can begin taking data out of the buffer a long word at a time. If more subtransfers are required, the DMA interface 146 will again assert READ and continue to do so until all DMA sub-transfers have been completed.

Figure 6C:
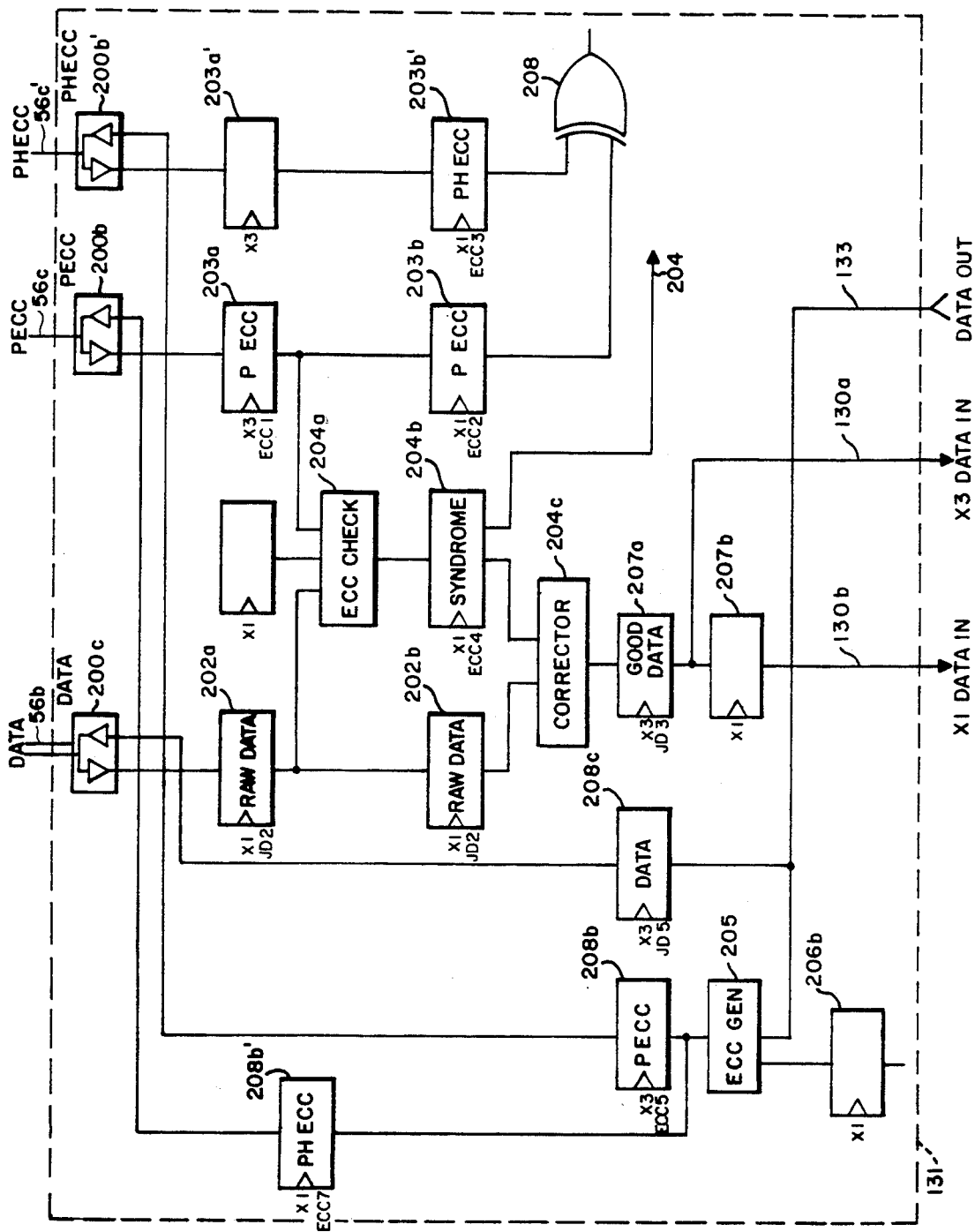
FIG. 6C is a block diagram of an error correction/detection circuit disposed in the data path of FIG. 6B.

Referring now to FIG. 6C, an error correction code check circuit 131 is disposed in the data path circuit 130 and is shown to include bidirectional buffer circuit 200b, 200b' and 200c respectively interfacing the data bus 56b and error correction code bits on Bus 56c, 56c' to the error correction circuit 131 and hence the bus interface and control circuit 60. The output from the bidirectional buffer 200c is fed to a first register 202a operating at clock phase X3. Output of register 202a is coupled to a second register 202b, operating at clock phase x1, to store subsequent portions of the data from bus 56b. The output of register 202a is also coupled to an error correction check circuit 204a. A similar arrangement is provided via register 203a and 203b for ECC bits from the primary rail 41 provided at the output of bidirectional buffers 200b. Registers 203a' and 203b' provide a similar arrangement for the error correction code check bits from the phantom rail 41' via the buffer 200b'. The output of registers 203b, 203b' are fed to a bank of "exclusive-OR" gates 208 to provide an indication of whether the primary rail and phantom rail check bits are equal and thus whether the primary rail and phantom rail are operating on the same data and thus are presumed to be in lock step or synchronized operation.

The check bits and data are fed to the error correcting code check circuit 204a and the output is an error syndrome which is stored in register 204b. The syndrome stored in register 204b is a string of data bits which indirectly identifies the location of and number of errors, if any, in data fed to a circuit 204a. If the syndrome is equal to zero (i.e. if the string of bits here are all zero) this indicates that no error occurred in the data. If the string of bits is not equal to zero than one or more errors occurred in the data. Here error code checking and error code generation is provided as mentioned above in conjunction with Tables 1-3. The syndrome is used as an address for a look up table which ascertains which bit or bits of the data stored in register 202a are in error. Here the code used is capable of correcting one bit in error. If the syndrome can be decoded from the look up table, then the data is capable of being corrected and is fed to a corrector circuit 204c. However, if two or more errors are detected then the error can not be corrected and a signal is provided on line 204 from corrector 204c to Xerror circuit (138 FIG. 6A) to indicate to the CPU 42 that a multi bit error occurred. As a result, the CPU takes an appropriate action such as removing itself from processing.

Thus, if the syndrome used as an address to the look up table (not shown) produces a decoded value which can be used to correct the data, this syndrome is then fed to the corrector circuit 204c. In addition, the data is passed from register 202a (operating on an X3 clock) to register 202b, and is finally passed to the corrector circuit 204c. Both the syndrome and the data are used in the correcter circuit 204c to provide corrected data to register 207a. The corrected data is subsequently fed to register 207b. Thus, the output from register 207b is provided on bus 130b and the output from register 207a is provided on bus 130a to the remaining portions of the interface and control circuit 60 as shown.

Similarly, data on bus 133 is provided into a data buffer 208c to be fed to an output buffer of transceivers 200c and is also provided to ECC generation circuit 205 to produce error correcting codes in accordance with the data. The codes are fed to register 208b to provide error correcting codes to the primary rail 41, via buffers 200b and the codes are also fed to register 208b' to provide codes for the phantom rail 41' via buffer 200b'. These codes are fed out along the primary ECC and phantom ECC Bus 56c/56c' as shown.

As mentioned above, one of the problems common in fault tolerant computer systems and computers in general is the occurrence of single bit errors in main memory. These errors occur on a frequent basis due to random events such as alpha particle disruptions of memory cells. These errors are called soft errors, since there is no electrical failure of the cell. The error needs to be removed or scrubbed to prevent the accumulation of multiple single bit errors in a single addressable location. In the event of multiple bit errors in a single addressable location, the fault tolerant computer or a computer system in general enters a software fault routine to either correct an error or to indicate that the replacement of the unit is necessary.

In either event, this causes a portion of the fault tolerant computer to loose "lock step" with the remaining portions of the fault tolerant computer thereby reducing or eliminating the fault tolerance of the system.

Accordingly, the error correction code hardware 131 described above is used to detect the presence of a single bit error in data fed in the data path 130 during the DMA operation without losing lock step operation. As mentioned above during a read of main memory if an error is detected in syndrome circuit 204b a signal is asserted on line 204 which is fed to the Xerror circuit 138, freeze register 180i and to 134b. I/O interface and control circuit 60 (FIG. 6B) as mentioned above is used to control transfers of data between Bus 56 and Bus 15c/15d. In the event that data read from memory contained a single bit error a single bit error signal is asserted on line 204 to Xerror circuit 138 and the corresponding address of data which maintained in register pipeline 180a-180i is saved by using a signal from Xerror 138 to freeze the address in register 180i. That is, circuit 138 sends the signal to freeze the address in 180i and indicates to the DMA control circuit 134b that an error occurred. The DMA control circuit 134b sends this signal to the corresponding Xerror circuit 138' in the other zone.

A time delay is associated with the transmission of the single bit error signal to the Xerror circuit 138' of the other zone. While the single bit error is being transmitted to the other zone, the zone has continued to process instructions, and as such, the memory address at which there is a single bit error has propagated through the register pipeline 180a-180i. The number of stages in the register pipeline is correlated to the number of cycles required for the single bit error signal to propagate between zones, and when the Xerror circuit 138' receives the single bit error signal, it freezes the address pipeline, thus saving the faulting address in register 180i.

Although the other zone may not have a single bit error at the same memory location, the zones operate in lock-step to correct the single bit error as described below.

If an error is detected during a DMA subtransfer, the address of the location of memory in which the error was detected is saved in the address pipeline registers 180a–180i as described above. After completion of the subtransfer, the saved address in register 180i is used by the DMA control circuit 134b to initiate a read modify write operation via mux 175 and register 176. It is noted that the other zone is performing an identical read modify write operation although it may not have had a memory error.

The DMA controller 134b performs the read modify write operation at the address location with the error as follows. Data from memory is fed through the error correcting code circuit 131 and corrected. The DMA control circuit 134b causes the MUX 184 to select path 130a to be stored in the DMA read modify write register 182. A single longword DMA is then initiated by DMA control circuit 134b to write the corrected data back to the main memory address as specified in register 180i. Thus, the corrected data is written back to main memory at the memory location which previously had the single bit error.

Although the present scheme saves the address of one error, it may be possible that two or more single bit errors occur at two or more locations during the DMA transfer. An alternative arrangement therefore would be to provide a buffer to store the addresses of all errors that occurred during the transfer or alternatively to provide a DMA operation to read, correct, and rewrite the entire buffer into main memory upon detection of an error. As an alternative arrangement, the DMA control circuit 134b could also be programmed as a background software task to read main memory, correcting as needed, and writing back to main memory as necessary for all of main memory and in particular, those portions of main memory which are infrequently accessed.

Figure 6D:
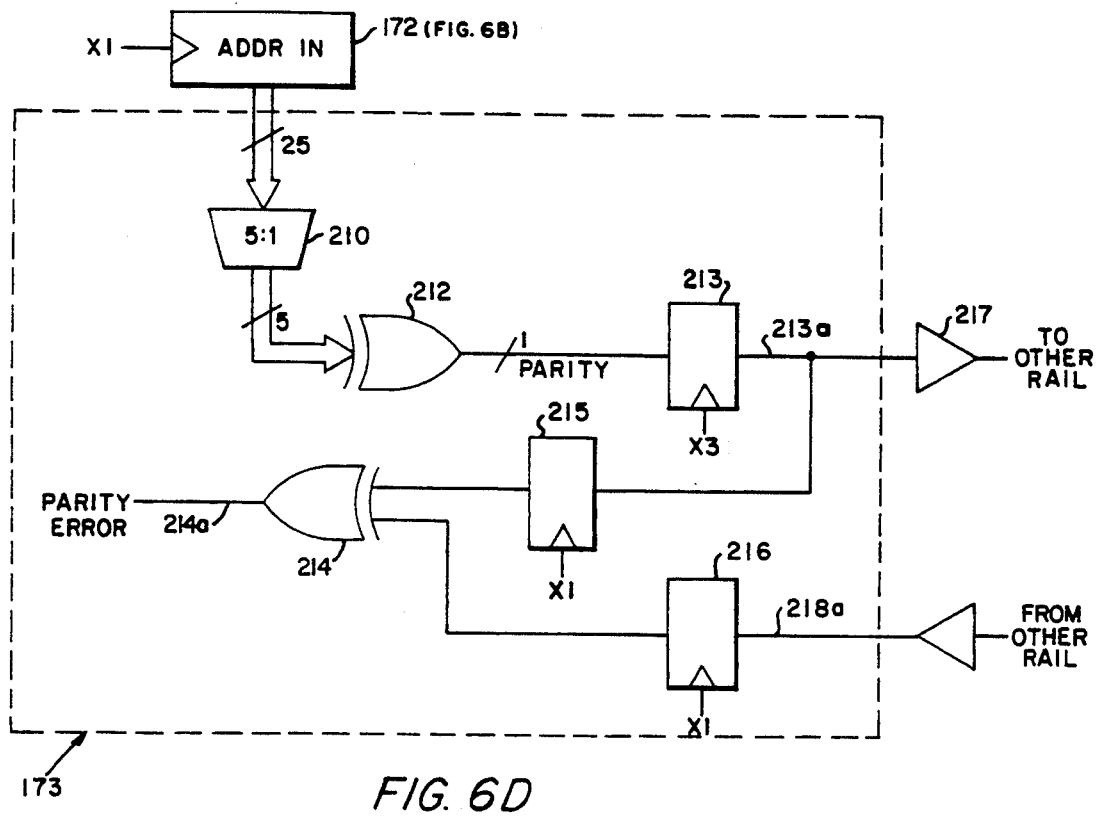
FIG. 6D is a block diagram of a parity checker used in the data path circuit of FIG. 6B.

Referring now to FIG. 6D, the parity checker circuit 173 is shown to include a multiplexer bank 210 fed via address data from address register 172 (FIG. 6) and providing output data in response to select signals on line 211 provided from DMA Control circuit 134b. The address bits are sequentially multiplexed five at a time to an exclusive OR bank here represented by exclusive OR gate 212 to generate an even or odd parity signal at the output thereof. The parity signal is stored in state device 213 and presented to the output thereof via line 213a and to a driver 217 to be fed to the other rail in the respective zone 12/12'. Correspondingly, the output of the state device 213 is fed to a second state device 215 operating at here a X1 clock phase of the clock signals to be fed to an exclusive OR gate 214. Similarly, from the other rail is provided a signal via buffer 218 on line 218a to state device 216, operating at the X1 clock phase, the output of which is also fed to exclusive OR gate 214. The result of the exclusive OR of the signals is provided at the output 214a thereof as a parity error indication if the parity generated by each of the rails is different thus providing a logic one level at the output thereof. If the parity signals are the same, a logic 0 is provided at the output of gate 214, and thus no parity error has been detected. This parity error is fed to the X clock error circuit 138 (FIG. 6A).

Referring back to FIG. 6A, the interface and control circuit 60 is shown having a clock boundary denoted as a dotted line 141 separating portions of the bus interface and control circuit 60 between logic operating at the CPU clock frequency domain (Xclock) and the logic operating at an input/output (I/O) clock frequency domain (Pclock). The clock boundary occurs since in general the CPU clock frequency may be substantially different from the I/O clock frequency and moreover the CPU clock and the I/O clock are generally are not in phase synchronism. Both of the interface and control circuits 60, 60' for the primary rail 41 and phantom rail 41' respectively have a clock boundary 141, 141'. Here, the clocks are aligned to permit synchronous transfers of data between the I/O and CPU portions of the system. The clock synchronization is provided by logic 150 comprised of a protocol synchronism circuit 142 and X clock (CPU clock) and P clock (I/O clock) circuits 140 and 144 respectively.

Figure 7:
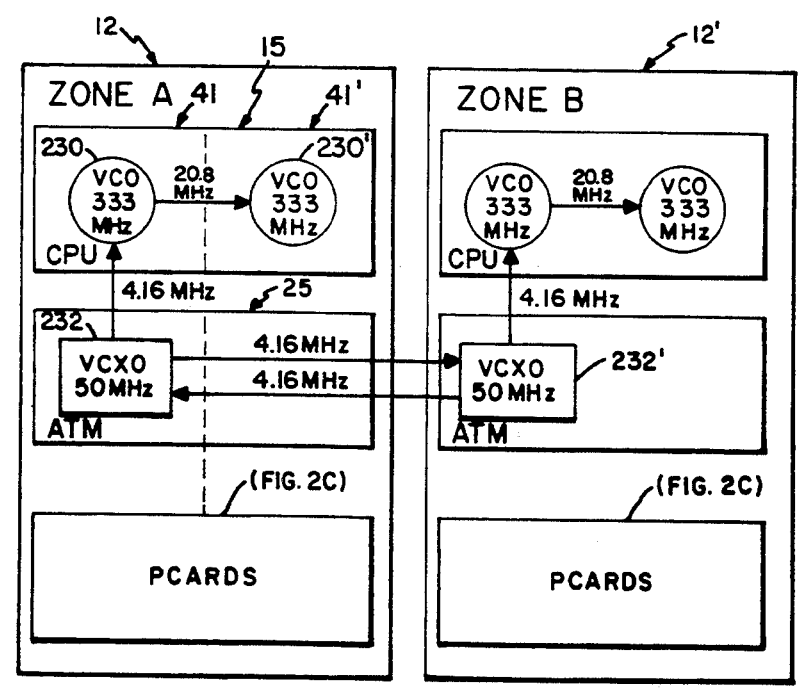
FIG. 7 is a block diagram showing clock synchronization between the pair of zones of the fault tolerant computer system of FIG. 1A.

Referring now to FIG. 7, a simplified block diagram showing the clocking relationship between the Zone A (12) and zone B (12') for the fault tolerant computer system 10 is shown. In particular, it should be noted that in fault tolerant computer system 10 checking and communication occurs between processors in zones A and B. It necessary therefore for all subsystems in each of zones A, B to operate in a synchronous manner. That is each of the central processing units and associated logic in the primary and phantom rails 41,41' of Zone A as well as corresponding primary and main rails 41,41' of Zone B should operate with clock signals which are synchronized.

However, the use of a common clock circuit to generate a clock signal for the zone A and zone B processors is undesirable. Here a fundamental requirement for the fault tolerant computer 10 is that no single point of failure in the fault tolerant computer 10 should cause the entire system to shut down. To allow a single clock generator therefore, to provide clocking signals for both zone A and zone B would run the risk that in the event failure of a clock generator, the entire computer system 10 would be nonfunctional.

To allow CPU and I/O speed to be optimized it is also necessary to operate each subsystem at a maximum rate irrespective of the rate of the other subsystem. Nevertheless, it is necessary to maintain the ability to communicate efficiently and reliably between the CPU and the I/O portions of each of the computers. Accordingly, it should be noted that each zone 12, 12' has a pair of voltage control oscillators 230/230' (for zone 12). These voltage control oscillators are phase locked by circuits (not shown) to permit the primary 41 and phantoms 41' rails in Zone A to operate in synchronism. Further details, in the operation of the clocks within a zone will be discussed in conjunction with FIG. 8. It should further be noted that the fault tolerant computer 10 further includes a voltage controlled I/O oscillator 232 here operating at 50 MHz. This voltage control crystal oscillator (VCXO) is phase locked to a voltage control crystal oscillator 232' in Zone B (zone 12').

Upon system configuration, one of the two oscillators, 232, 232' is programmed to be a clock slave while the other remains a clock master. The clock master oscillates at its center, or nominal frequency. The clock slave phase-locks to the clock master. Oscillators 232,232' are voltage controlled crystal oscillators (VCXO's), having a tuning range that is relatively narrow, of typically ±0.02%. In the event of a master oscillator failure, the slave oscillator will drift in frequency, however, it will be bounded by its relatively narrow tuning range. The resulting small change in the period of the clock signal is insufficient to cause disruption of processing.

Figure 8:
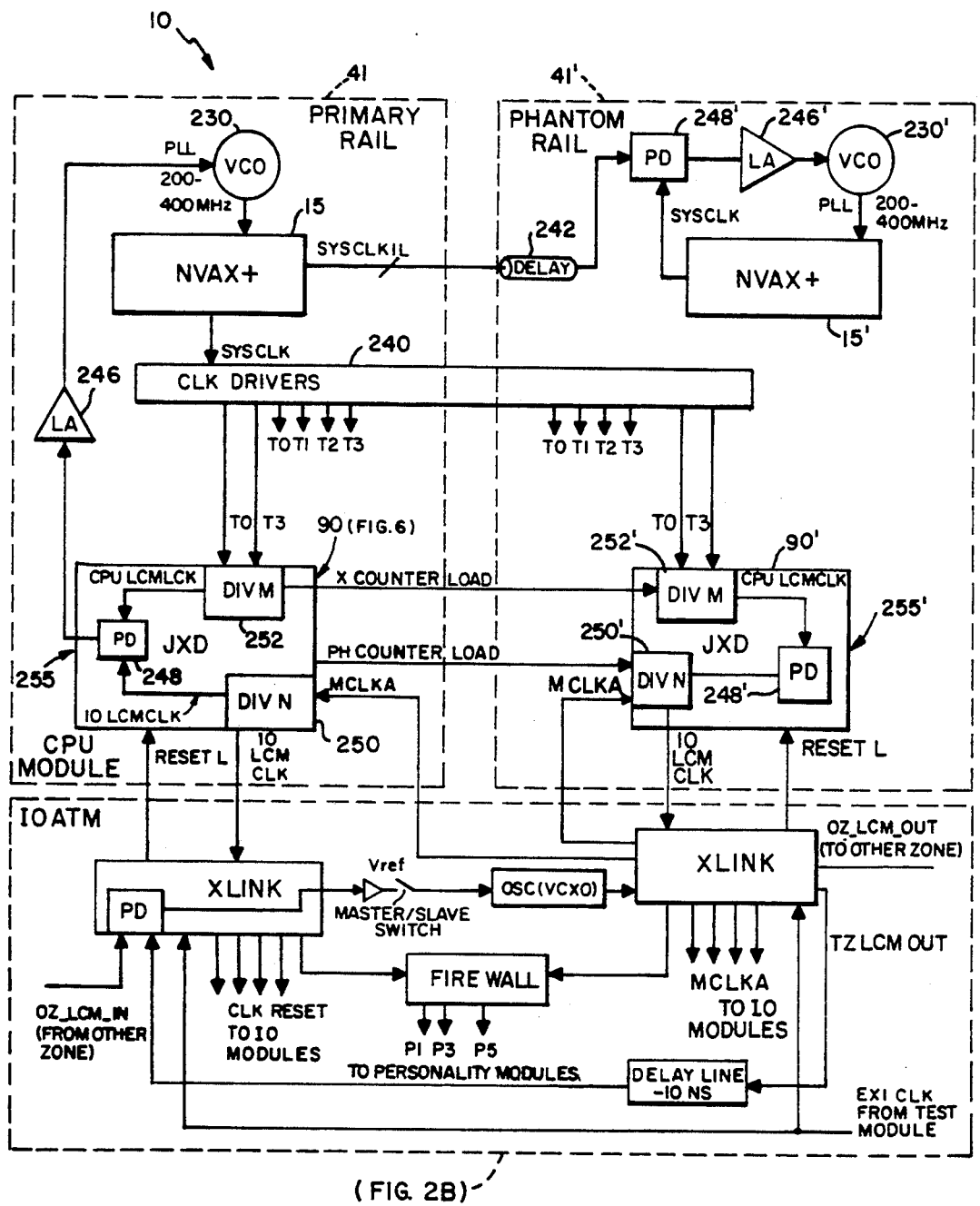
FIG. 8 is a simplified block diagram of the primary rail phantom rail computer system of FIG. 2 showing clock circuit distribution and clock alignment circuits for the computer system of FIG. 2.

Referring now to FIG. 8, a simplified block diagram of the single fail stop processor 13, generally described in conjunction with FIG. 2A is shown with certain details omitted concerning subsystems on the CPU unit and the I/O unit to permit a clearer understanding to be conveyed of the clocking throughout the system 13.

Figure 8A:
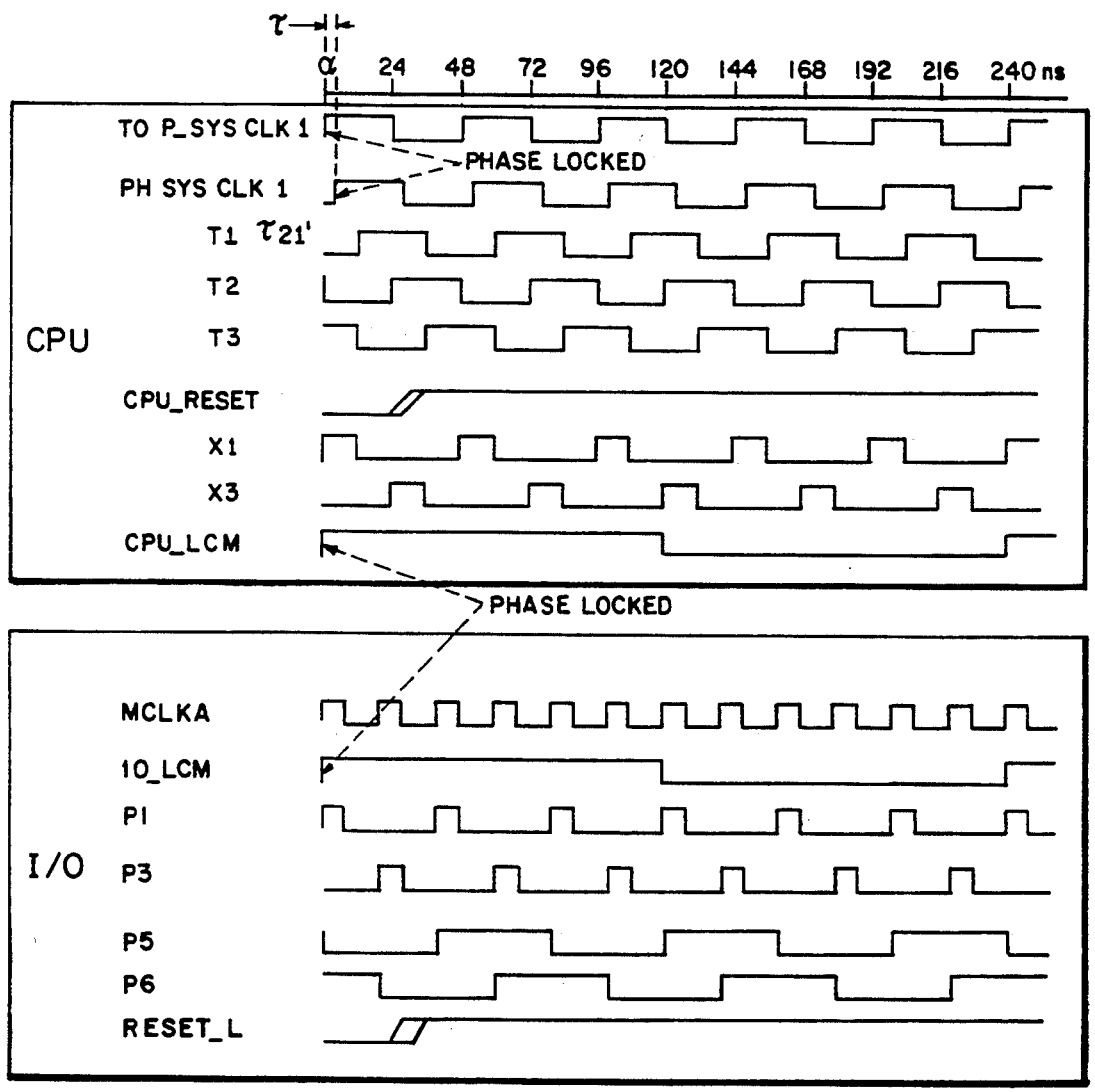
FIG. 8A is a timing diagram showing various timing relationship of signals illustrated in FIG. 8.

As described in conjunction with FIG. 2A, the single fail stop processor 13 includes a primary rail 41 and a phantom rail 41'. Referring in particular to the primary rail 41, it is shown that the primary rail 41 includes a voltage controlled oscillator 230 here a conventional voltage controlled oscillator with a tuning range of 200 MHz to 400 MHz. The voltage controlled oscillator 230 feeds an output signal in the above range to the CPU/Memory unit 15. CPU/Memory unit 15 derives a CPU system clock SYSCLK with on device clock generation circuitry (not shown) which is conventional with the NVAX+ processor (used for processor 42 on CPU/Memory unit 15). Other processors would have a correspondingly similar type of arrangement. The output from the processor 42, (i.e. SYSCLK2) is fed to a conventional clock driver circuit to produce a series of clock phases of the SYSCLK2. The clock driver circuit is typically a device such as Motorola Part number 100E111 coupled to a suitable number of 100H641. Here the clock driver circuit provides four clock phases, phases $T_0$–$T_3$. The T0 and T3 clock phases are used to provide synchronism between the various logic circuits provided in the CPU unit 21. The Xclock phases are derived via logic gating of the T0 and T3 clock phases. The Xclock phases are approximately 25% duty cycle clock phases as shown in FIG. 8A.

The clock phase signals P1 and X3 are fed to the Bus interface and control circuit 60 (FIG. 6) and are aligned therein with clock signals of an input/output clock provided from the I/O unit 25 (FIG. 2B). Here the I/O clock MCLKA is fed from the crosslink communications device 65/65' of I/O unit 25 (FIG. 2B).

Figure 14:
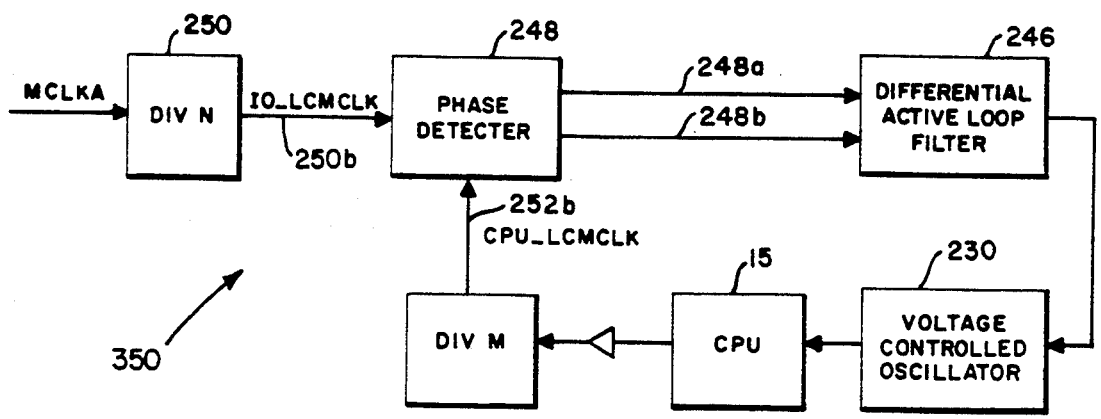
FIG. 14 is a block diagram of a phased locked loop for aligning clocks between a CPU clock and an I/O clock used in the clock interface circuit of FIG. 9.

Here a clock frequency interface circuit is provided between the CPU clock and the I/O clock as will be discussed to produce a high rate of data transfer between CPU and I/O while permitting a relatively large difference to exist in the frequencies between the CPU and I/O clocks. The interface and control circuit 60 thus includes a divide by M circuit 252 as will further be discussed in conjunction with FIG. 8 which in conjunction with a divide by N circuit 250 (FIG. 8) permits data transfers to occur in synchronism between the data operating at the CPU clock signal and data operating at the I/O clock signal without the use of clock synchronizer circuits. As should be further noted, clock signals CPU_LCMCLK from divide by M circuit and I/O clock signal I/O_LCMCLK are fed to a phase detector circuit 248. The phase detector circuit 248 as will be further discussed in conjunction with FIG. 14 provides a signal related to the timing error or phase difference between the CPU_LCMCLK clock signal and the I/O_LCMCLK clock signal to drive a loop amplifier 246 and produce from the loop amplifier an output signal which is used to adjust the frequency of the voltage controlled oscillator 230. In this manner, the CPU clock signals are phase locked to the I/O signals by changing the frequency of the voltage controlled oscillator 230. Correspondingly, a SYSCLK1 signal from the NVAX+ device 42 is fed to the phantom rail 41' via a delay circuit 242 which here is provided by a passive lumped element delay line.

Delay circuit 242 which is here a five nanosecond delay is used to permit CPU device 42' to input data at the same time as the CPU device 42 for error checking as discussed above. The 5 nanosecond delay of the clock compensates for the propagation delay of the data on buses 43b/43b' and the propagation delay of the buffer 45 (shown in FIG. 2A). The output from the delay line 242 is fed to a phase detector 248' as is SYSCLK1A from NVAX+ device 42'. The phase detector 248' provides an error or output signal in accordance with the differences in phase between the signals fed to the phase detector and feeds that error signal to a loop amplifier 246' to produce an output signal to control the voltage controlled oscillator 230' in the phantom rail 41'. Thus, the phantom rail 41' is phase locked to the voltage controlled crystal oscillator frequency of the primary rail 41 and by inference to the voltage controlled oscillator frequency of the I/O unit 25 (FIG. 2B).

Referring momentarily to FIG. 8A, a simplified timing diagram showing the relationships between the clock signals in the CPU/memory unit 15 and the clock signals on the I/O unit (FIG. 2B) is shown. As noted, the SYSCLK1 signals from the primary and phantom rails 41, 41' are phase locked with here a five nanosecond offset ($\tau$) to compensate for buffer delay provided by the delay circuit 242 between the rising edges of the two signals. Similarly, as shown in FIG. 8A, the clock phases T0–T3 are generated by the clock driver circuit 240. It is noted here that phases P1 and X3 are used for data transfer as will be further described below.

Also shown in FIG. 8A, CPU signals X1 and X3 are provided here by the coincidence of the CPU clock driver signals. T0 and T3 are used to generate signals X1 and X3. X1 and X3 are used for data transfer in the Bus interface and control unit.

As further shown in FIG. 8A, master clock signal MCLKA from the I/O unit (FIG. 2B) is used to generate I/O clock phases P1, P3, P5, and P6.

Figure 9:
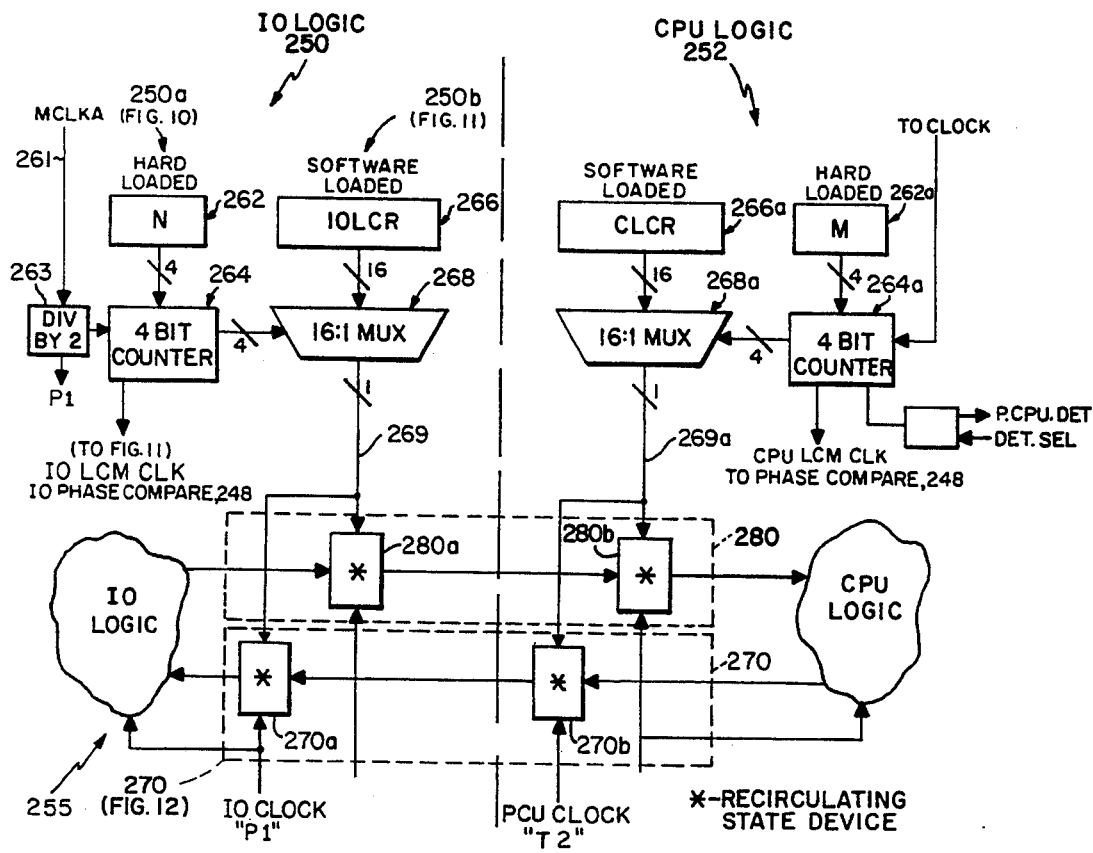
FIG. 9 is a block diagram of a clock interface circuit used to interface a system clock to an I/O clock for use in the computer system of FIG. 2.

Referring now to FIG. 9, circuits used to permit synchronous transfers between the I/O unit 25 (FIG. 2B) and the CPU/Memory unit 15 (FIG. 2A) are shown. It should further be noted that each primary rail 41 and phantom rail 41' in both Zone A and Zone B includes circuits substantially identical to those shown in FIG. 9. Accordingly, discussion of the circuits will be limited to the primary rail 41 of zone A while it is to be understood that corresponding circuits would be provided for Zone B and the phantom rails in Zones A, B of the fault tolerant computer 10.

The circuits shown in FIG. 9 are here provided on the Bus interface and control unit 60 (FIG. 6) and as briefly mentioned in conjunction with FIG. 8, include a divide by M section 252 and a divide by N section 250. Here, the divide by N section 250 is shown to include a hardware loaded register 262 which here shows a number ("N") representing a portion of the least common multiple ratio (LCM) between the I/O clock frequency and CPU clock frequency as will be mentioned below shortly. The divide by N logic further includes a 4-bit counter 264 as well as a divide by two circuit 263 which is fed via MCLKA signal 261. The 4-bit counter 264 provides 4-bits which are used as addresses to select one of sixteen I/O transfer (IOLCR) enables via a 16 to 1 MUX circuit 268. The 16 to 1 MUX circuit 268 is provided inputs from a input/output latency control register 266 which is loaded a code which is detected in accordance with an algorithm as will be described below. Suffice it here to say that in accordance with the selected signals which are provided from the four bit counter 264 which is in accordance with the code periodically loaded into the counter, one of the codes loaded will selectively be loaded in the I/O latency control register 266 as an output on line 269. The enable signal on line 269 is fed to first portions 280a, 270a of state devices 280, 270, respectively.

Figure 9A:
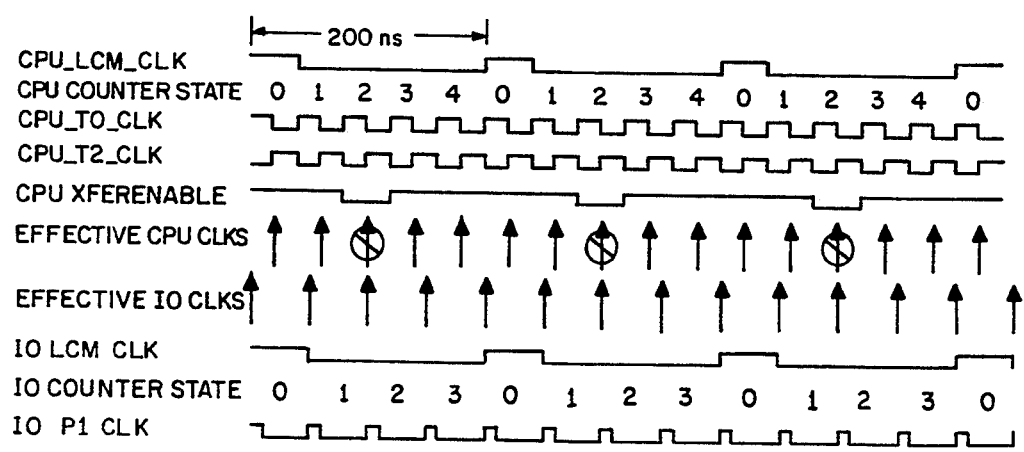
FIG. 9A is a timing diagram showing the timing relationships between signals described in conjunction with FIG. 9.

The CPU logic has a corresponding divide by M circuit 262a having similar circuits as described for the I/O logic divide by N logic 250. In particular, the CPU logic 252 has a hard loaded register store 262a which provides a number M corresponding to a remaining portion of a least common multiple ratio of the I/O clock and CPU clock as will be described below, and a 4-bit counter 266a which provides output bits as enables to a 16 to 1 MUX 268a. As with logic 250 a software, loaded CPU latency control register 266a is fed data which provide enable signals as inputs to here a 16 to 1 multiplexer 268a. The select signals from control 266a permit one of the enable signals to be transferred through the multiplexer as in an enable output on line 269a. The enable signal on line 269a is fed to second portions 270b, 280b of state devices 270, 280 as shown. Thus, circuit 280 which is comprised of state device 280a and state device 280b is used to effect a transfer of data operating at the I/O clock frequency to logic operating at the CPU clock frequency whereas circuit 270 comprised of circuits 270a and 270b is used to effect a transfer of data operating at the CPU clock frequency to logic operating at the I/O clock frequency. Details of circuits used to provide the I/O CPU data synchronization will now be described with reference being made on an as needed basis to the timing diagram of FIG. 9A.

Referring in particular to FIG. 10, the counter circuit 264 is shown comprised of a plurality of here four D type flip flops (not individually referenced) as well as combinatorial logic circuits 264a comprised of AND gates and Exclusive-Or gates (not individually referenced). Counter 264 is here a down counter and includes a multiplexer bank 265 disposed between the combinatorial logic bank 264a and the D type flip-flops 264 to permit one of two paths of data to be used as inputs to the D inputs of the D type flip-flops 264 in a normal period. Here each of the combinatorial logic networks are coupled to A inputs of each of the bank of multiplexers 265. The B inputs of each of the bank of multiplexers 265 are coupled via one of lines PCLK40-PCLK43 from the hard loaded divide by N register 262. Register 262 is fed a predetermined value corresponding to the least common multiple ascertained or determined between the period of the CPU clock and the period of the I/O clock. Here this data is a hard loaded data provided from the ROM Bus 15b (FIG. 6A). Thus, this value is loaded into register 262 during initial powering of the computer system 10 and in particular each of the rails, 41/41'. This value is fed to each of the multiplexers in the bank of multiplexers 265. Here counter 264 is preceded by a divide by two stage counter 263 since clock signal MCLKA is twice the frequency of the Pclocks (I.e. P1).

The outputs from the divide by two stage 263 as well as counter stages 264 are coupled to a NAND gate 261 to decode the state 00010 which is the state preceding the state when the counter 264 would return to zero. This signal at the output of gate 261 is fed to a multiplexer 261a and the output of multiplexer 261a is fed to a flip-flop 261b.

Mux 261a is also fed by a signal PH_CLK_DET indicating the decode state of the phantom rail 41'. A signal DET_SEL, is also fed to the MUX 261a. DET_SEL is provided from a status register (not shown) in the primary rail or as a hardwired signal. As mentioned above a similar clocking arrangement is provided in the phantom rail. Thus an equivalent Mux (not shown) is also fed by a signal which indicates the decode state of the primary rail 41 and the select signal DET_SEL. Signal DET_SEL is used to always select the primary rail signal in both the primary rail and the phantom rail. This insures that the loading of the counter 263 and a corresponding counter (not shown) in the phantom rail 41 are always being loaded with the predetermined starting state at the same time. This insures lock step operation between the two rails of the zone 12. A similar arrangement is provide for zone B.

The output of flip-flop of 261b changes to the value of the output of gate 261c when that counter is at state 00000 and is used to provide a select signal to control the multiplexer bank 265. Thus the signal for flip-flop 261b permits either the combinatorial logic network 264a or alternatively the register 262 to provide the outputs from the multiplexer 265 as the corresponding inputs to the D flip-flops of divide by 2 circuits 263 and counter 264 for the next clock cycle. In this manner, the down counter is permitted to reload the initial value of the count sequence or the least common multiple in accordance with the clock frequencies from the register 262.

Figure 11:
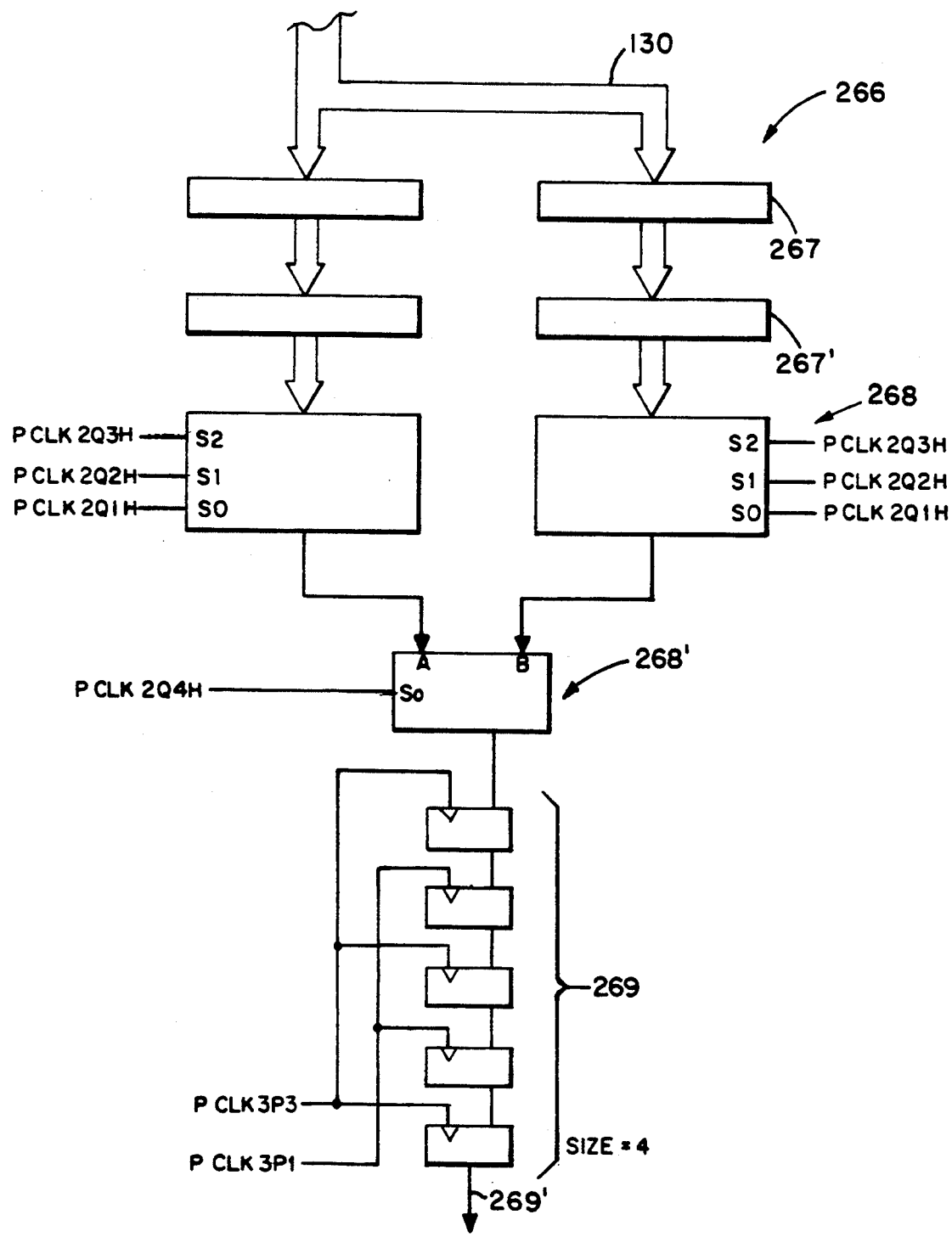
FIG. 11 is a diagram of a enable selection circuit used in the clock interface circuit of FIG. 9.

Referring now to FIG. 11 the transfer and enable logic 266 is shown to include an I/O control register 267 here comprised of a pair of register stages 267/267' which here each stage having a pair of registers used to feed here sixteen data bits from Bus 130 into one of a pair of 8 to 1 multiplexers 268. Multiplexers 268, have outputs to which are coupled to a 2 to 1 multiplexer 268' as shown. Clock signals PLCK2Q1H-PLCK2Q4H are used as selects for the multiplexers 268/268' respectively as shown. The output of multiplexer 268' is fed to here a five stage pipe delay 269 with the three odd number stages being clocked at the frequency signal PCLK3P3 and the two intermediate stages clocked at the frequency of signal PCLK3P1. Here the last stage of the pipe delay 269 is a stage of four flip-flops used to provide sufficient clock signals for the remainder of the circuit.

Referring now to FIG. 12 a recirculating state device pair circuit 270 used to effect transfers from the I/O logic to the CPU logic is shown to include a first state device 270a comprised of here a JK flip-flop 272 which has a first input of P3 data that is the data at the I/O clock frequency and which is clocked at the frequency of the P3 clock. It should be noted that the circuit 270 is replicated as many times as is necessary to accommodate the width of Bus 15d.

The P3 data is applied to the J and K inputs of flip-flop 272a. The output of flip-flop 272a provides the first input of gate 273a whereas the second input of exclusive-OR gate 273a is provided from the output of a second JK flip-flop 278. The P3 data is also provided as an input to an OR gate 275a and in the second input of OR gate 275a is provided from the output of the exclusive-OR gate 273a. The output of OR gate 275a is provided as an input to an AND gate 277a with the second input to gate 277a provided by signal P3XFREN which is the transfer enable for the P3 clock provided from signal 269 (FIG. 9). The Q output of flip-flop 278 provides the input to a second state device 270b. The second recirculating state device 270b includes a multiplexer 272b and a pair of D flip-flops 274b, 276b which are clocked at the X3CLK clock frequency. The output of the last flip-flop 276b, provides the first input to an exclusive-OR gate 279 whereas the output from the first flip-flop 274b provides the second input to exclusive OR gate 279 as well as the A input to the multiplexer 272b. The select input to multiplexer 272b is provided from signal X1 transfer enable (X1XFREN) provided from an enable circuit similar to that as will described in conjunction with FIG. 12b for the X clock signal.

Figure 12A:
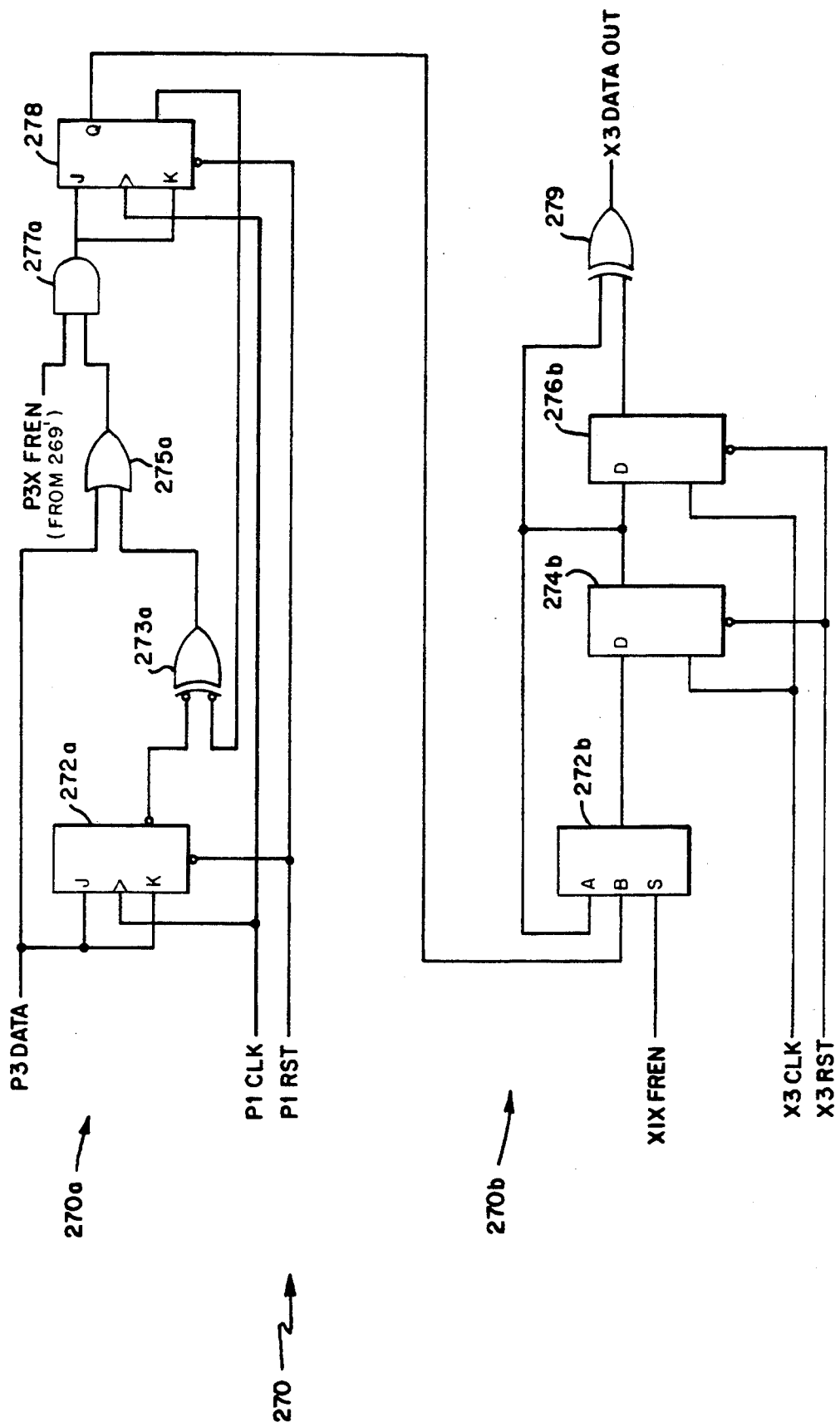
FIG. 12A is a logic diagram of a recirculating state device for transferring data synchronized to a CPU clock to data synchronized to an I/O clock used in the clock interface circuit of FIG. 9.
Figure 12B:
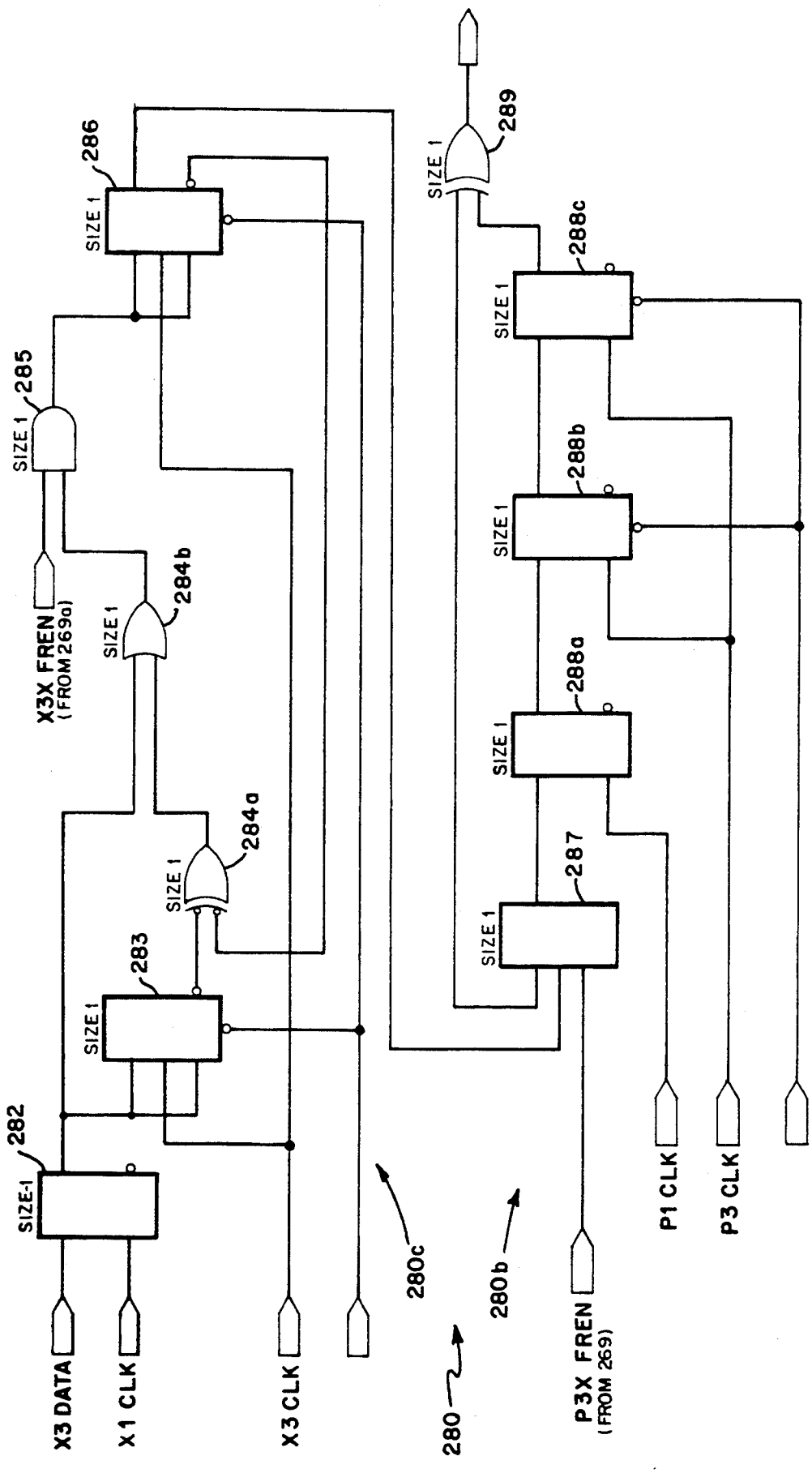
FIG. 12B is a logic diagram of a recirculating state device for transferring data synchronized to an I/O clock to data synchronized to a CPU clock used in the clock interface circuit of FIG. 9.

Referring now to FIG. 12A, a second recirculating state device pair of circuit 280 used to effect transfers from the CPU clock logic to the I/O clock logic is shown to include first state device 280a comprised of here a D flip-flop 282 which has a first input of X3 data in that is clocked at the CPU clock X1. The output of D flip-flop 282 is fed to a second flip-flop 283 here a JK flip-flop and is fed to both J and K inputs of said flip-flop. The output of device 282 is also fed to a OR gate 284b whereas the Q not output of JK flip-flop 283 is fed to a first Exclusive-OR gate 284a. Output of Exclusive-OR gate 284a provides a second input to OR gate 284b. The output of OR gate 284b is fed to an AND gate 285 which has a second input X3XFREN enable which is the transfer enable from line 269a. The output of AND gate 285 feeds a second JK flip-flop 286 as shown. The output of JK flip-flop 286 feeds a first input of a two to one MUX 287. A select input from MUX 287 is fed signal P3XFREN which is the transferred enable signal from line 269. The output of MUX 287 is fed to a first D flip-flop 288a which in turn is fed to a second D flip-flop 288b. D flip-flop 288a is clocked at the P1 clock phase whereas D flip-flop 288b is clocked at the P3 clock phase. The output of the P3 clock signal is fed back to the input of MUX 287 whereas output from gate 288b is also fed to the input of a third D flip-flop 288c. The output of flip-flop 288c and flip-flop 288b are fed to an Exclusive-OR gate 289. Output of Exclusive-OR gate 289 is output data transferred or synchronized to the P3 clock of the I/O unit 25. Thus, state device 280 is used to effect data transfers between the I/O and CPU from the CPU to the I/O whereas state device 270 (FIG. 12A) is used to effect data transfers from the I/O to the CPU.

A brief discussion of the operation of circuit 270 will suffice also for a discussion of circuit 280, and will be useful in understanding this aspect of the invention. Referring back to FIG. 12A, when P3 data is in a high state for one P1 CLK cycle, and if P3XFREN is also high, indicating that a transfer can occur, the P3 data will pass through gate 277a to JK flip-flop 278. On the next P1 cycle the '1' at the output of gate 277a will toggle flip flop 278. If X1XFREN is also '1', then on the next X3 CLK cycle flip-flop 274b will change state and its state will be different from the state of flip-flop 276b for one clock cycle, thus creating a high level at exclusive-or gate 279. Thus the circuit provides a pulse, synchronized at a first clock signal, which is converted to a state change and which is reconverted to a pulse which is synchronized to a second clock signal. If when P3 data was high P3XFREN is not enabled, then flip-flop 278 does not toggle. However, flip-flop 272a does toggle. Eventually when P3XFREN is at logic '1' level, gate 273a detects a difference in logic states between state device 278 and 272a, provides a logic '1' to gate 275a, and thus onto gate 277a permitting JK flip-flop 278 to toggle. The transfer is complete as discussed above. If X1XFREN is not in a logic '1' state when the state of 278 toggles, then the state of flip-flop 278 and flip-flop 274b will be different. When X1XFREN is at logic '1° flip-flop 274b will change to the state of flip-flop 278, thus completing the transaction.

Figures 12C, 13:
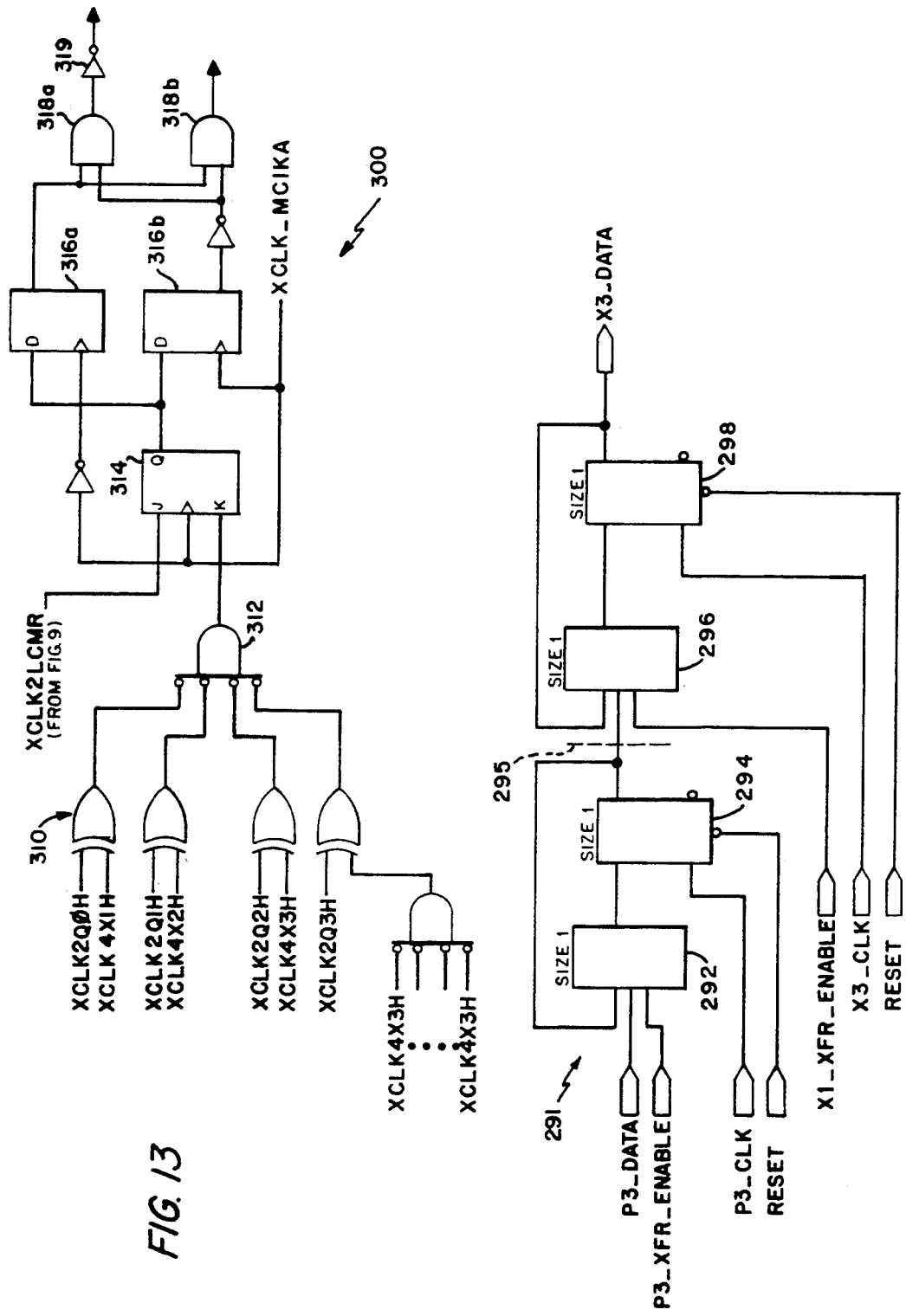
FIG. 12C is a logic diagram of a recirculating state device for transfering level signals between an I/O clock and a CPU clock.
FIG. 13 is a logic diagram of a pulse width modulator circuit used in the clock synchronizer circuit of FIG. 8.

Referring now to FIG. 12C, a circuit 291 to transfer data signals which are levels (is more than a couple of clock cycles in width) rather than pulses as described above, is shown to include a MUX 292 having as a first input P3_Data_In and as a second input, an output from a state device 294 which has its input coupled to the output of the MUX 292. A select input to the MUX 292 is fed via a transfer enable signal from the multiplexer bank 268 (FIG. 11). This signal is used to have the MUX 292 select the output from the state device 294 to be fed to the state device unless the signal P3_X-FR_Enable indicates that data on line P3_Data_In can be transfered at the next clock signal P3_CLK. Data is transfered across the clock boundary 295 to a second MUX 296. A second input of the MUX 292 is fed from an output of a state device 298 which has its input coupled to the output of the MUX 296. A select input to the MUX 296 is fed via a transfer enable signal from the multiplexer bank 268a (FIG. 9). This signal is used to have the MUX 296 select the output from the state device 298 to be fed to the state device 298 unless the signal X3_XFR_Enable indicates that data from the state device 294 can be transfer to the state device 298 at the next clock period of X3_CLK. This circuit is simpler than the ones mentioned above and thus can be used to transfer levels. As with the pulse circuits, this circuit is replicated as many times as is need to transfer the full width (data, control, and addrress) of data signals.

Referring now to FIG. 13 a circuit 300 used to provide a output signal to a phase detector 248 (FIG. 6) and as will be described in more detail in conjunction with FIG. 14 is shown. In order for phase detector 248 to operate optimally it is desirable to provide a output signal having a fifty percent duty cycle. However, since the clocking throughout the CPU as well as the I/O logic 252, 250 respectively uses several clock phases having pulse widths which are less than fifty percent duty cycles, circuit 300 is provided to transform the clock signal into a fifty percent duty cycle signal. The circuit 300 is shown to include a bank 310 of exclusive-OR gates. Here, the exclusive-OR gates have a first input fed by signals XCLK2Q0H–XCLK3H the CPU clock, clock divider state signals, and each have second inputs fed by signals XLK4X1H–XLK4X3H the CPU clock divide value signal. A fourth exclusive-OR gate of the bank of gates 310 has the second input provided as the logical NOR of signals XCLK4X0H–XCLK4X3H respectively. That is the Q outputs from the 4-bit divide by M counter 264 (FIG. 10) are exclusive-OR together with corresponding bits from the control word register 262 (FIG. 10). The outputs of these exclusive-OR gates 310 are NOREDed together via NOR gate 312. The output of NOR gate 312 provides the K input to the first JK flip-flop 314 with the J input of JK flip-flop 314 provide from a signal XCLK2LCMR (FIG. 11). JK flip-flop 314 is clocked at the clock frequency of XCLK1_T0 (approximately 20.8 MHz). The output of flip-flop 314 is fed to a pair of flip flops 316a, 316b here each D type flip-flops with flip-flop 316a clocked at the inverse phase (via an inverter, not referenced) of clock XCLK1_T0_L and flip-flop 316b clocked at the signal XCLK1_T0_H. The outputs of each of these two flip-flops are fed to a pair of AND gates 318a, 318b as shown and the outputs of AND gates 318b provides signal XCLK2_CPULCM and the output of NAND gate 318a is fed to an inverted 319 to provide signal XCLK2_LOCAL-CPULCM.

The fifty percent duty cycle circuit 300, which is used in the divide by M logic of the CPU/Memory unit 15 operates as follows:

The JK flip-flop 314 is set on the positive clock edge following the clock which reloads counter 264a with the divide by M value. On the negative-going edge of the aforementioned clock cycle, the setting of JK flip-flop 314 sets D flip-flop 316a. On the next positive clock edge, flip-flop 316b is set. The outputs of flip-flops 316a and 316b are ANDed together by AND gate 318 to provide the 50% duty cycle output. A decoder, provided by logic circuit 310 provides an output signal that decodes the M/2 state of the counter 264a. This signal is applied to the K input of JK flip-flop 314 to reset JK flip flop 314 on the next positive clock cycle. Resetting JK flip-flop 314 likewise resets D flip-flop 316a on the next negative clock cycle and resets flip-flop 316b on the subsequent positive clock cycle, thus truncating a half-period from the output provided at gate 318. If the divide by M is an even number, a reset input on JK flip flop 314 is held continuously in the reset state to maintain the 50% duty cycle. Thus the circuit can be used to provide 50% duty cycles for both even and odd values of M.

Referring now to FIG. 14, a phased locked loop 350 to facilitate data transfer between the CPU/Memory unit 15 and the I/O unit 25 includes a divide by M circuit 252 which is coupled to the CPU clock T0 (indirectly sourced by the VCO 230 and CPU 42 as described previously) to provide a 50% duty cycle clock signal CPU_LCMCLK (FIG. 13) to the phase detector circuit 248 via line 252b. In addition, the I/O clock MCLKA is modified by the divide by N circuit 250 to provide a 50% duty cycle signal IO_LCMCLK on line 250b to the phase detector circuit 248 as generally mentioned above in conjunction with FIG. 9.

Because the CPU/Memory unit clock T0 cycles at a frequency which may be different from the I/O unit clock MCLKA, a least common multiple (LCM) of the two clocks is calculated and fed to the divide circuits 250 and 252 as described herein previously. For example, the CPU/Memory unit clock T0 may cycle at 40 ns while the I/O may cycle at 50 ns. The lowest common cycle time between the two clocks would be 200 ns. Therefore, the LCM fed to the divide by M circuit is 5, while the LCM fed to the divide by N circuit is 4. Therefore, the phase detector circuit 248 receives two clock signals, IO_LCMCLK on line 250b and CPU_LCMCLK on line 252b, both of which have a cycle time of 200 ns, but which may be out of phase.

The phase detector 248, as mentioned previously, provides a signal which is a measure of the phase error between the CPU clock and the I/O clock to drive a loop amplifier 246 and produce from the loop amplifier an output signal which is used to adjust the frequency of the voltage controlled crystal oscillator (VCXO) 230.

The VCO 230, as described previously, is an oscillator having a frequency which may be varied by changing the voltage level of an input control voltage signal. The VCO may be a simple inductor/capacitor pair configuration or a Crystal oscillator, as well as other variations known to those skilled in the art. Consequently, the output frequency of the output clock signal from VCO 230, and thereby the integrity of the data transfer between the CPU/Memory unit 15 and the I/O unit 25, is largely controlled by the phase detector 248.

Figure 15A:
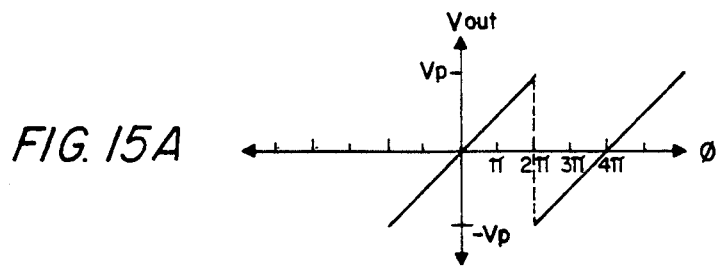
FIGS. 15A, 15B, and 15C are transfer curves illustrating the relationship between the phase error and output voltage of a prior art phase detector and the phase detector of the present invention as shown in FIG. 14.
Figure 15B:
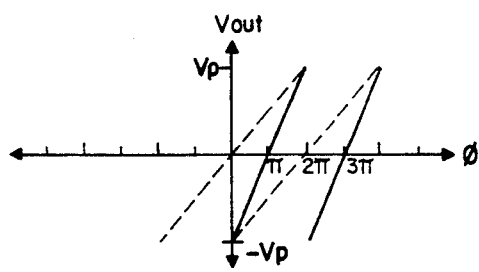
Figure 15C:
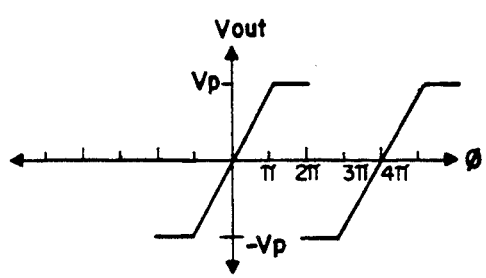

Referring now to FIGS. 15A, 15B, and 15C, typical transfer curves for phase detectors illustrate the relationship between the phase error $\Phi$, and the resulting output voltage provided by the phase detector, where Vp is the peak voltage (or saturation voltage) supplied by the phase detector. The transfer curve for a three state phase detector is shown in FIG. 15A. The detection range of the three state phase detector includes values between plus or minus $2\pi$, providing a detection slope of $Vp/2\pi$. Hence, any phase error $\Phi$ is related to a unique voltage level over a $4\pi$ range.

Referring now to FIG. 15B, an example of a transfer curve of a circuit which combines the use of two three state phase detectors with their respective outputs ored together, where each triggers on an opposite edge of the clocks being phased locked, is shown. The dashed lines indicate the respective transfer curves for each separate three phase state detector circuit, while the solid lines indicate the sum of the pair of three state phase detector circuits, providing a transfer curve for the dual, three phase detector circuit. Given the characteristics of the dual three-state phase detector circuit, with the outputs ored together, a problem may occur where the phase error value $\Phi$ is zero for values of plus and minus $\pi$. Hence, a circuit using dual three state phase detectors may have the potential of locking the clock signals exactly $\pi$ radians out of phase.

The present invention inhibits the problem of the CPU clock and IO clock locking out of phase by providing a circuit which recognizes that the two clocks are exact $\pi$ radians out of phase and precludes a phase detection circuit from indicating that there is no phase error. The voltage vs. phase error transfer curve of a circuit in accordance with the present invention is illustrated in FIG. 15C. As shown, circuit correctly provides no voltage compensation when the phase error is 0. In addition, the transfer curve illustrates that the present invention permits the phase detector circuit 248 to provide its peak output voltage to compensate for any phase error over $\pi$ radians, and has double the slope of the conventional three state phase detector for phase errors between $-\pi$ and $\pi$ radians. The increased slope (increased gain) of the transfer curves indicates that the phase detection circuit 248 provides more compensation voltage per degree of phase error difference, thereby reducing the static error by a factor of two. Offsets resulting from the loop component characteristics are minimized by the increased gain of the phase detection circuit 248.

Figure 16:
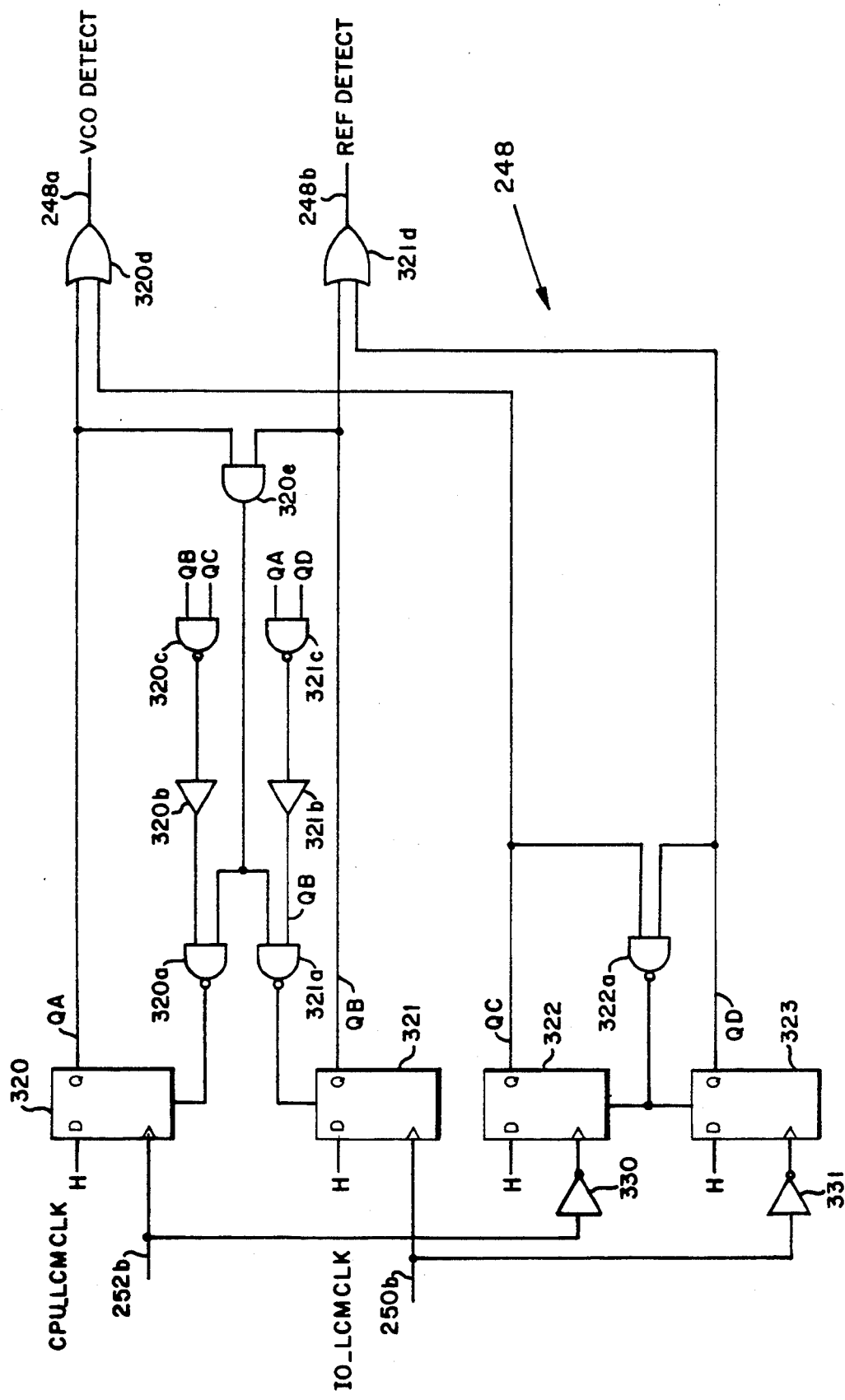
FIG. 16 is a schematic diagram of a phase detector circuit used in the clock interface circuit of FIG. 9.

Referring now to FIG. 16, one embodiment of the phase detector 248 includes 4 state devices 320, 321, 322 and 323 which are used in conjunction with logic gates to detect rising and falling edges of the input clocks IO_LCMCLK on line 250a and CPU_LCMCLK on line 252b in the following manner. All four state devices, 320, 321, 322 and 323 (which may be typical D-type flip flops known to one skilled in the art) have the Data input pin tied "high", or to a logical '1' value in this embodiment. State devices 320 and 321 are respectively clocked by the rising edges of CPU_LCMCLK and IO_LCMCLK. State devices 322 and 323 are respectively clocked by the falling edges of CPU_LCMCLK and IO_LCMCLK via inverters 330 and 331.

The output of both state devices 320 and 322 (Qa and Qc respectively) are ored together by logical OR gate 320d to provide a signal VCO_Detect on line 248a. Thus, the signal VCO_Detect will be asserted whenever the phase detection circuit 248 detects a rising or falling edge of the CPU_LCMCLK. Similarly, the output of state devices 321 and 323 (Qb and Qd respectively) are ored together by logical OR gate 321d to provide a signal REF_Detect on line 248b. Thus, the signal REF_Detect is asserted whenever the phase detection circuit 248 detects a rising or falling edge on the IO_LCMCLK (the reference clock in the phase locked loop as described in conjunction with FIG. 14A).

Typically, in three state phase detectors, the VCO_Detect and REF_Detect signals are reset when both clocking signals being compared are in the same logical state. However, in the present invention, the arrangement of logic components, 321a, 321b, and 321c and logic components 320a, 320b, and 320c preclude the phase detection circuit from locking the CPU_LCMCLK signal to the IO_LCMCLK signal when they are out of phase by inhibiting the signals VCO_Detect and REF_Detect from being reset in certain predetermined states, even though both CPU_LCMCLK and IO_LCMCLK may be asserted.

Figure 17A:
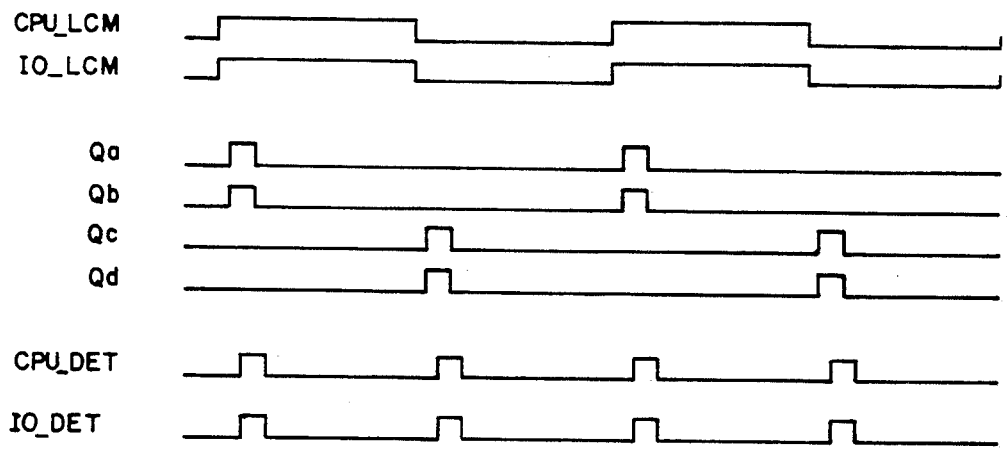
FIGS. 17A–17C are timing diagrams illustrating the alignment of clocks by the phase detector circuit of FIG. 16.

Referring now to FIG. 17A, an example of an instance wherein the CPU_LCMCLK and IO_LCMLCK are operating in phase is shown. When the CPU_LCMCLK is asserted, the Qa output from state device 320 also is asserted (after a time period equal to the clock→data propagation time of state device 320). If, as shown here, IO_LCMCLK is in phase lock with CPU_LCMCLK, then Qb also is asserted after a time period equal to the clock→data propagation time of the state device 322). Qc and Qd are here deasserted as shown. When both Qa and Qb are in an asserted state, an AND gate 320e feeds a '1' value to each of the NAND gates 320a and 321a. In essence the outputs from delay gates 320b and 321b are enable signals, which enable the reset signal from gate 320e to pass through gate 320a, and thus reset the state devices 320 and 321. Because both Qc and Qd are deasserted, NAND gates 321c and 320c provide a '1' value to delay gates 320b and 321b which in turn provides a '1' value to the NAND gates 320a and 321a, thereby enabling the '1' value sourced from gate 320e to provide a reset signal to the state devices 320 and 321. This reset signal is fed to asynchronous clear inputs of state device 320, 321 which in turn clears the state devices 320, 321. Thus, Qa and Qb remain asserted for a period of time (tp1) equal to the propagation delay through the string of combinatorial gates 320a and 320e, at which point they deassert as shown.

Similarly, when the CPU_LCMCLK is deasserted, the Qc output from state device 322 is asserted (after a time period equal to the clock→data propagation time of state device 322). If, as shown here, IO_LCMCLK is in phase lock with CPU_LCMCLK, then Qd also is asserted after a time period equal to the clock→data propagation time of the state device 323). When both Qc and Qd are in an asserted state, the assertion of both inputs at gate 322a provides a '0' output, to the asynchronous clear pin of state devices 322, 323 to clear the state devices. Thus, Qc and Qd remain asserted for a period of time proportional to the propagation delay through the NAND gate 322a and the flip flops 322 or 323.

Figure 17B:
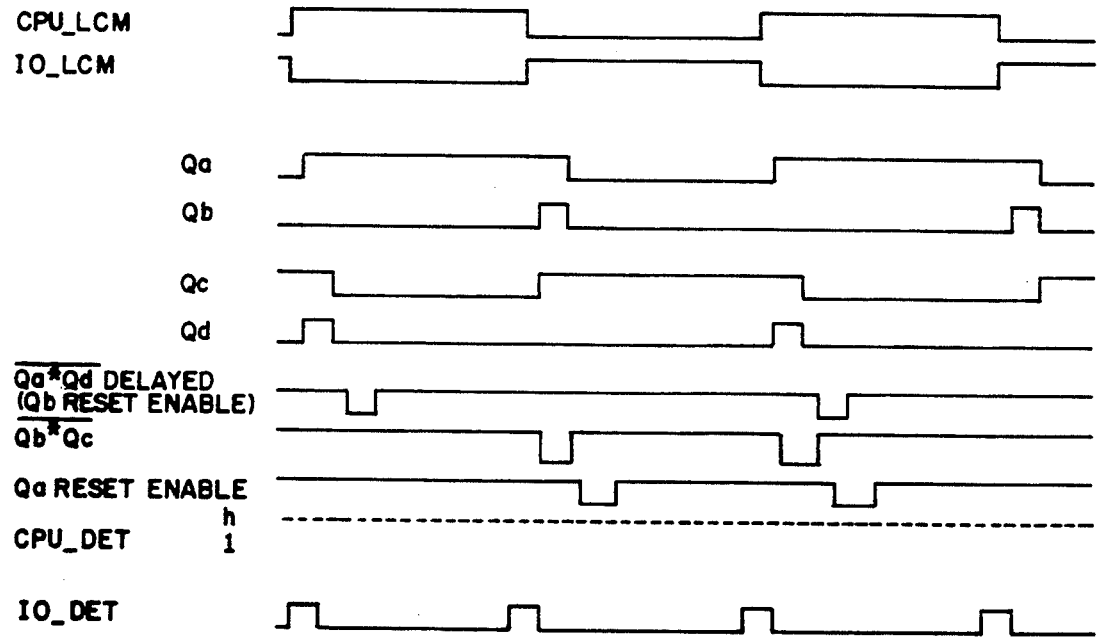

Referring now to FIG. 17B, an example of an instance in which the CPU_LCMCLK leads the IO_LCMCLK is shown. When CPU_LCMCLK is asserted, the Qa output becomes asserted. The Qa output remains asserted until the IO_LCMCLK signal becomes asserted, at which point the Qb signal also becomes asserted. As described previously, the output from NAND gates 320c and 321c feed an enable signal to delay gates 320b and 321b respectively. This enable signal allows the reset signal from gate 320e to propagate through gates 320a and 321a, and reset the state devices 320 and 321. In FIG. 17B, when the IO_LCMCLK signal becomes asserted, the Qb output becomes asserted, thus creating a reset signal at gate 320e. However, during the same period, as CPU_LCMCLK falls, the Qc input becomes asserted. Because both Qb and Qc are asserted, the reset enable signal provided by gate 320c is disabled. The propagation delay of delay gate 320b must be sufficient delay the output of gate 320c from disabling the enable signal in order to allow the reset signal from gate 320e to pass through gate 320a and reset state device 320. Therefore, the delay gate should provide a delay at least equivalent to the Clear-Q propagation of the state device plus the delay of gates 320a and 320e.

As shown in FIG. 17B, when the CPU_LCMCLK leads the IO_LCMCLK by 180 degrees, the resulting VCO detect signal is a constant high asserted signal, while the resulting IO detect signal is a train of pulses. The output, therefore, of the pulse detector is the differential voltage between the two signals, which will provide the maximum output voltage in order to remedy the phase error.

Figure 17C:
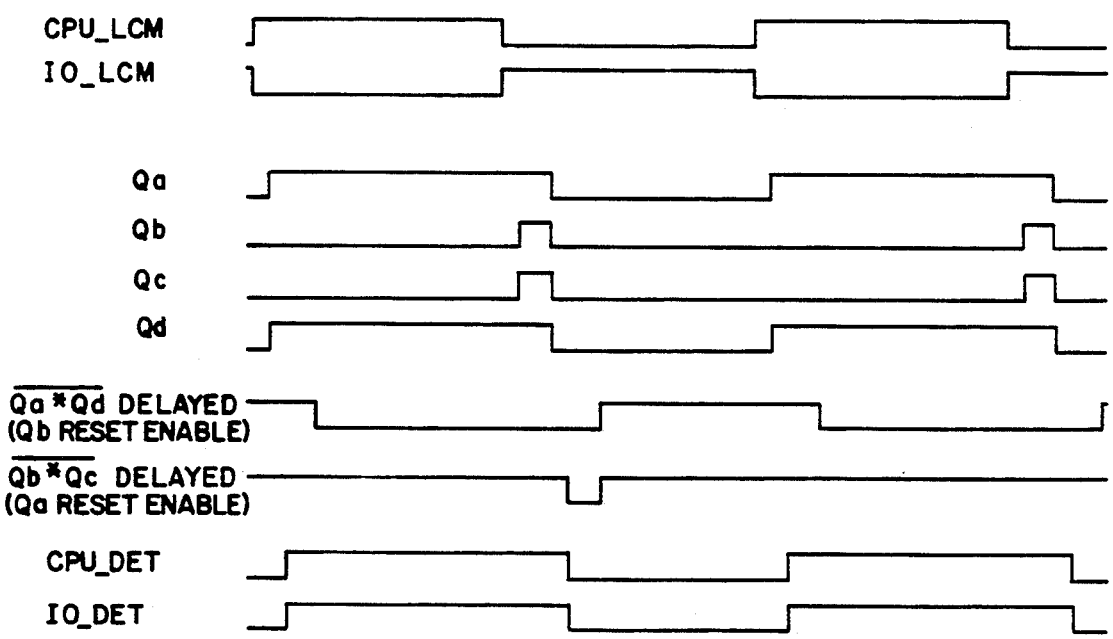

Conversely, referring now to FIG. 17C, an example of the output of a design using the dual three state phase detector implementation, as discussed with reference to FIG. 15B is shown. An example wherein CPU_LCMCLK leads the IO_LCMCLK by 180 degrees illustrates that the final output signals VCO detect and VREF detect are mirror image pulses, and as such, the differential voltage of the signals is 0. Thus, the phase error between the signals would not be corrected through the use of a dual three state phase detector.

The phase detector of the present invention thereby improves the phase locking process by detecting a phase difference for both the rising and falling edges of the respective clocks. This provides improved tracking of the VCO frequency (and subsequently the CPU/Memory unit clock frequency) to the reference (I/O unit) frequency. In addition, because the output pulses from the phase detector are double the frequency of conventional phase detectors, the low pass filtering of the reference frequency is facilitated due to the relative ease of filtering higher frequency signals as opposed to filtering lower frequency signals. Finally, the present invention provides a frequency transfer curve having double the slope of the previous three state phase detectors, thus enabling increased voltage compensation to correct phase errors, and thereby reducing static phase error in the phase-locking process.

Having described preferred embodiments of the invention, it will now become apparent to one of ordinary skill in the art that other embodiments incorporating their concepts may be used. It is felt, therefore, that these embodiments should not be limited to the disclosed embodiments, but rather should be limited only by the spirit and scope of the appended claims.

What is claimed is:

1. Apparatus comprising:

means for providing a data value;

a counter;

means for detecting a selected state of said counter to load said data value into said counter in accordance with said detected state of said counter;

means for storing data bits with the logic state of selected ones of said bits corresponding to a temporal relationship of pairs of pulses of clock signals for which valid data transfers can occur means responsive to output signals from said counter for selectively providing said selected bits as an enable signal in accordance with the state of said counter; and at least one recirculating state device fed by said enable signal and said clock signals to selectively permit or inhibit transfer of data fed to said recirculating state device in accordance with the state of said enable signal.

2. The apparatus as recited in claim 1 wherein said means for providing a data value is a register fed by said data.

3. The apparatus as recited in claim 2 further comprising:

a second register;

a second counter;

second means for detecting a selected state of said second counter to load data contained in said second register into said second counter in accordance with said detected state of said second counter;

second means response to output signals from said second counter for selectively providing a second enable signal in accordance with the state of said second counter; and wherein said recirculating state device is fed by said first and second enable signals to selectively permit or inhibit transfer of data fed to said recirculating state device in accordance with the state of said enable signals.

4. The apparatus as recited in claim 3 wherein said recirculating state device further comprises:

means responsive to data associtated with a first clock signal for transferring said data in association with a second, different clock signal.

5. The apparatus as recited in claim 4 wherein said recirculating state device further comprises:

means responsive to data associated with said second clock signal for transferring said data in association with said first clock signal.

6. Apparatus comprising:

a first register containing a first data string;

a first counter;

means for detecting a selected state of said first counter to load the data contained in said first register into said counter in accordance with said detected state of said counter;

means response to output signals from said first counter for selectively providing an enable signal in accordance with the state of said first counter;

a second register containing a second data string;

a second counter;

means for detecting a selected state of said second counter to load the data contained in said register into said counter in accordance with said detected state of said second counter;

means, responsive to outputs signals from said second counter, for selectively providing a second enable signal in accordance with the state of said second counter; and a recirculating state device fed by said enable signals to selectively permit or inhibit transfer of data fed to said recirculating state device in accordance with the state of said enable signals.

7. The apparatus as recited in claim 6 wherein said recirculating state device is fed by a pair of data streams a first one thereof associated with a first clock signal and a second one thereof associated with a second clock signal.

8. The apparatus as recited in claim 7 further comprising:

means for determining when corresponding asserting edges of pulses of said first and second clock signals are disposed to permit data transfers to occur by setting bite in said data coresponding to said enable signals.

9. Apparatus, comprising:

a first down counter;

a first register containing data representative of a maximum value count of said counter;

means for detecting a selected state of said first counter to load the data contained in said first register into said first counter to restart said counter at a said maximum value count;

means responsive to states of said first counter for providing an enable signal from a list of states corresponding to valid states for said counter for which a transfer of data fed to said apparatus can occur;

a second down counter;

a second register containing data representative of a second maximum value count of said second counter;

means for detecting a selected state of said second counter to load the data contained in said second register into said second counter to restart said counter at a said second maximum value count;

means, responsive to states of said second counter, for providing a second enable signal from a second list of states corresponding to valid states for said second counter for which a transfer of data fed to said apparatus can occur;

means for providing a recirculating state device responsive to said first and second selected enable signals, a pair of clock signals, and data associated with a first one of said pair of clock signals for outputting said data in association with a second one of said pair of clock signals when said enable signals are in a state indicating that a transfer of said data can occur.

10. The apparatus as recited in claim 9 further comprising:

means for providing a second recirculating state device responsive to said first and second selected enable signals, the pair of clock signals, and data associated with said second one of said pair of clock signals for outputting said data in association with said first one of said pair of clock signals when said enable signals are in a state indicating that a transfer of said data can occur.

* * * * *